United States Patent
Kroeber et al.

(10) Patent No.: US 9,735,385 B2
(45) Date of Patent: Aug. 15, 2017

(54) ORGANIC ELECTROLUMINESCENCE DEVICE

(75) Inventors: Jonas Valentin Kroeber, Frankfurt am Main (DE); Frank Voges, Bad Duerkheim (DE); Susanne Heun, Bad Soden (DE); Joachim Kaiser, Darmstadt (DE)

(73) Assignee: Merck Patent GmbH, Darmstadt (DE)

( * ) Notice: Subject to any disclaimer, the term of this patent is extended or adjusted under 35 U.S.C. 154(b) by 544 days.

(21) Appl. No.: 14/240,203

(22) PCT Filed: Jul. 25, 2012

(86) PCT No.: PCT/EP2012/003152
§ 371 (c)(1),
(2), (4) Date: Feb. 21, 2014

(87) PCT Pub. No.: WO2013/026515
PCT Pub. Date: Feb. 28, 2013

(65) Prior Publication Data
US 2014/0197401 A1    Jul. 17, 2014

(30) Foreign Application Priority Data
Aug. 22, 2011 (EP) .................................. 11006859

(51) Int. Cl.
| | | |
|---|---|---|
| *H01L 51/50* | (2006.01) | |
| *C09B 57/00* | (2006.01) | |
| *H01L 51/56* | (2006.01) | |
| *H01L 51/00* | (2006.01) | |

(52) U.S. Cl.
CPC .......... *H01L 51/5004* (2013.01); *C09B 57/00* (2013.01); *H01L 51/0067* (2013.01); *H01L 51/5016* (2013.01); *H01L 51/5076* (2013.01); *H01L 51/56* (2013.01); *H01L 51/0058* (2013.01); *H01L 51/0072* (2013.01); *H01L 51/0094* (2013.01); *H01L 2251/552* (2013.01)

(58) Field of Classification Search
None
See application file for complete search history.

(56) References Cited

U.S. PATENT DOCUMENTS

| | | | |
|---|---|---|---|
| 2001/0043044 A1 | 11/2001 | Wakimoto et al. | |
| 2001/0052751 A1* | 12/2001 | Wakimoto | .......... H01L 51/5048 313/504 |
| 2006/0204784 A1 | 9/2006 | Begley et al. | |
| 2006/0279204 A1 | 12/2006 | Forrest et al. | |
| 2009/0072725 A1 | 3/2009 | Suzuki et al. | |
| 2009/0191427 A1* | 7/2009 | Liao | .................... H01L 51/5096 428/690 |
| 2015/0155514 A1 | 6/2015 | Kaiser et al. | |

FOREIGN PATENT DOCUMENTS

| | | |
|---|---|---|
| EP | 1575339 A1 | 9/2005 |
| EP | 1859491 A1 | 11/2007 |
| JP | 2001237080 A | 8/2001 |
| JP | 2011511458 A | 4/2011 |
| WO | WO-2004057926 A1 | 7/2004 |
| WO | WO-2009097108 A1 | 8/2009 |
| WO | WO-2010102706 A1 | 9/2010 |

OTHER PUBLICATIONS

International Search Report for PCT/EP2012/003152 mailed Nov. 7, 2012.

* cited by examiner

*Primary Examiner* — Nathan T Leong

(57) ABSTRACT

The present invention relates to organic electroluminescent devices which comprise a mixture of at least two materials in the electron-transport layer.

17 Claims, No Drawings

ORGANIC ELECTROLUMINESCENCE DEVICE

CROSS-REFERENCE TO RELATED APPLICATIONS

This application is a national stage application (under 35 U.S.C. §371) of PCT/EP2012/003152, filed Jul. 25, 2012, which claims benefit of European application 11006859.0, filed Aug. 22, 2011.

The present invention relates to organic electroluminescent devices which comprise a mixture of at least two materials in the electron-transport layer.

The structure of organic electroluminescent devices (OLEDs) in which organic semiconductors are employed as functional materials is described, for example, in U.S. Pat. No. 4,539,507, U.S. Pat. No. 5,151,629, EP 0676461 and WO 98/27136. Organic electroluminescent devices based on low-molecular-weight compounds are typically built up from a plurality of organic layers which are applied to one another, such as, for example, hole-transport layer, emitting layer and electron-transport layer. The emitting layer may be fluorescent or phosphorescent.

For full-colour displays, the same hole-transport and electron-transport materials are frequently used in the hole-transport or electron-transport layer for the pixels of different colours. It is therefore desirable for the hole- and electron-transport materials used to be compatible with all materials of the emitting layers. This is a challenge, in particular, in the case of phosphorescent emitter layers, since not only in each case the HOMO (highest occupied molecular orbital) and the LUMO (lowest unoccupied molecular orbital), but also the triplet energy of the materials are then important for the materials of the hole- and electron-transport layers, since an inadequate triplet energy of the hole- or electron-transport materials which are directly adjacent to the emitting layer would result in quenching of the phosphorescence.

In order to achieve good efficiencies and lifetimes of the organic electroluminescent device, it is necessary for the charge balance in the device to be compensated, i.e. for one charge carrier not to be in a clear excess in the emitting layer. This is not always achievable in a simple manner with materials in accordance with the prior art, since the charge-transport property of a material is essentially a material-inherent property and it is not always possible to match the hole- and electron-transport materials used to one another in such a way that the desired charge balance is achieved in the emitting layer. Thus, for example, it is a problem that some electron-transport materials as used in accordance with the prior art transport too many electrons into the emitting layer. However, other electron-transport materials which do not have this problem frequently have worse properties for use in an organic electroluminescent device and are thus not a real alternative to these good electron-transport materials.

The technical object on which the present invention is based is therefore the provision of electron-transport layers for organic electroluminescent devices which do not have the above-mentioned problem. An improvement in the charge balance is evident, in particular, in improved efficiency, an improved lifetime and usually a reduced operating voltage. The aim here is to provide electron-transport layers which can be employed both in combination with fluorescent emitter layers and also with phosphorescent emitter layers.

In accordance with the prior art, use is made, inter alia, of $AlQ_3$ (aluminium trishydroxyquinolinate) and other metal hydroxyquinolinates. However, these are not suitable in combination with triplet emitters, in particular with green- and blue-emitting triplet emitters, since they have an inadequately high triplet level. In addition, hydroxyquinoline has the disadvantage of being mutagenic and thus being accompanied by considerable health risks.

Electron-transport materials used in accordance with the prior art are furthermore, for example, triazine derivatives. Triazine derivatives have generally proven to be very good electron-transport materials, but also exhibit the above-mentioned problem of transporting too many electrons into the emitter layer in some device structures and thus not resulting in a compensated charge balance.

It is furthermore known from the prior art (for example WO 2010/072300) to mix triazine derivatives in the electron-transport layer with alkali-metal compounds, in particular with LiQ (lithium hydroxyquinolinate). However, LiQ has the disadvantage of being mutagenic and thus being accompanied by considerable health risks, so that it would be desirable to be able to avoid the use of LiQ. Furthermore, LiQ, like many other metal complexes, has the disadvantage that, due to the low triplet energy, combination with a green- or even more with a blue-phosphorescent emitter layer results in at least partial quenching of the luminescence. Surprisingly, it has been found that LiQ does not play an active role in electron transport in the layer in the electron-transport layer.

EP 1286568 discloses an electron-transport layer for an organic electroluminescent device in which an anthracene derivative is used as "colour-neutral dopant" in the emitting layer and in the electron-transport layer adjacent to the emitting layer. This "colour-neutral dopant" is used in the electron-transport layer in combination with $AlQ_3$ as electron-transport material. It is essential to the invention here that the "colour-neutral dopant" includes an anthracene derivative. This device structure is not suitable for phosphorescent emission layers, since phosphorescence is at least partially quenched by anthracene derivatives. In addition, the LUMO of the colour-neutral dopant here is lower than that of $AlQ$, meaning that the dopant actively participates in electron transport here.

WO 2007/015781 discloses a fluorescent organic electroluminescent device which has a hole-blocking layer and which has a mixture of at least two materials in the electron-transport layer, where one material is a polycyclic aromatic hydrocarbon, for example an anthracene or naphthacene derivative. The presence of an additional hole-blocking layer is essential to the invention here. This represents a considerable technical disadvantage, since the use of an additional layer means increased technical complexity.

Surprisingly, it has been found that organic electron-transport layers for use in organic electroluminescent devices have advantages if they consist of a mixture of at least two materials, where one material is an electron-transporting material and the other material is a material which does not or does not significantly participate in electron transport in the layer. This is achieved by certain relative values for the HOMO and LUMO positions of the materials being complied with. Furthermore, both materials have a certain minimum triplet energy. Electroluminescent devices of this type enable improvements to be achieved, in particular with respect to efficiency, lifetime and operating voltage, compared with electroluminescent devices which comprise only one material in the electron-transport layer or which comprise mixtures in accordance with the prior art in the electron-transport layer. Electron-transport layers of this type are furthermore equally suitable for fluorescent and phosphorescent emitter layers.

The invention thus relates to an organic electroluminescent device comprising anode, cathode, at least one emitting layer and at least one electron-transport layer which is directly adjacent to the emitting layer on the cathode side, characterised in that the electron-transport layer consists of a mixture of at least two materials ETM1 and ETM2, where the following conditions apply to ETM1 and ETM2:

a) $T_1(ETM1) > 2.2$ eV; and
b) $T_1(ETM2) > 2.2$ eV; and
c) $-3.2$ eV $<$ LUMO(ETM1) $< -2.0$ eV; and
d) LUMO(ETM2) $>$ LUMO(ETM1);

where $T_1$ stands for the lowest triplet energy of the corresponding material and LUMO stands for the energy (energy separation vs. vacuum) of the lowest unoccupied molecular orbital of the corresponding material.

The physical parameters of materials ETM1 and ETM2, in particular HOMO, LUMO, triplet energy and energy gap, are determined here as described in detail in general terms in the example part.

The organic electroluminescent device according to the invention comprises, as described above, anode, cathode, at least one emitting layer which is arranged between the anode and the cathode, and the electron-transport layer according to the invention. The organic electroluminescent device need not necessarily comprise only layers built up from organic or organometallic materials. Thus, it is also possible for anode, cathode and/or one or more layers to comprise inorganic materials or to be built up entirely from inorganic materials.

In a preferred embodiment of the invention, materials ETM1 and ETM2 are purely organic materials, i.e. they contain no metals.

If the organic electroluminescent device according to the invention comprises further materials apart from ETM1 and ETM2 in the electron-transport layer, all further materials preferably have a triplet energy $T_1 > 2.2$ eV. In addition, in the case of further materials in the electron-transport layer, all further materials preferably have an LUMO$>$LUMO (ETM1).

Materials ETM1 and ETM2 preferably have a glass-transition temperature $T_G$ of greater than 80° C., particularly preferably greater than 100° C., very particularly preferably greater than 120° C.

In a preferred embodiment, the triplet energy $T_1$ of ETM1 and ETM2 and of any further materials present in the electron-transport layer is $>2.4$ eV, particularly preferably $>2.6$ eV, very particularly preferably $>2.7$ eV.

Material ETM1 is preferably an electron-transporting material. An electron-transporting material in the sense of this application is characterised by an LUMO in the range from $-3.2$ to $-2.0$ eV. ETM1 preferably has an LUMO in the range from $-3.1$ eV to $-2.2$ eV, particularly preferably in the range from $3.0$ eV to $-2.4$ eV, very particularly preferably in the range from $-2.9$ eV to $-2.5$ eV.

Material ETM2 is preferably a material which does not or does not significantly participate in electron transport in the electron-transport layer. This is ensured by the LUMO of ETM2 being greater than the LUMO of ETM1. The LUMO of ETM2 is preferably at least 0.1 eV greater than the LUMO of ETM1, particularly preferably at least 0.2 eV.

In a further preferred embodiment of the invention, the HOMO of ETM1 is $<-5.3$ eV.

In still a further preferred embodiment of the invention, HOMO(ETM1)$<$HOMO(EML) and particularly preferably also HOMO(ETM2)$<$HOMO(EML). HOMO(EML) here is the HOMO of the emitting layer or of the material of the emitting layer which has the highest HOMO.

The mixing ratio between ETM1 and ETM2 can vary. In particular, variation of this ratio enables the charge balance of the OLED to be adjusted simply and reproducibly. The adjustment of the mixing ratio thus enables the efficiency of the OLED to be optimised easily. The proportion of ETM2 here is preferably $\geq 10\%$ by vol., particularly preferably $\geq 30\%$ by vol. and very particularly preferably $\geq 50\%$ by vol. Furthermore preferably, the proportion of ETM2 is $\leq 90\%$ by vol. and particularly preferably $\leq 80\%$ by vol.

In a further preferred embodiment of the invention, the electron-transport layer comprises no further materials apart from materials ETM1 and ETM2.

Preferred embodiments of ETM1 and ETM2 which are present in accordance with the invention in the electron-transport layer are indicated below.

ETM1 is an electron-transporting compound. In general, all electron-transporting compounds for which the above-mentioned condition regarding the $T_1$ level is satisfied are suitable. Preferred electron-transporting compounds are selected from the group consisting of compounds containing six-membered heteroaryl ring groups, in particular triazine derivatives, pyrimidine derivatives, pyridine derivatives, pyrazine derivatives, quinoxaline derivatives or quinoline derivatives, and compounds containing five-membered heteroaromatic rings having at least two heteroatoms, in particular oxadiazole derivatives and benzimidazole derivatives. Also suitable are aromatic ketones, lactams, boranes, diazaphosphole derivatives and phosphine oxide derivatives. All these compounds must be substituted in such a way that the above-mentioned condition regarding the $T_1$ level is satisfied. Whether the above-mentioned condition for the $T_1$ level is satisfied can be checked simply by quantum-chemical calculation. Triazine and pyrimidine derivatives are particularly preferably employed as ETM1.

Suitable triazine and pyrimidine derivatives which can be used as ETM1 are, in particular, 1,3,5-triazine derivatives which are substituted by at least one, preferably at least two, particularly preferably by three aromatic or heteroaromatic ring systems, and pyrimidine derivatives which are substituted by one, two or three aromatic or heteroaromatic ring systems. Particular preference is given to compounds of the following formula (1) to (8),

formula (1)

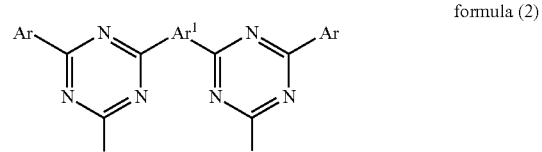

formula (2)

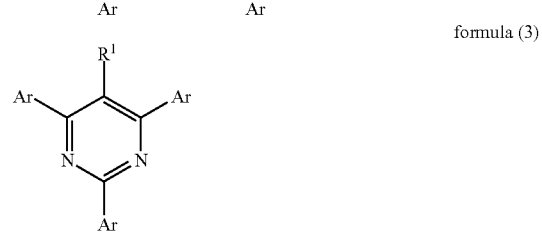

formula (3)

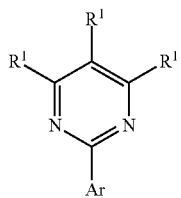

formula (4)

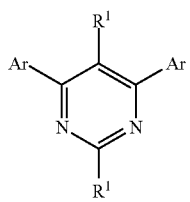

formula (5)

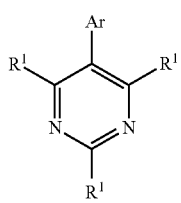

formula (6)

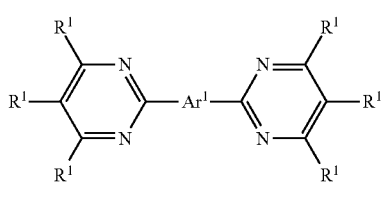

formula (7)

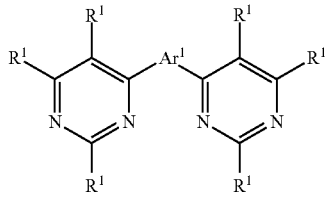

formula (8)

where the following applies to the symbols used:

Ar is, identically or differently on each occurrence, a monovalent aromatic or heteroaromatic ring system having 5 to 60 aromatic ring atoms, which may in each case be substituted by one or more radicals $R^1$;

$Ar^1$ is a divalent aromatic or heteroaromatic ring system having 5 to 60 aromatic ring atoms, which may be substituted by one or more radicals $R^1$;

$R^1$ is on each occurrence, identically or differently, H, D, F, Cl, Br, I, CHO, C(=O)$Ar^2$, P(=O)($Ar^2$)$_2$, S(=O)$Ar^2$, S(=O)$_2Ar^2$, $CR^2$=$CR^2Ar^2$, CN, NO$_2$, Si($R^2$)$_3$, B(OR$^2$)$_2$, B($R^2$)$_2$, B(N($R^2$)$_2$)$_2$, OSO$_2R^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which may be substituted by one or more radicals $R^2$, where one or more non-adjacent CH$_2$ groups may be replaced by $R^2C$=$CR^2$, C≡C, Si($R^2$)$_2$, Ge($R^2$)$_2$, Sn($R^2$)$_2$, C=O, C=S, C=Se, C=NR$^2$, P(=O)($R^2$), SO, SO$_2$, NR$^2$, O, S or CONR$^2$ and where one or more H atoms may be replaced by F, Cl, Br, I, CN or NO$_2$, or an aromatic or heteroaromatic ring system having 5 to 60 aromatic ring atoms, which may in each case be substituted by one or more radicals $R^2$, or an aryloxy or heteroaryloxy group having 5 to 60 aromatic ring atoms, which may be substituted by one or more radicals $R^2$, or a combination of these systems; two or more adjacent substituents $R^1$ here may also form a mono- or polycyclic, aliphatic or aromatic ring system with one another;

$Ar^2$ is on each occurrence, identically or differently, an aromatic or heteroaromatic ring system having 5 to 40 aromatic ring atoms, which may be substituted by one or more radicals $R^2$;

$R^2$ is on each occurrence, identically or differently, H, D, CN or an aliphatic, aromatic and/or heteroaromatic organic radical having 1 to 20 C atoms, in which, in addition, H atoms may be replaced by F; two or more adjacent substituents $R^2$ here may also form a mono- or polycyclic, aliphatic or aromatic ring system with one another.

An aryl group in the sense of this invention contains at least 6 C atoms; a heteroaryl group in the sense of this invention contains at least 2 C atoms and at least 1 heteroatom, with the proviso that the sum of C atoms and heteroatoms is at least 5. The heteroatoms are preferably selected from N, O and/or S. An aryl group or heteroaryl group here is taken to mean either a simple aromatic ring, i.e. benzene, or a simple heteroaromatic ring, for example pyridine, pyrimidine, thiophene, etc., or a condensed aryl or heteroaryl group, for example naphthalene, anthracene, pyrene, quinoline, isoquinoline, etc.

An aromatic ring system in the sense of this invention contains at least 6 C atoms in the ring system. A heteroaromatic ring system in the sense of this invention contains at least 2 C atoms and at least one heteroatom in the ring system, with the proviso that the sum of C atoms and heteroatoms is at least 5. The heteroatoms are preferably selected from N, O and/or S. An aromatic or heteroaromatic ring system in the sense of this invention is intended to be taken to mean a system which does not necessarily contain only aryl or heteroaryl groups, but instead in which a plurality of aryl or heteroaryl groups may also be interrupted by a short non-aromatic unit (preferably less than 10% of the atoms other than H), such as, for example, an sp$^3$-hybridised C, N or O atom or a carbonyl group. Thus, for example, systems such as 9,9'-spirobifluorene, 9,9-diarylfluorene, triarylamine, diaryl ether, stilbene, benzophenone, etc., are also intended to be taken to be aromatic ring systems in the sense of this invention. Likewise, an aromatic or heteroaromatic ring system is taken to mean systems in which a plurality of aryl or heteroaryl groups are linked to one another by single bonds, for example biphenyl, terphenyl or bipyridine.

For the purposes of the present invention, a C$_1$- to C$_{40}$-alkyl group, in which, in addition, individual H atoms or CH$_2$ groups may be substituted by the above-mentioned groups, is particularly preferably taken to mean the radicals methyl, ethyl, n-propyl, i-propyl, n-butyl, i-butyl, s-butyl, t-butyl, 2-methylbutyl, n-pentyl, s-pentyl, t-pentyl, 2-pentyl, neopentyl, cyclopentyl, n-hexyl, s-hexyl, t-hexyl, 2-hexyl, 3-hexyl, neohexyl, cyclohexyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2.2.2]octyl, 2-bicyclo[2.2.2]octyl, 2-(2,6-dimethyl)octyl, 3-(3,7-dimethyl)octyl, trifluoromethyl, pentafluoroethyl and 2,2,2-trifluoroethyl. A C$_2$- to C$_{40}$-alkenyl group is preferably taken to mean ethenyl, propenyl, butenyl, pentenyl, cyclopentenyl, hexenyl, cyclohexenyl, heptenyl, cycloheptenyl, octenyl and cyclooctenyl. A C$_2$- to C$_{40}$-alkynyl group is preferably taken to mean ethynyl, propynyl, butynyl, pentynyl, hexynyl, heptynyl and octynyl. A C$_1$- to C$_{40}$-alkoxy group is particularly preferably taken to mean methoxy, trifluoromethoxy, ethoxy, n-propoxy, i-propoxy, n-butoxy, i-butoxy, s-butoxy, t-butoxy or 2-methylbutoxy. An aromatic or heteroaromatic ring system having 5-60 aromatic ring atoms, which may also in each case be substituted by the radicals R mentioned above and which may be linked to the aromatic or heteroaromatic group via any desired positions, is taken to mean, in particular, groups derived from benzene, naphthalene, anthracene, phenanthrene, benzanthracene, benzophenanthrene, pyrene, chrysene, perylene, fluoranthene, benzofluoranthene, naphthacene, pentacene, benzopyrene, biphenyl, biphenylene, terphenyl, terphenylene, fluorene, benzofluorene, dibenzofluorene, spirobifluorene, dihydrophenanthrene, dihydropyrene, tetrahydropyrene, cis- or trans-indenofluorene, cis- or trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

In compounds of the formula (1) to (8), at least one group Ar is preferably selected from the groups of the following formulae (9) to (15), and the other groups Ar have the meaning indicated above,

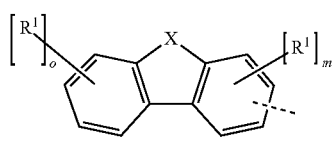
formula (9)

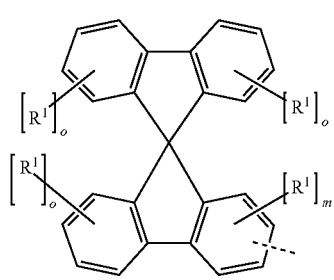
formula (10)

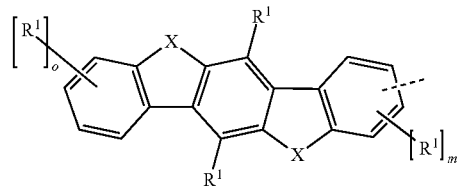
formula (11)

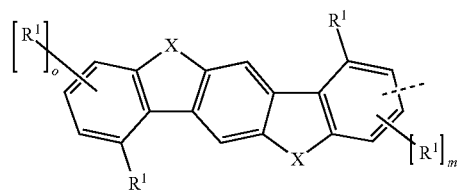
formula (12)

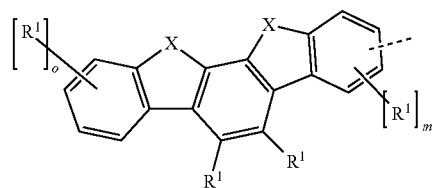
formula (13)

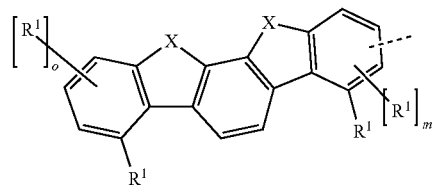
formula (14)

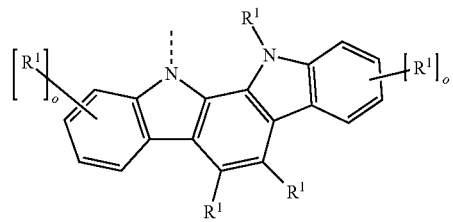
formula (15)

where $R^1$ has the same meaning as described above, the dashed bond represents the link to the triazine unit or pyrimidine unit and furthermore:

X is, identically or differently on each occurrence, a divalent bridge selected from $B(R^1)$, $C(R^1)_2$, $Si(R^1)_2$, C=O, C=NR$^1$, C=C(R$^1$)$_2$, O, S, S=O, SO$_2$, N(R$^1$), P(R$^1$) and P(=O)R$^1$;

m is on each occurrence, identically or differently, 0, 1, 2 or 3;

o is on each occurrence, identically or differently, 0, 1, 2, 3 or 4.

Particularly preferred groups Ar are selected from the groups of the following formulae (9a) to (15a),

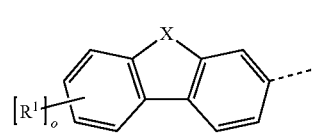
formula (9a)

formula (10a)

formula (11a)

formula (12a)

formula (13a)

formula (14a)

formula (15a)

where the symbols and indices used have the same meaning as described above. X here is preferably selected, identically or differently, from $C(R^1)_2$, $N(R^1)$, O and S, particularly preferably $C(R^1)_2$.

Preferred groups $Ar^1$ in compounds of the formulae (2), (7) and (8) are selected from the groups of the following formulae (16) to (22), formula (16)

formula (17)

formula (18)

formula (19)

formula (20)

formula (21)

formula (22)

where the symbols and indices used have the same meaning as described above and the dashed bond represents the link to the two triazine units or pyrimidine units.

Particularly preferred groups Ar¹ are selected from the groups of the following formulae (16a) to (22a),

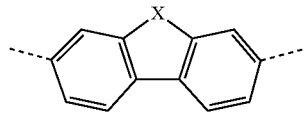
formula (16a)

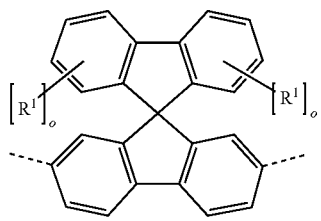
formula (17a)

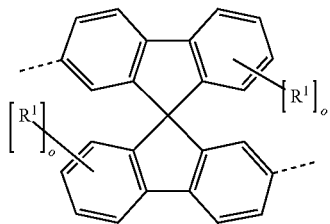
formula (18a)

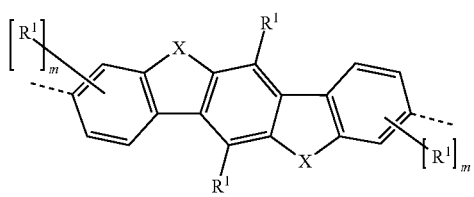
formula (19a)

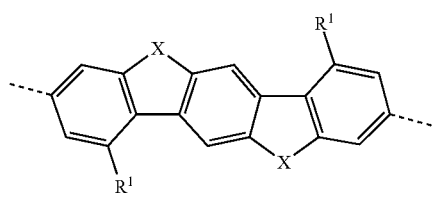
formula (20a)

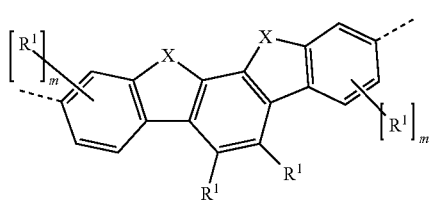
formula (21a)

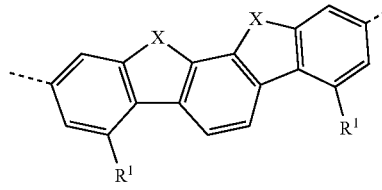
formula (22a)

where the symbols and indices used have the same meaning as described above. X here is preferably selected, identically or differently, from $C(R^1)_2$, $N(R^1)$, O and S, particularly preferably $C(R^1)_2$.

Preference is furthermore given to compounds of the above-mentioned formula (2), (7) and (8) in which the group Ar¹ is selected from the above-mentioned formulae (16) to (22) and Ar or R¹ is selected, identically or differently on each occurrence, from the above-mentioned formulae (9) to (15) or phenyl, 1- or 2-naphthyl, ortho-, meta- or para-biphenyl, each of which may be substituted by one or more radicals R¹, but are preferably unsubstituted.

In a preferred embodiment of the invention, the groups Ar and Ar¹ contain not more than two condensed six-membered rings. They are thus preferably built up only from phenyl and/or naphthyl groups, particularly preferably only from phenyl groups, but contain no larger condensed aromatic ring systems, such as, for example, anthracene.

Preferred groups Ar and Ar¹ are furthermore phenyl, 2-, 3- or 4-tolyl, 3- or 4-o-xylyl, 2- or 4-m-xylyl, 2-p-xylyl, o-, m- or p-tert-butylphenyl, o-, m- or p-fluorophenyl, benzophenone, 1-, 2- or 3-phenylmethanone, 2-, 3- or 4-biphenyl, 2-, 3- or 4-o-terphenyl, 2-, 3- or 4-m-terphenyl, 2-, 3- or 4-p-terphenyl, 2'-p-terphenyl, 2'-, 4'- or 5'-m-terphenyl, 3'- or 4'-o-terphenyl, p-, m,p-, o,p-, m,m-, o,m- or o,o-quaterphenyl, quinquephenyl, sexiphenyl, 1-, 2-, 3- or 4-fluorenyl, 2-, 3- or 4-spiro-9,9'-bifluorenyl, 1-, 2-, 3- or 4-(9,10-dihydro)phenanthrenyl, 1- or 2-naphthyl, 2-, 3-, 4-, 5-, 6-, 7- or 8-quinolinyl, 1-, 3-, 4-, 5-, 6-, 7- or 8-isoquinolinyl, 1- or 2-(4-methylnaphthyl), 1- or 2-(4-phenylnaphthyl), 1- or 2-(4-naphthylnaphthyl), 1-, 2- or 3-(4-naphthylphenyl), 2-, 3- or 4-pyridyl, 2-, 4- or 5-pyrimidinyl, 2- or 3-pyrazinyl, 3- or 4-pyridanzinyl, 2-(1,3,5-triazin)yl-, 2-, 3- or 4-(phenylpyridyl), 3-, 4-, 5- or 6-(2,2'-bipyridyl), 2-, 4-, 5- or 6-(3,3'-bipyridyl), 2- or 3-(4,4'-bipyridyl) and combinations of one or more of these radicals.

The groups Ar and Ar¹ may, as described above, be substituted by one or more radicals R¹. These radicals R¹ are preferably selected, identically or differently on each occurrence, from the group consisting of H, F, $C(=O)Ar^2$, $P(=O)(Ar^2)_2$, $S(=O)Ar^2$, $S(=O)_2Ar^2$, a straight-chain alkyl group having 1 to 4 C atoms or a branched or cyclic alkyl group having 3 to 5 C atoms, each of which may be substituted by one or more radicals R², where one or more H atoms may be replaced by F, or an aromatic ring system having 6 to 24 aromatic ring atoms, which may be substituted by one or more radicals R², or a combination of these systems; two or more adjacent substituents R¹ here may also form a mono- or polycyclic, aliphatic or aromatic ring system with one another. If the organic electroluminescent device is applied from solution, straight-chain, branched or cyclic alkyl groups having up to 10 C atoms are also preferred as substituents R¹. The radicals R¹ are particularly preferably selected, identically or differently on each occurrence, from the group consisting of H, $C(=O)Ar^2$ or an aromatic ring system having 6 to 24 aromatic ring atoms, which may be substituted by one or more radicals R², but is preferably unsubstituted.

Examples of suitable compounds of the formulae (1) to (8) are the compounds shown in the following table:
1
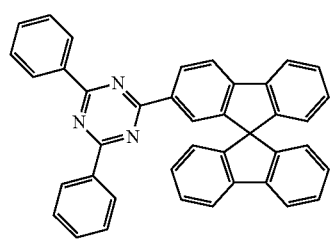
2
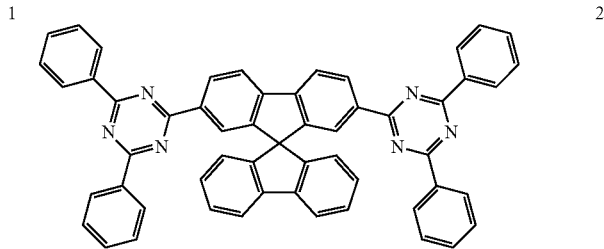
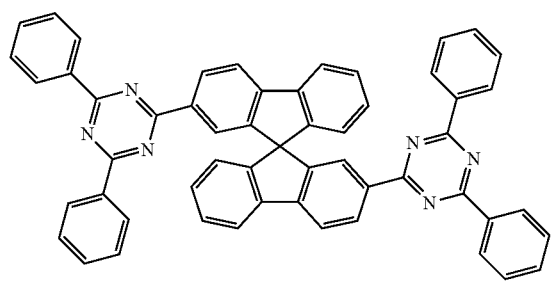
4
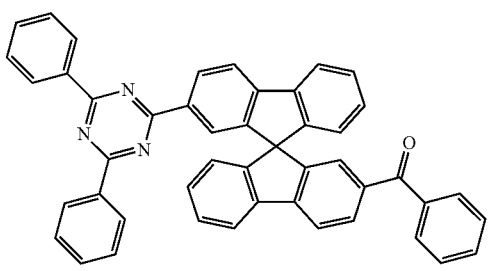
5
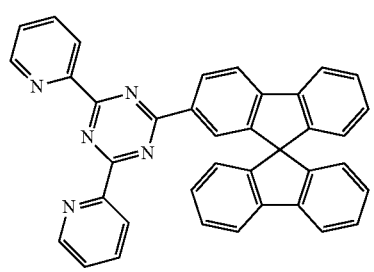
6
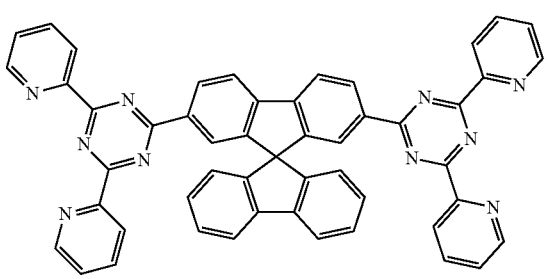
7
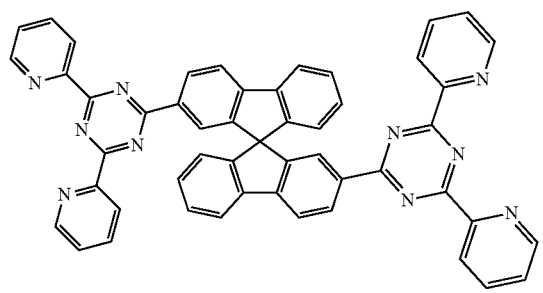
8
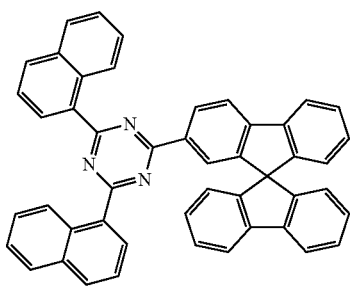
9
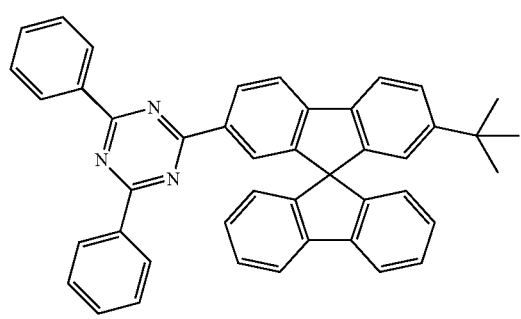

-continued
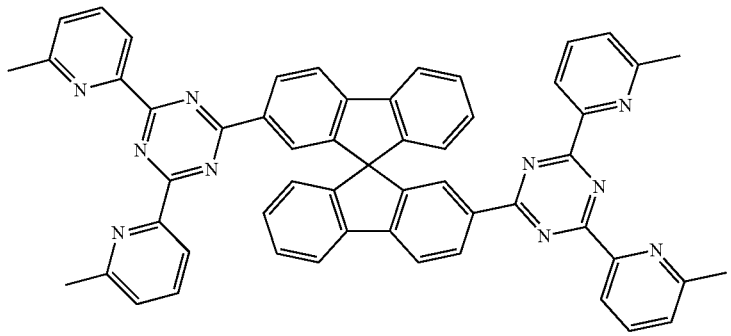
10
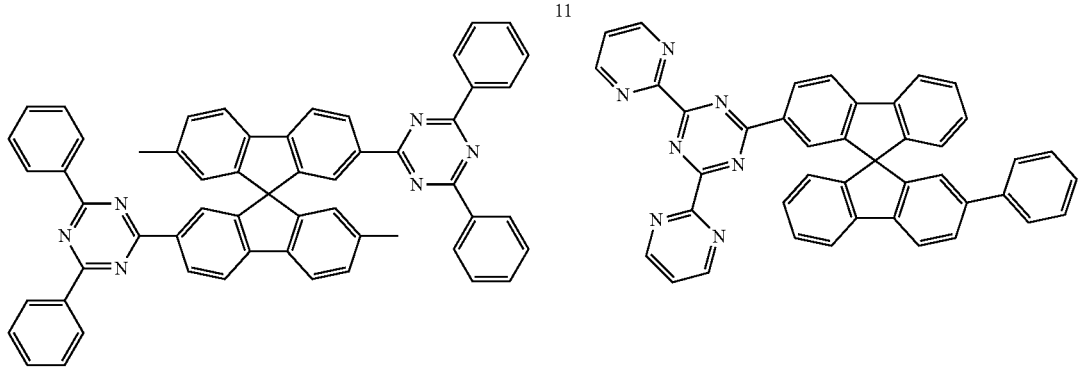
11
12
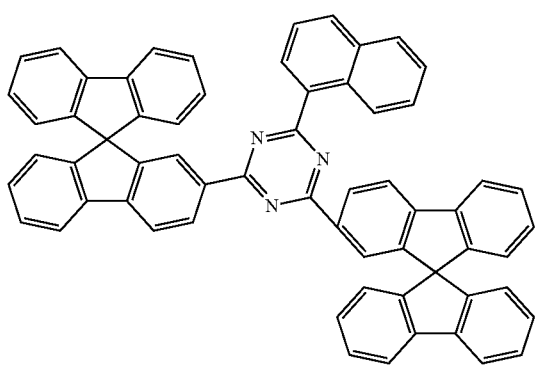
13
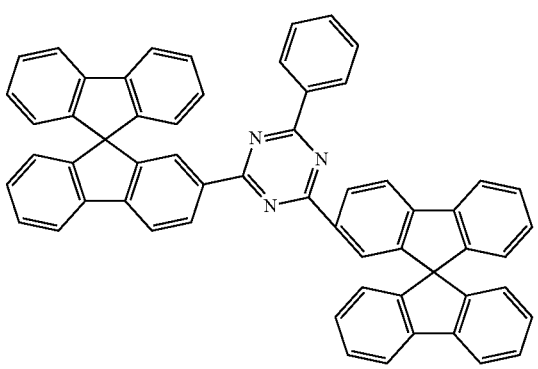
14
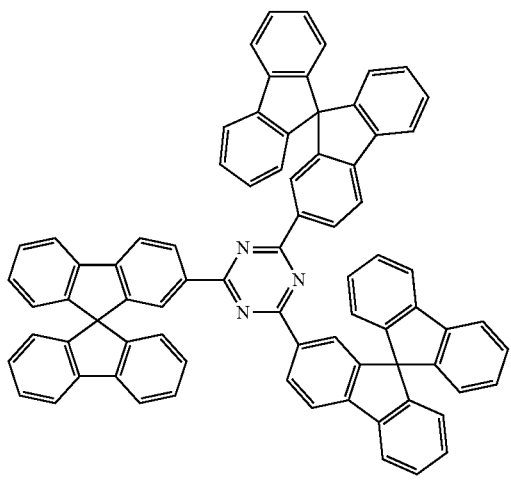
15
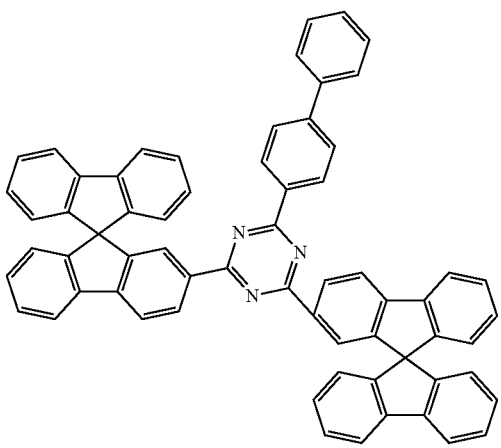
16

-continued
17
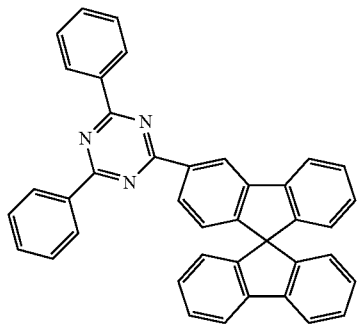
18
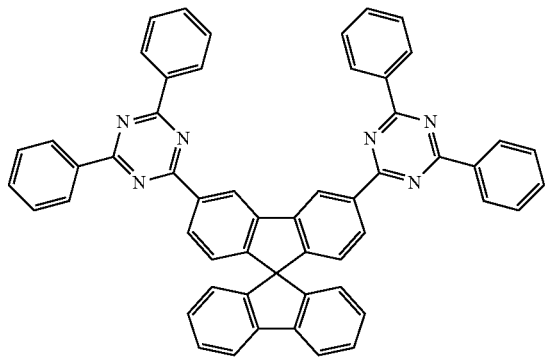
19
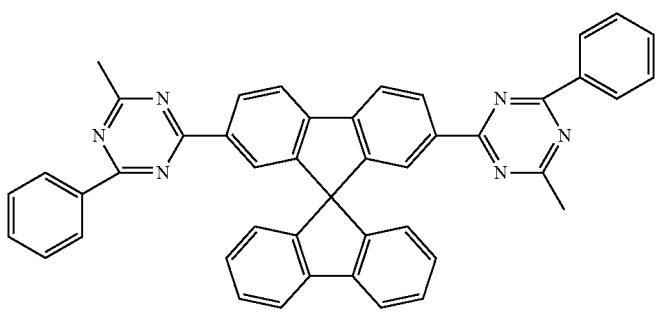
20
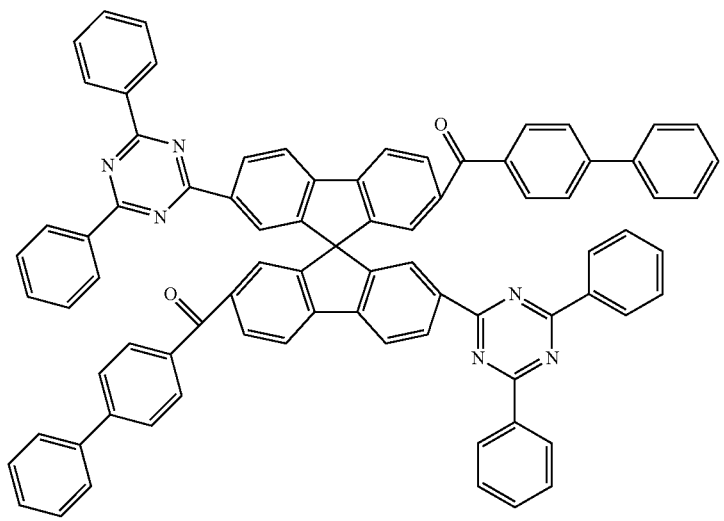
21
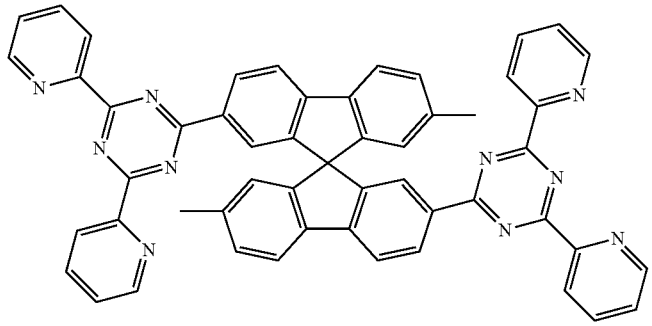

-continued
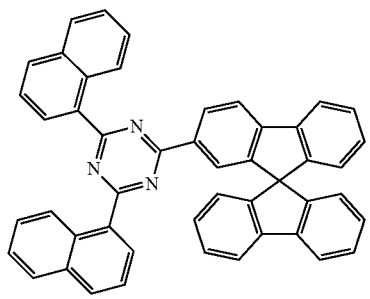
22
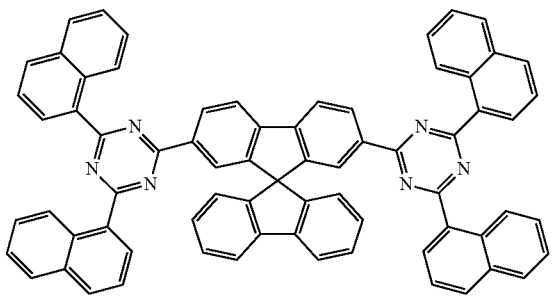
23
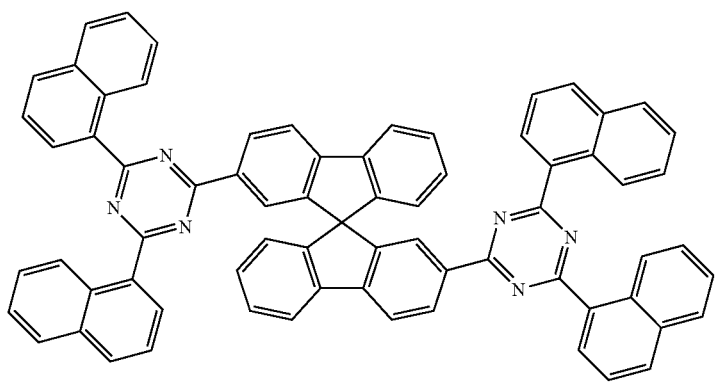
24
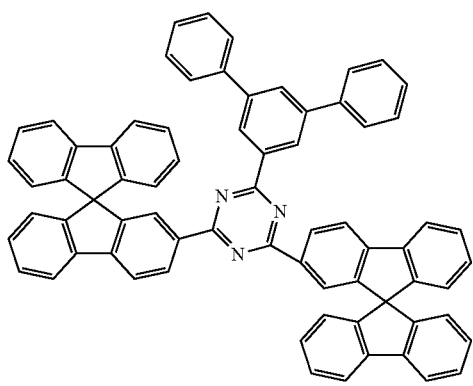
25
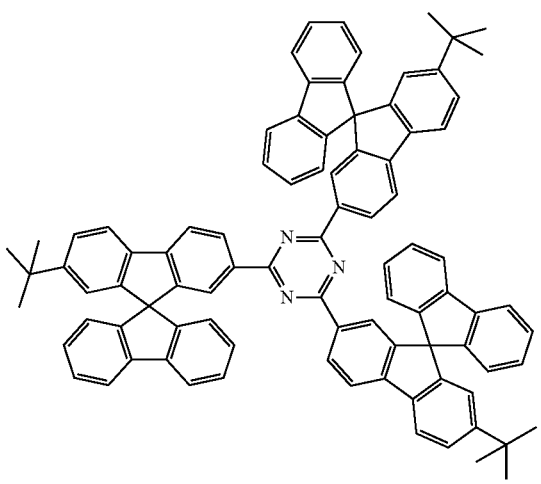
26
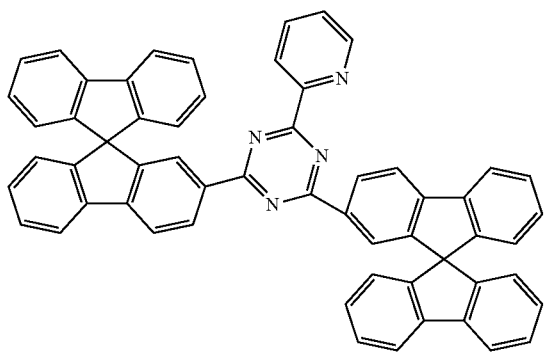
27
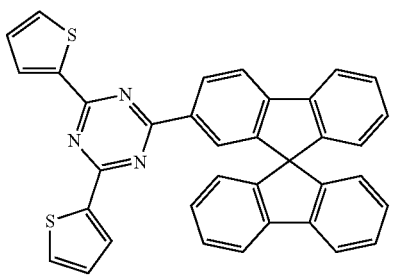
28

-continued
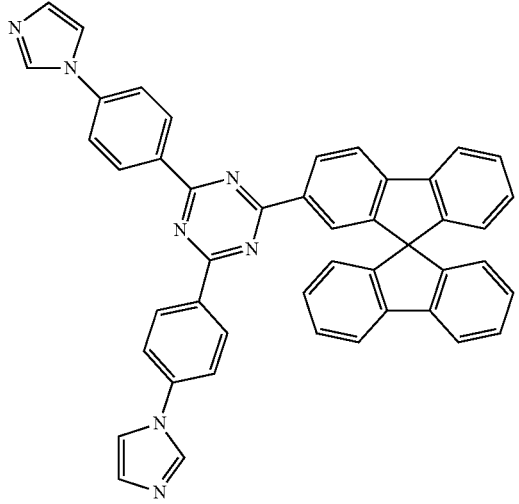
29
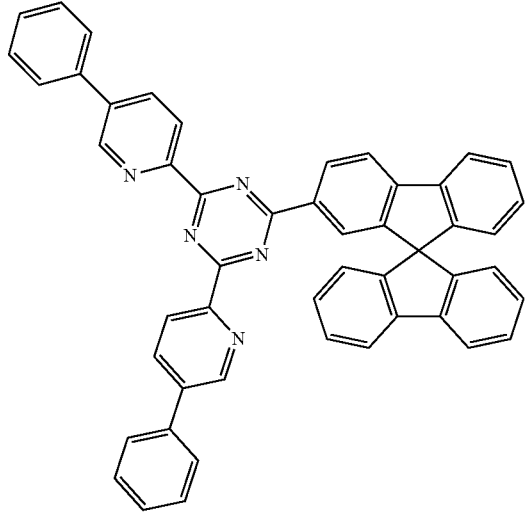
30
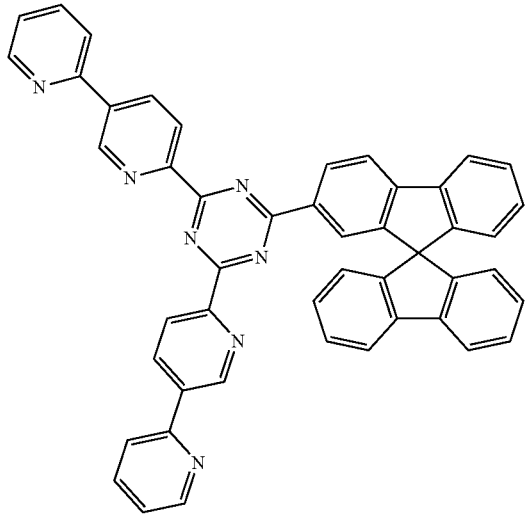
31
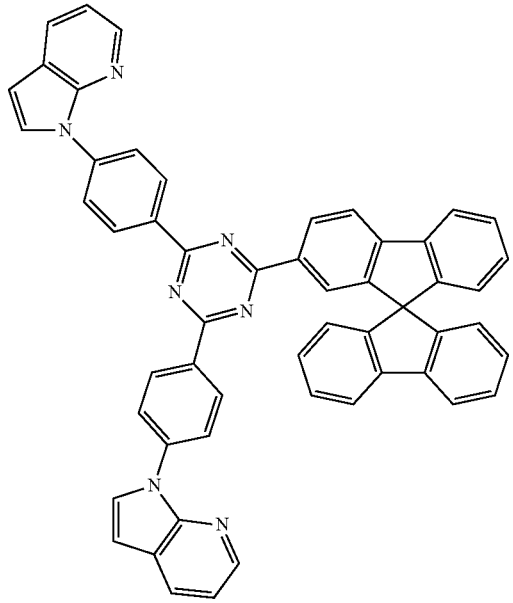
32
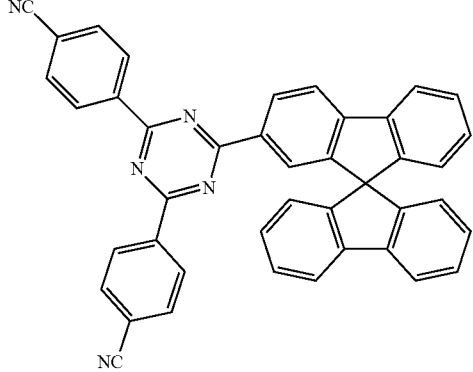
33
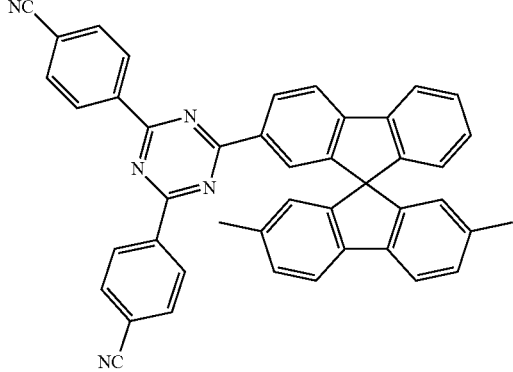
34

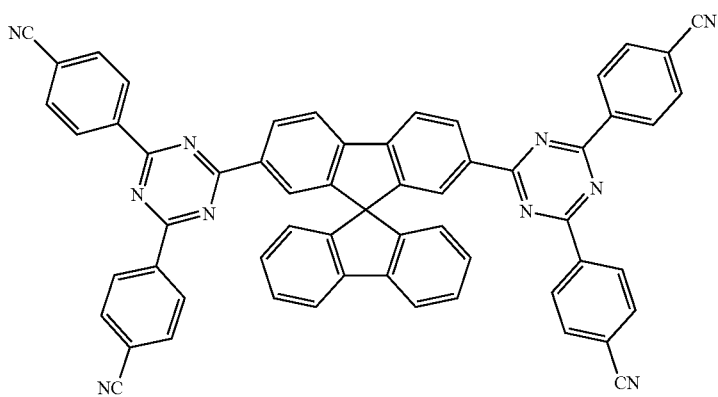
35
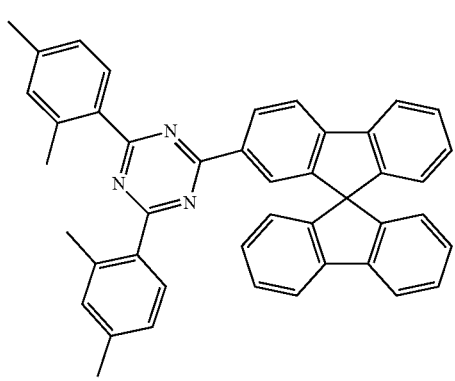
36
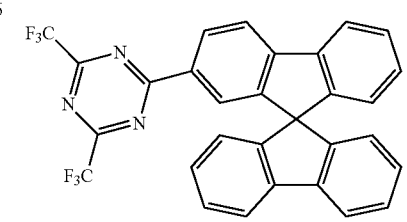
37
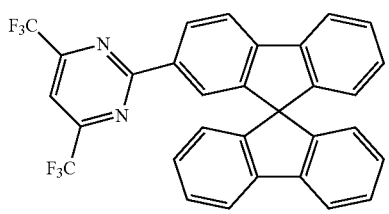
38
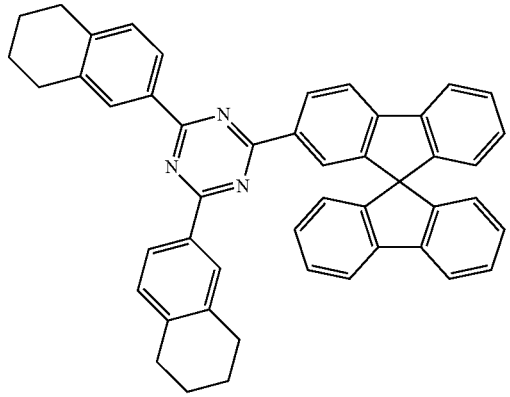
39

-continued
40
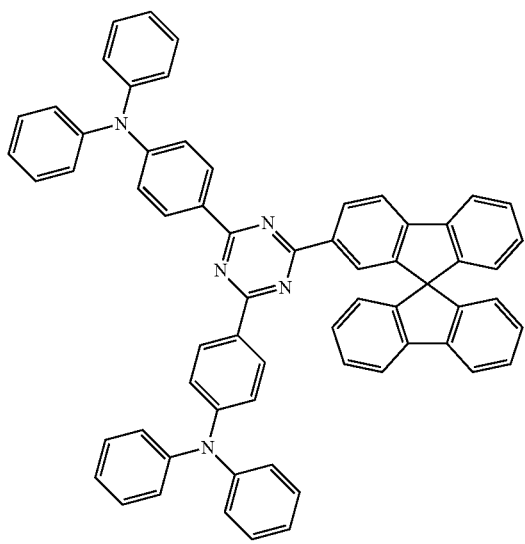
41
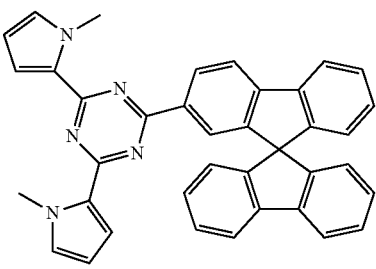
42
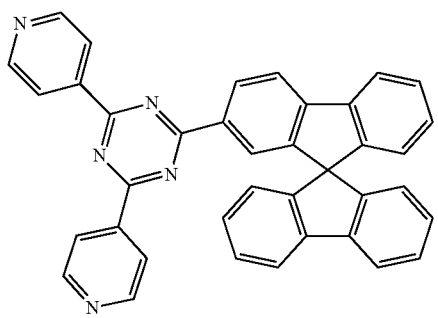
43
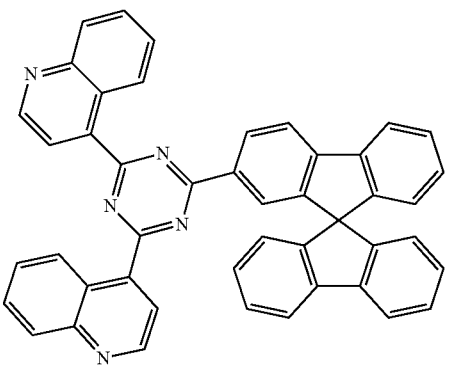
44
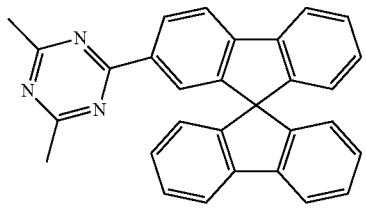
45
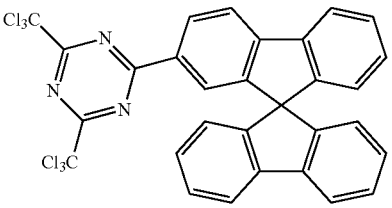
46
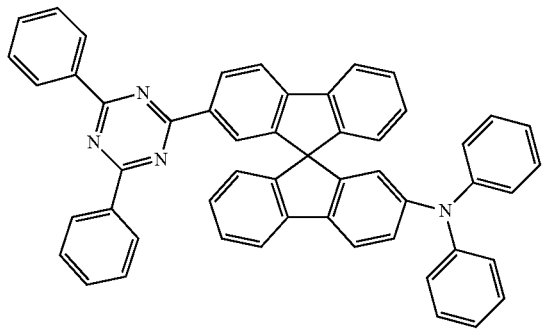
47
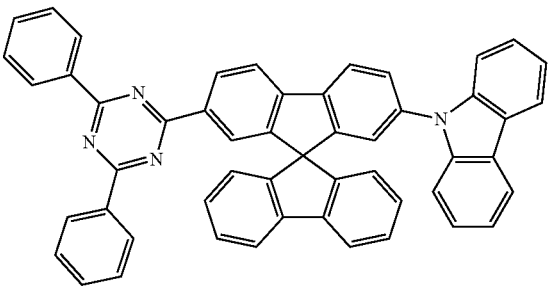

-continued
48
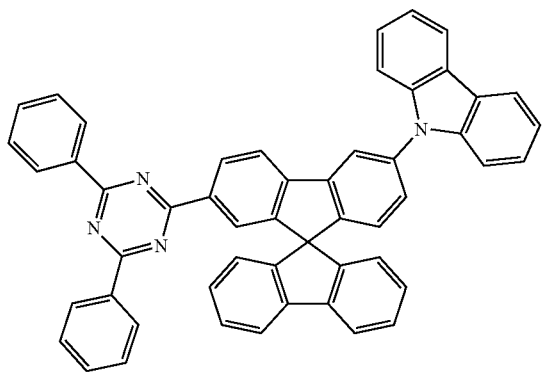
49
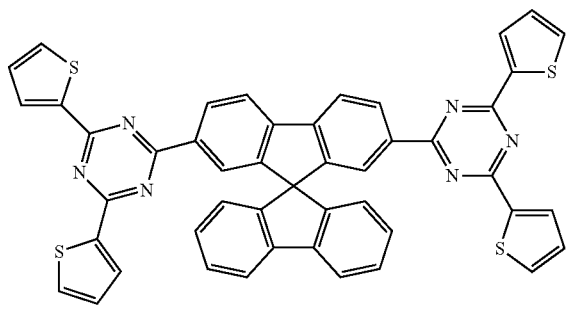
50
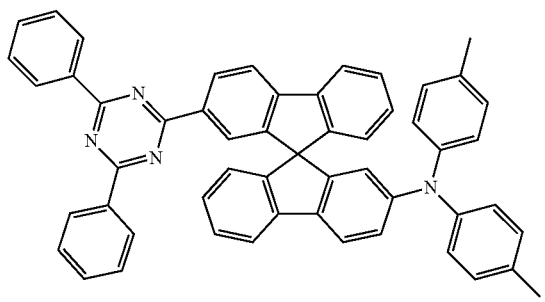
51
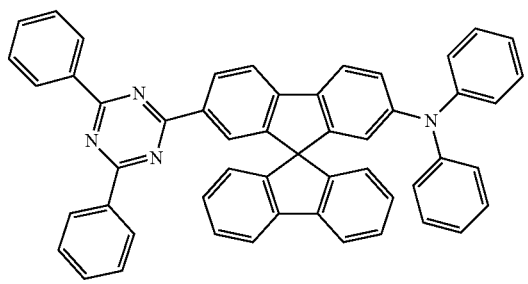
52
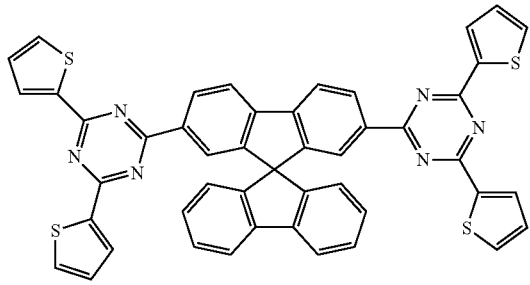
53
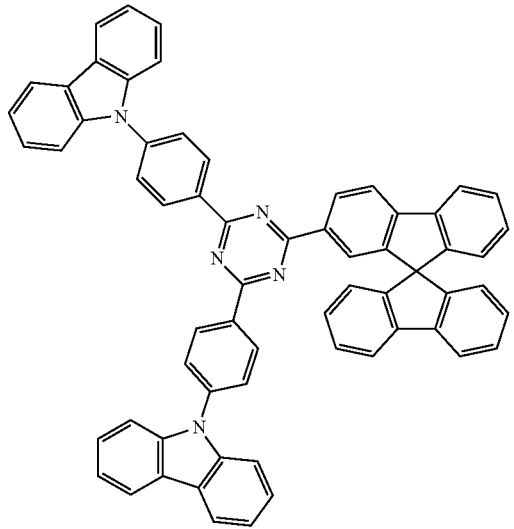

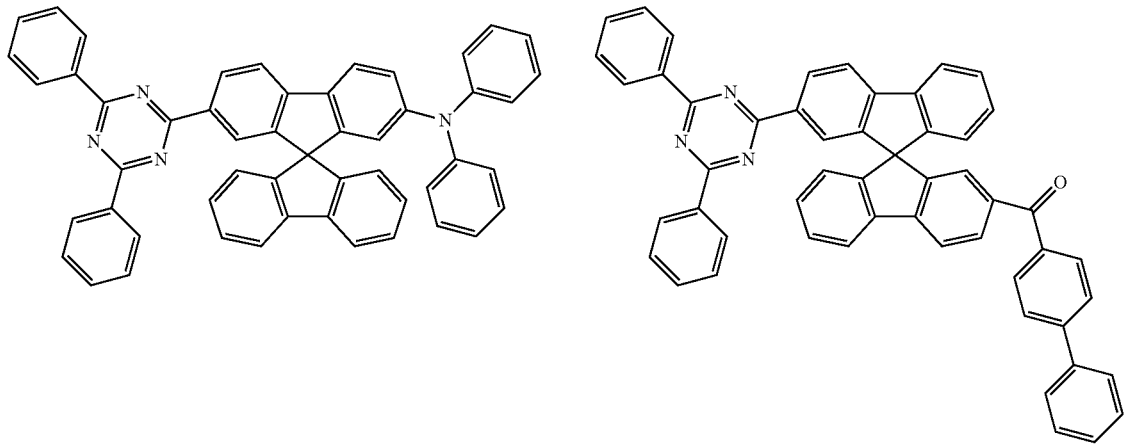
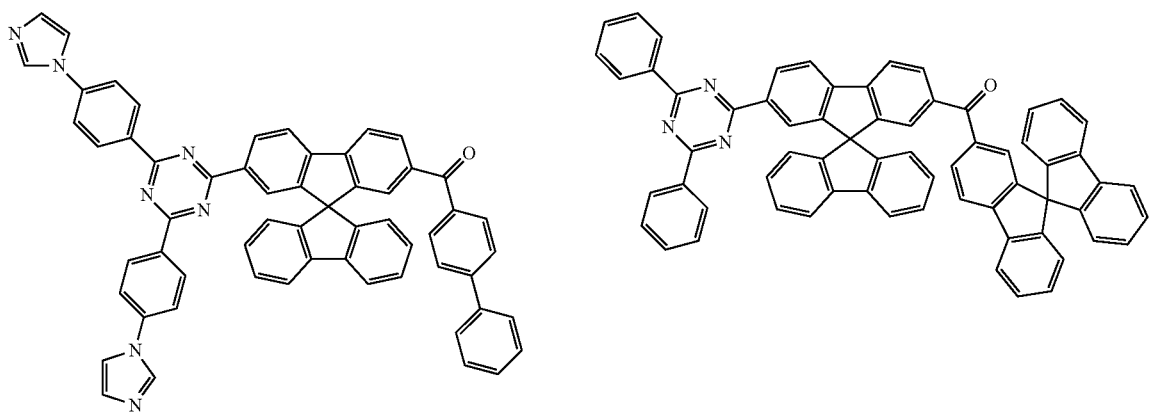
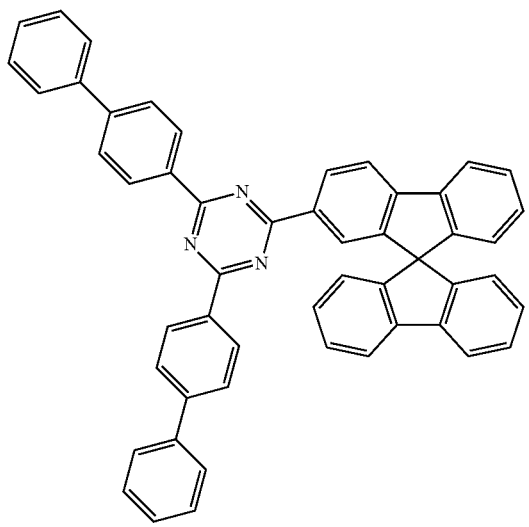

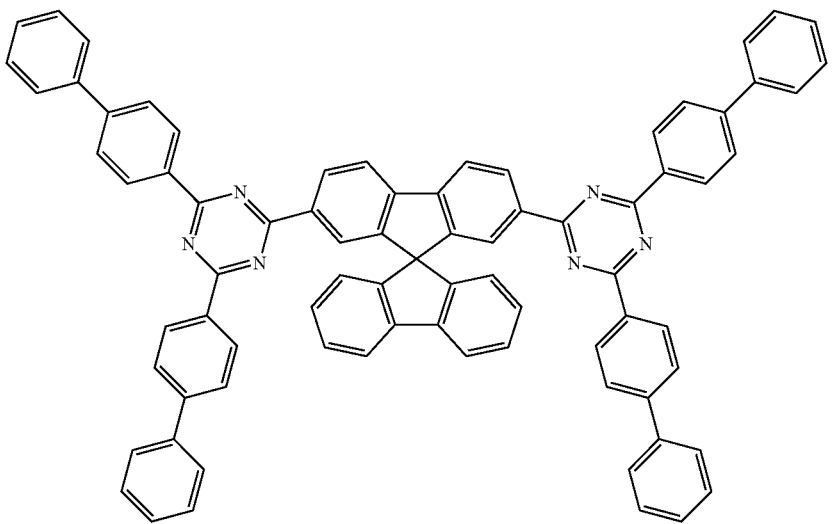
59
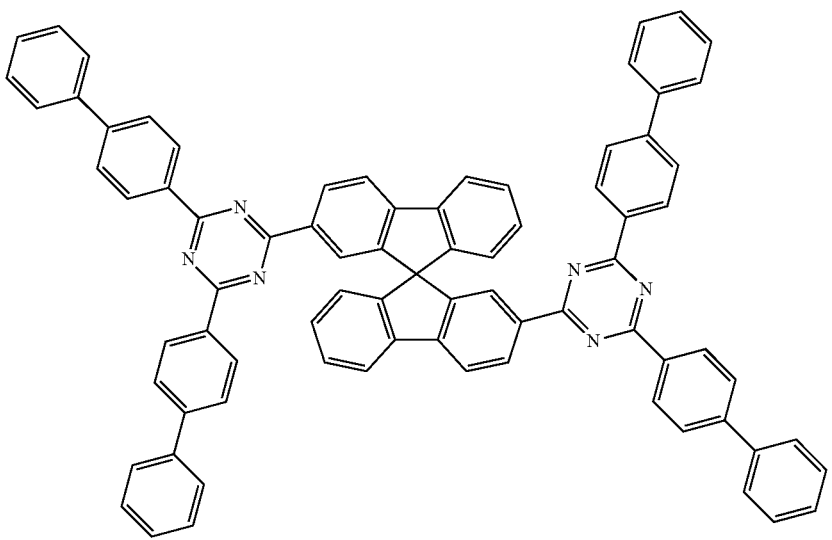
60
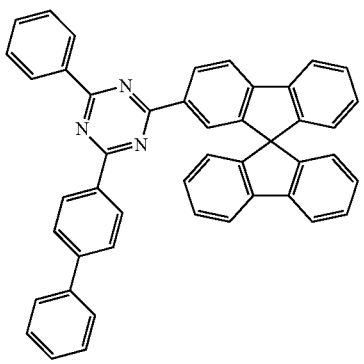
61
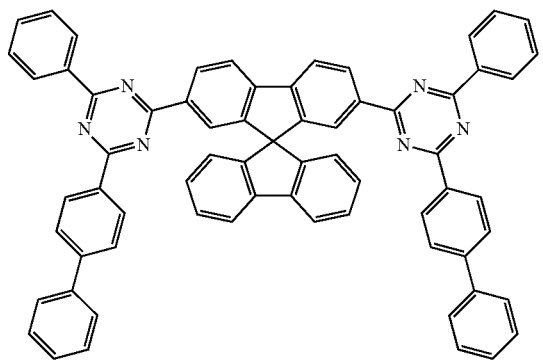
62

-continued
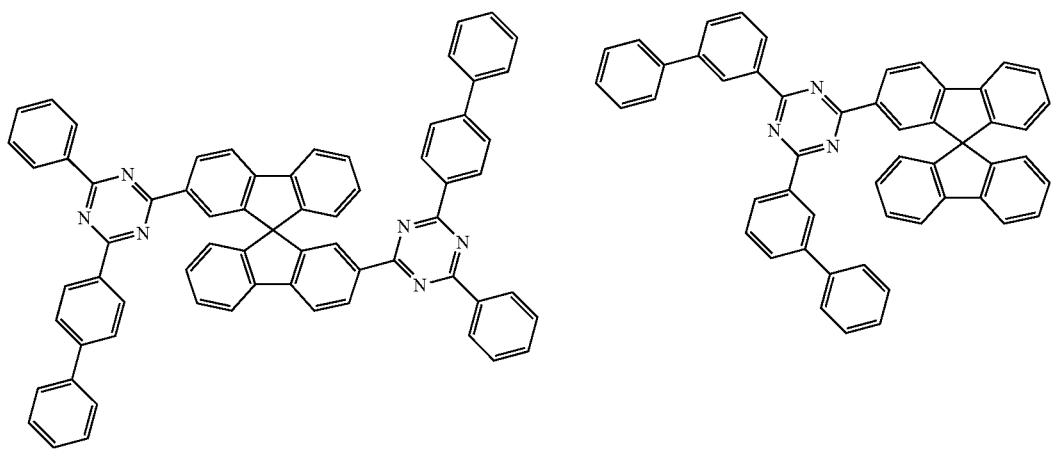
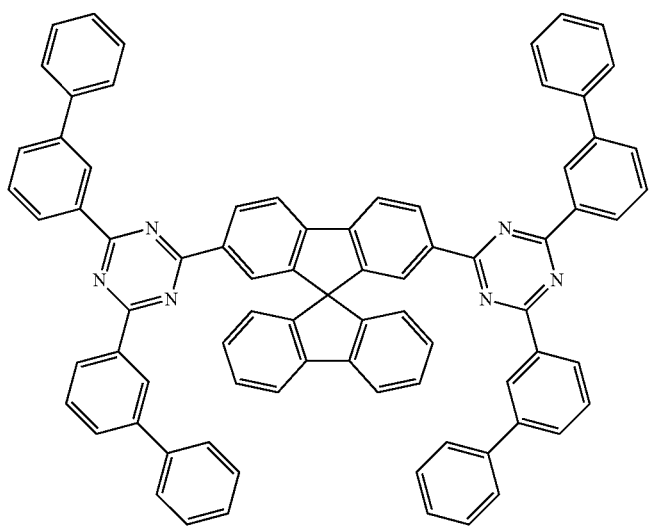
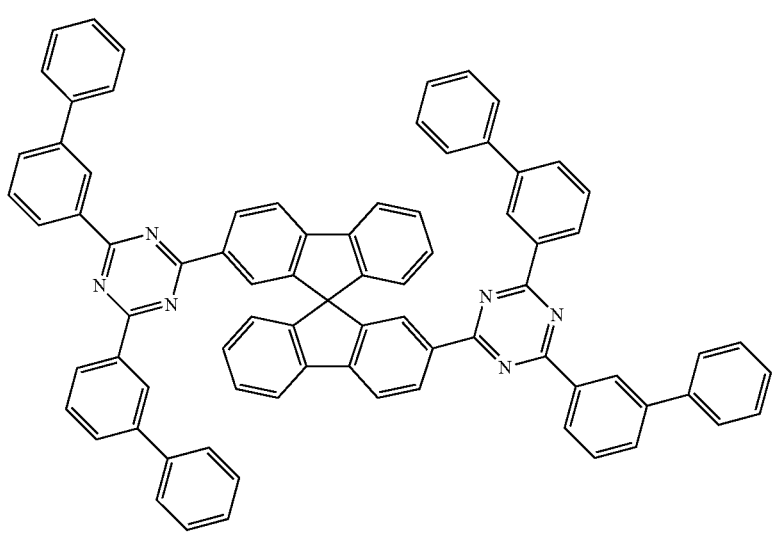

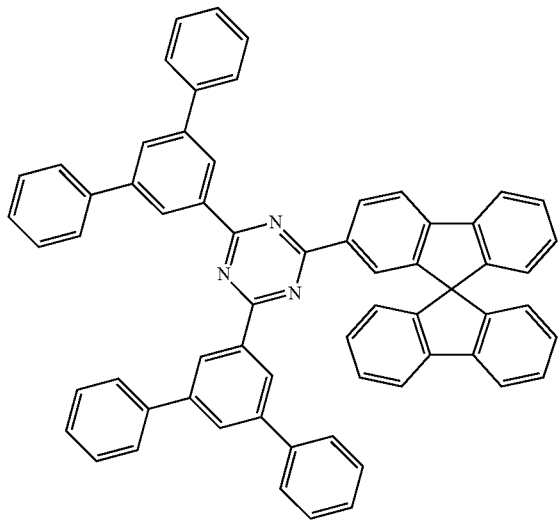

-continued
70
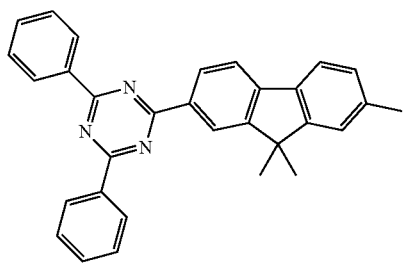
71
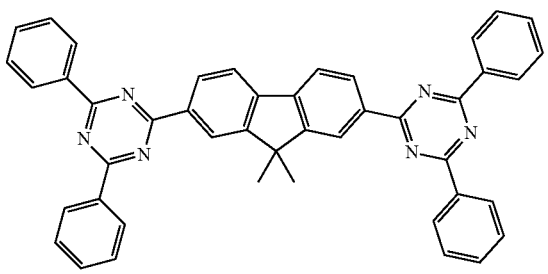
72
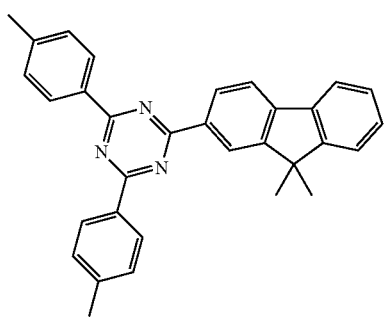
73
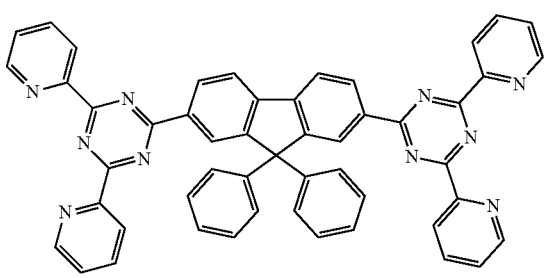
74
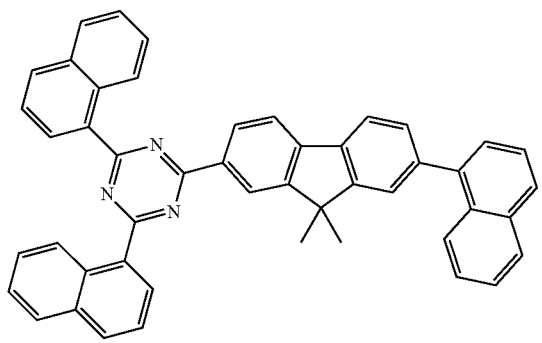
75
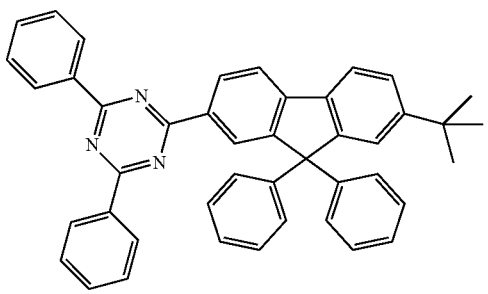
76
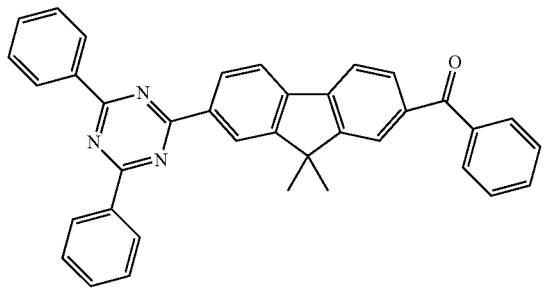
77
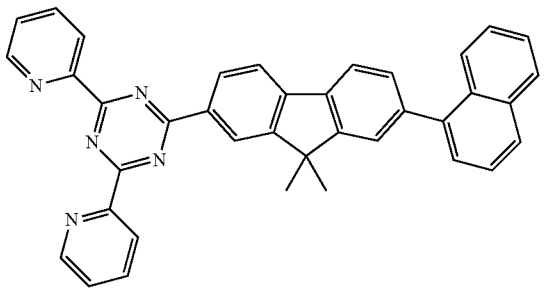
78
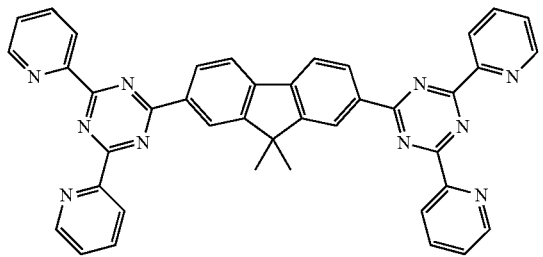
79
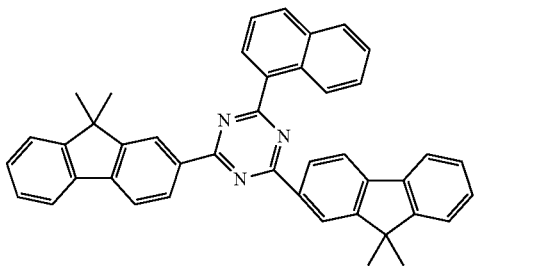

-continued
80
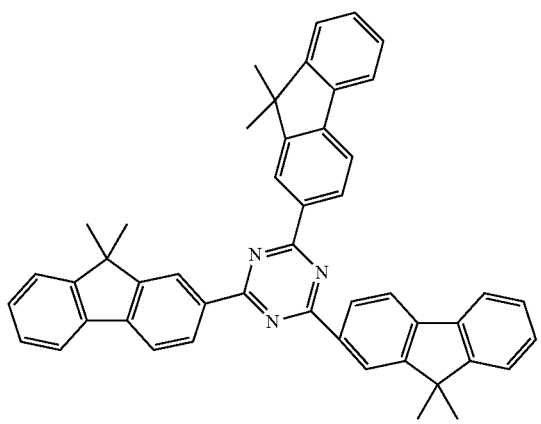
81
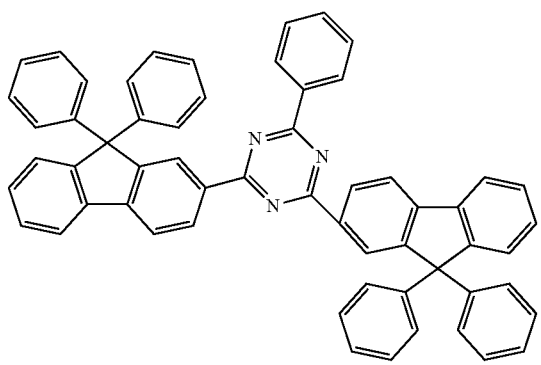
82
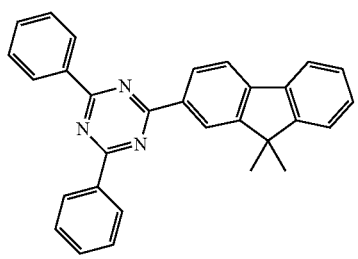
83
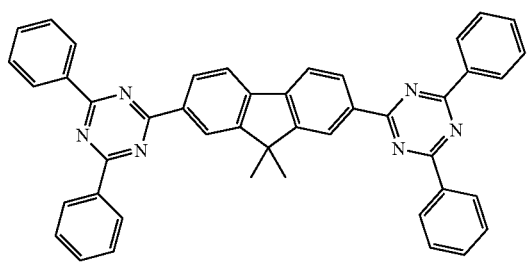
84
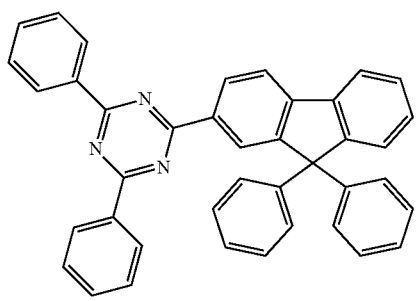
85
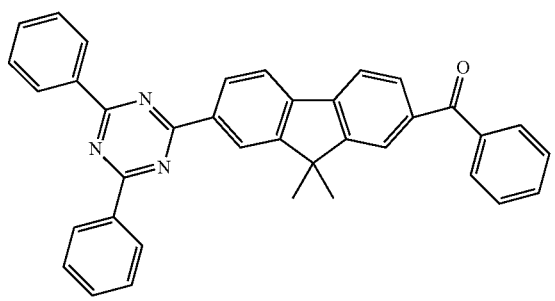
86
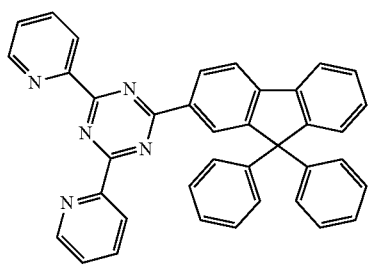
87
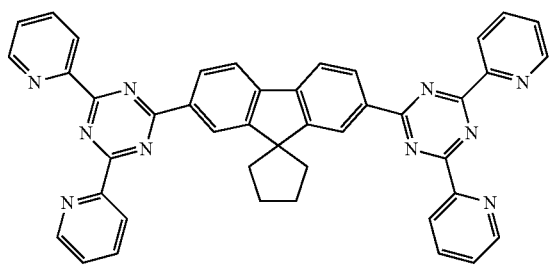

-continued
88 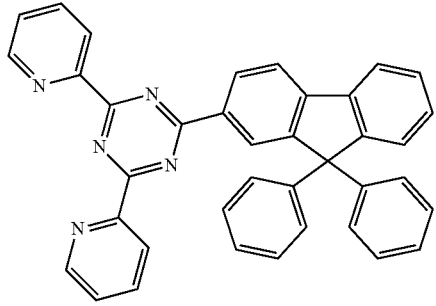
89 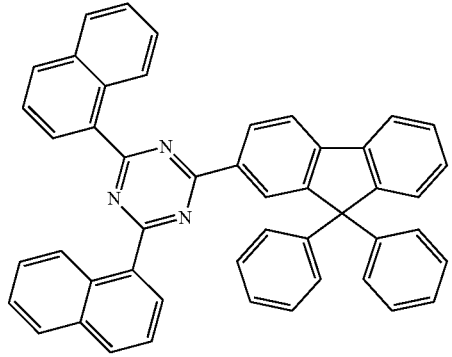
90 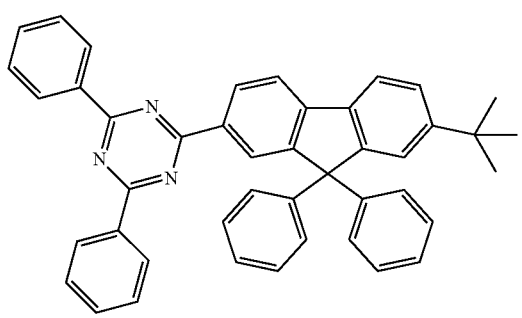
91 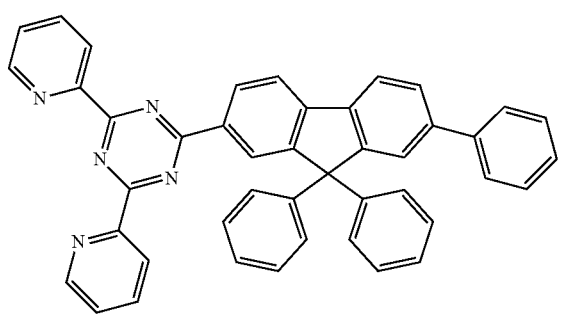
92 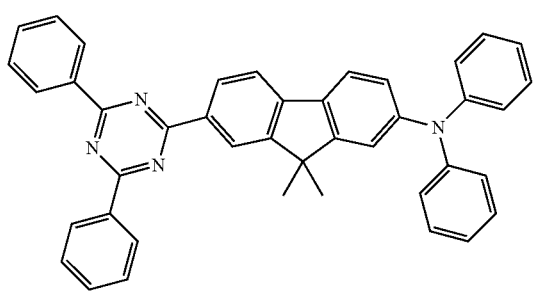
93 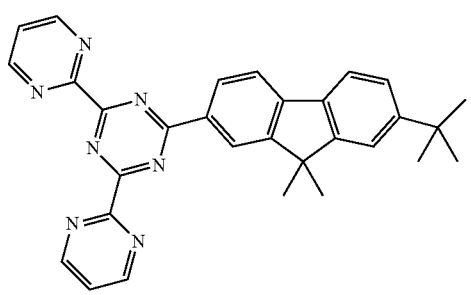
94 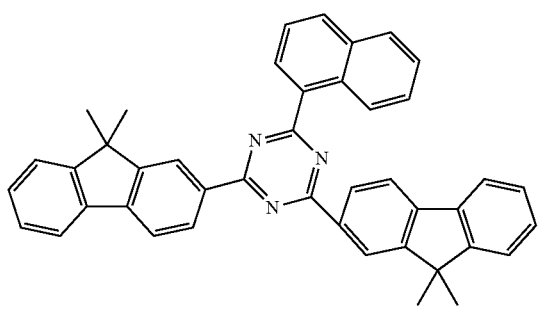
95 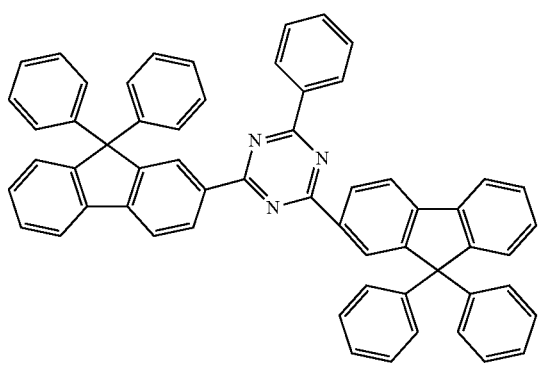

-continued
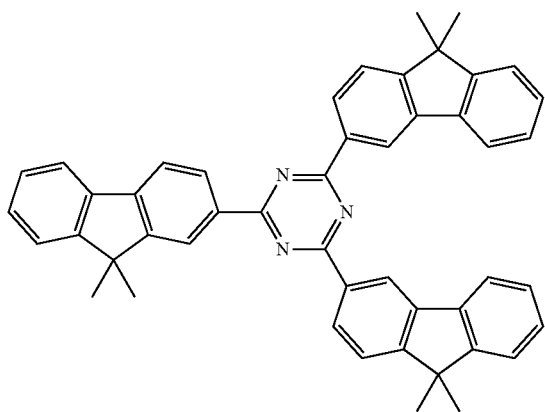
96
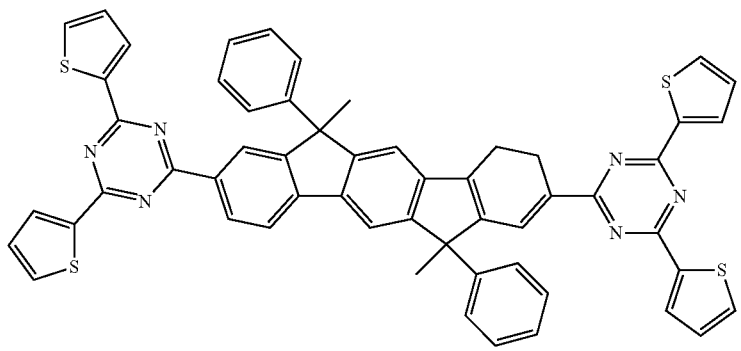
97
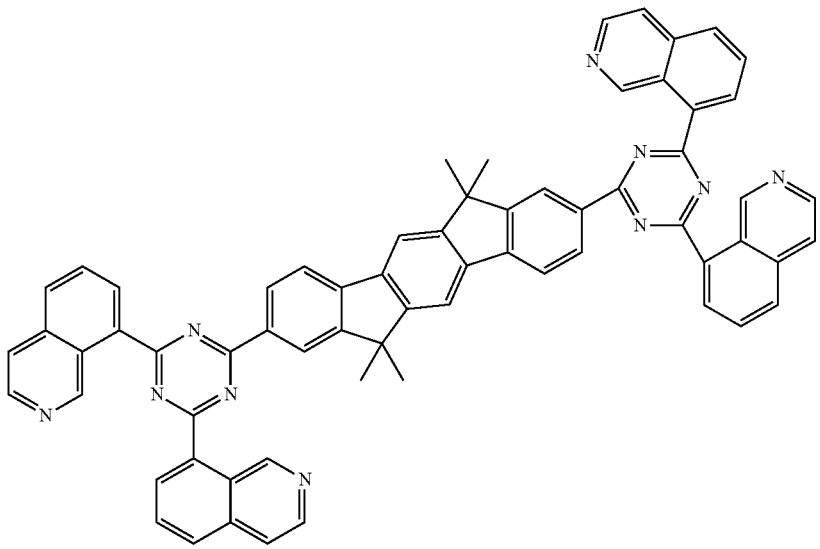
98

-continued
99 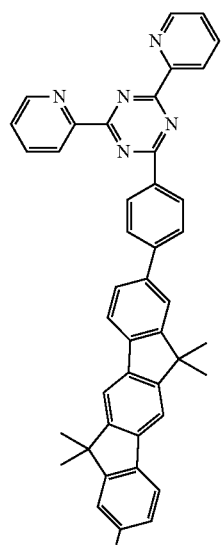
100 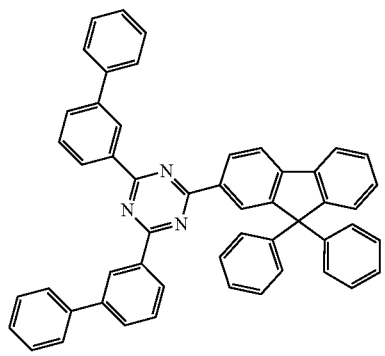
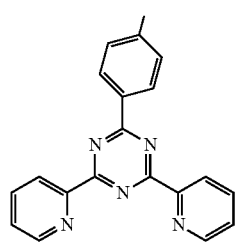
101 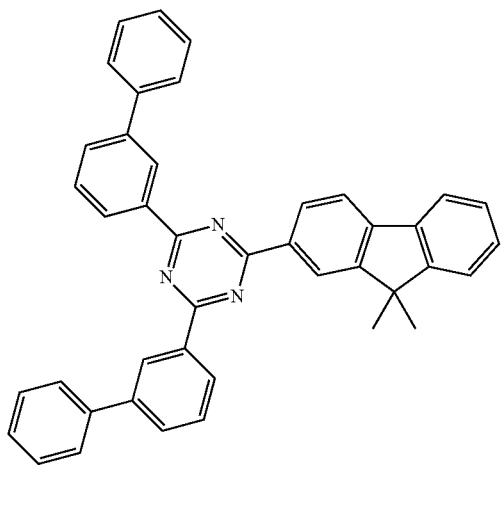
102 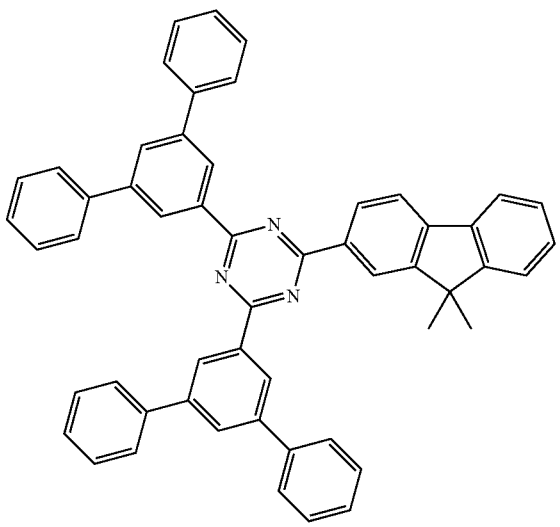

-continued
103
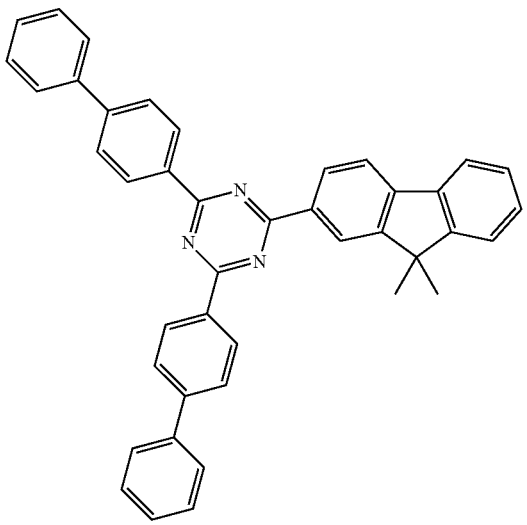
104
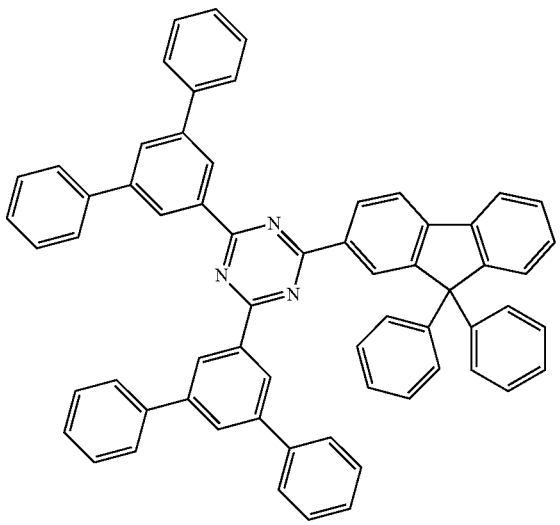
105
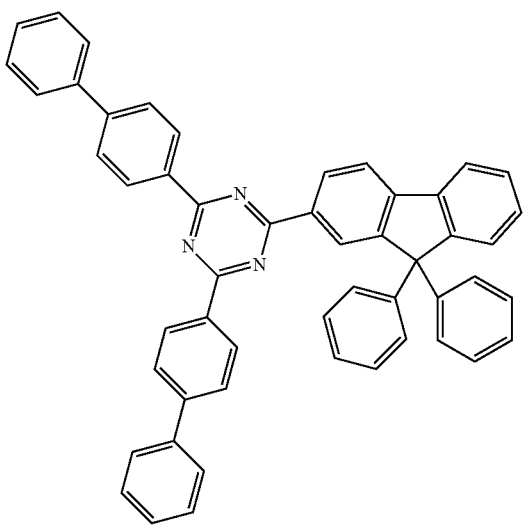
106
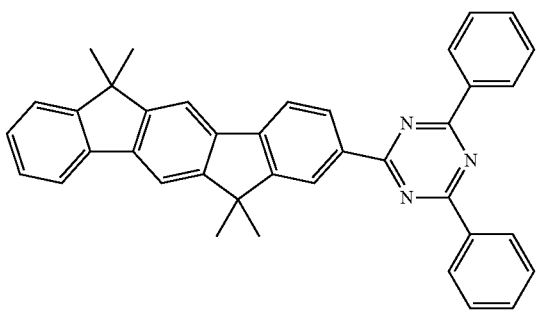
107
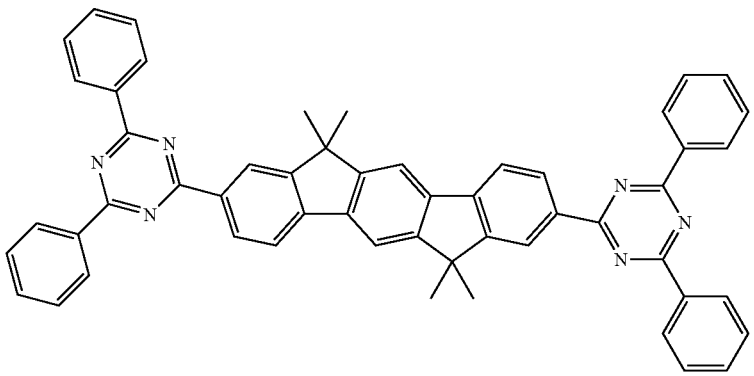

-continued
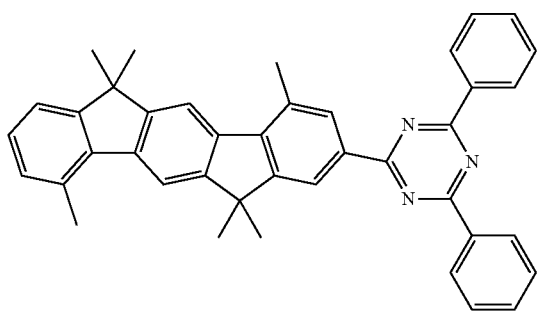
108
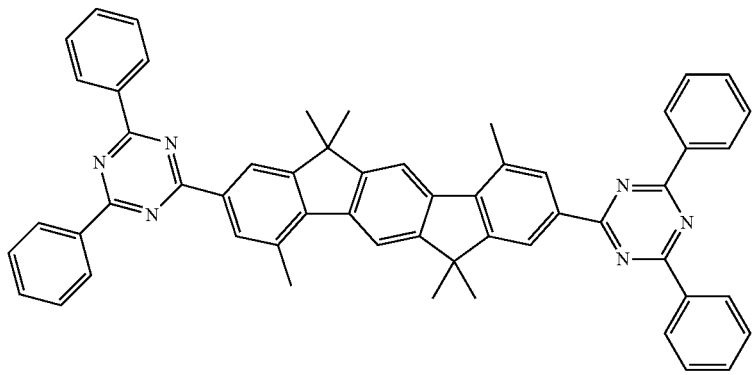
109
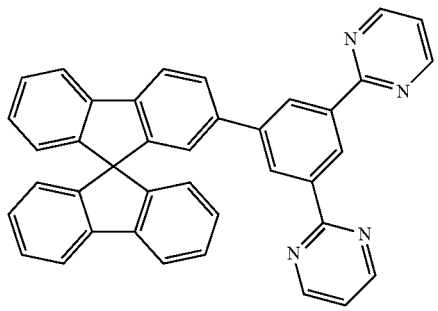
110
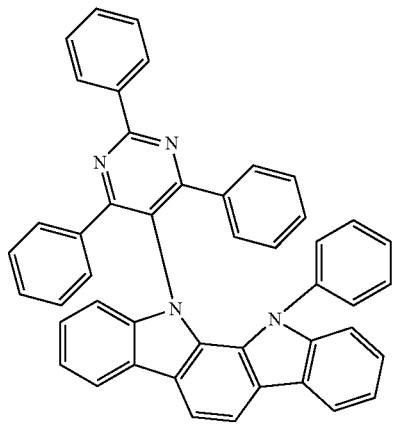
111
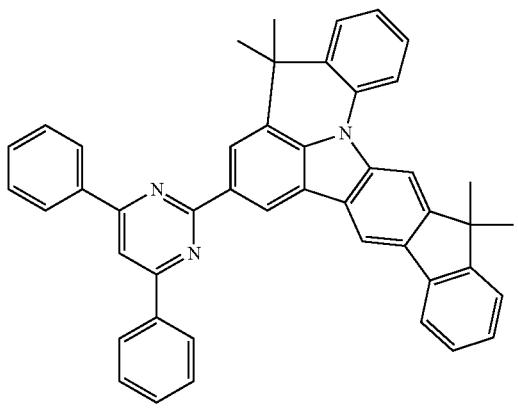
112
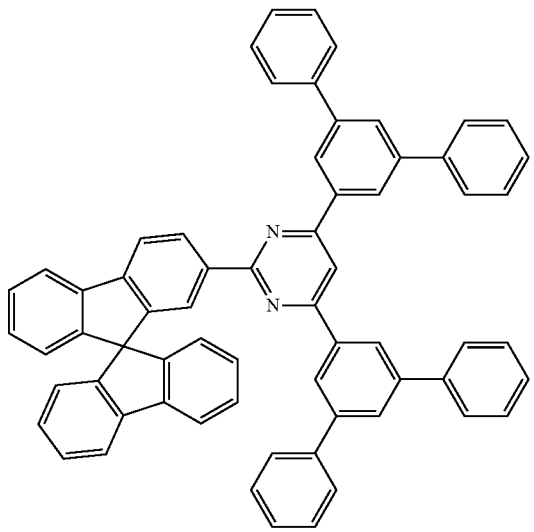
113

-continued
114
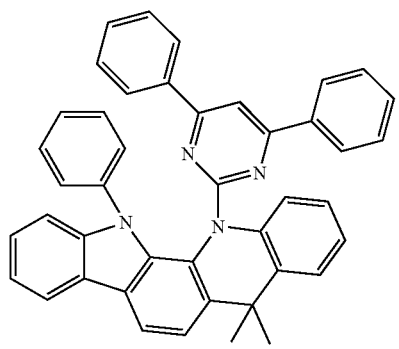
115
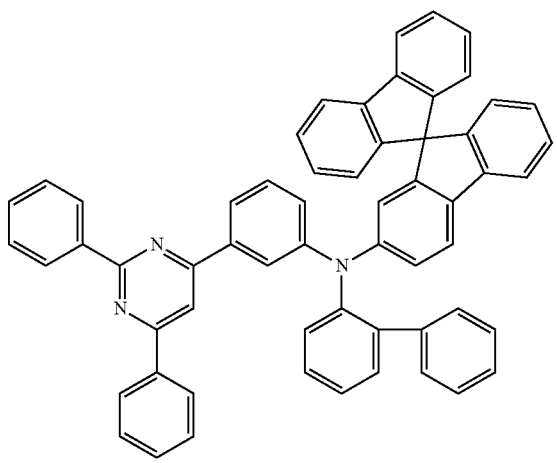
116
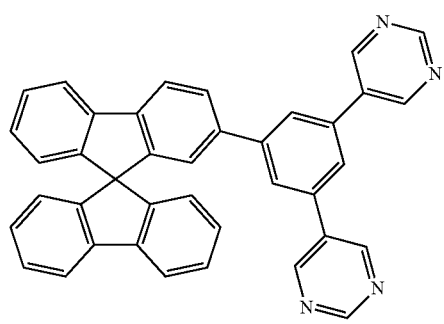
117
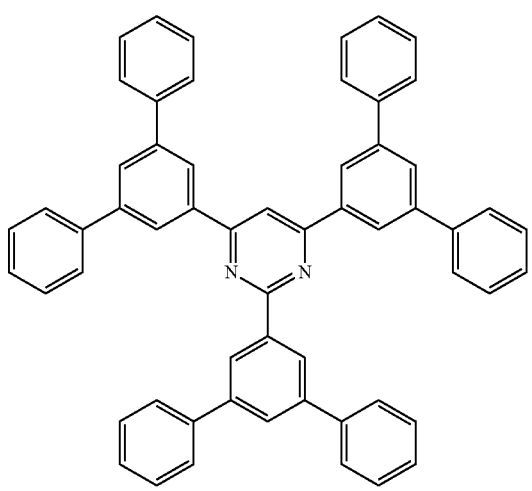
118
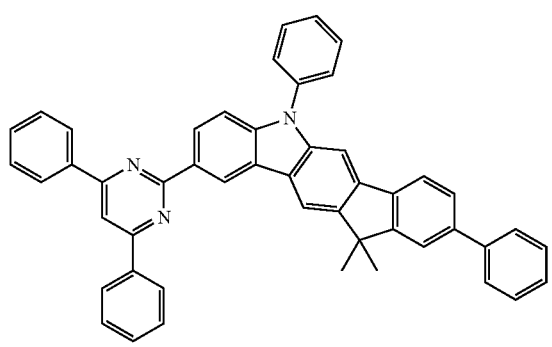
119
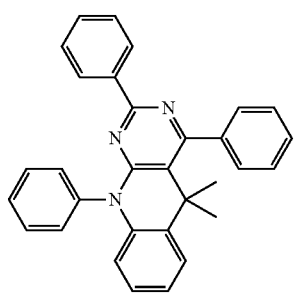

-continued
120
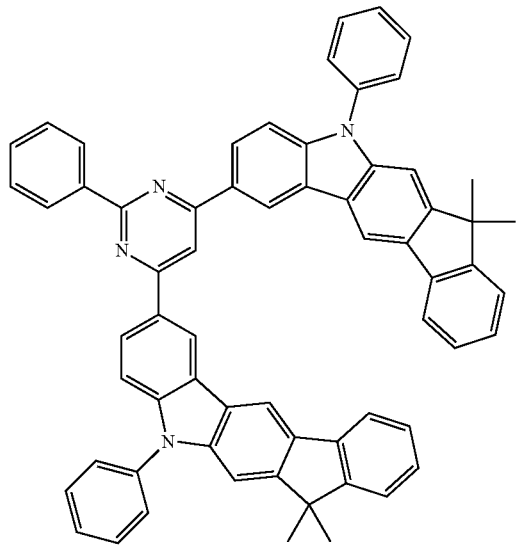
121
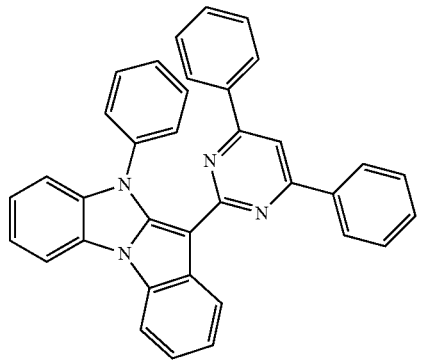
122
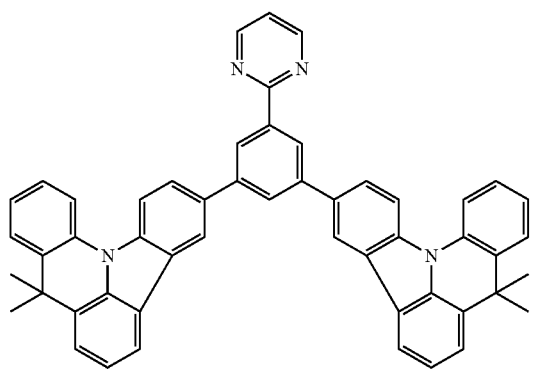
123
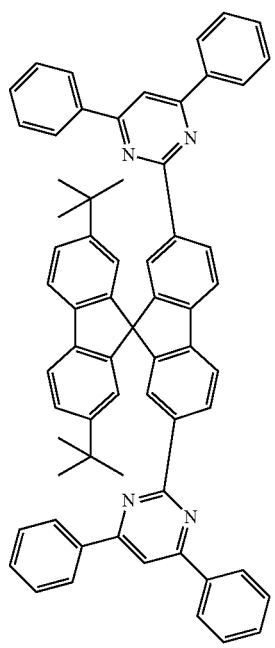
124
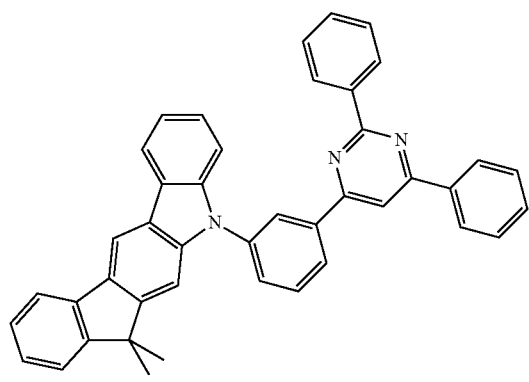
125
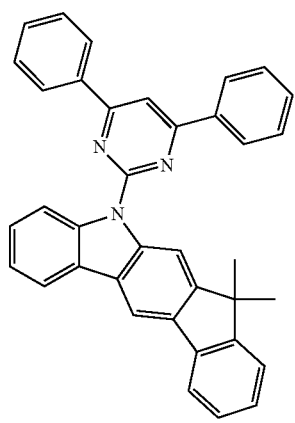

126

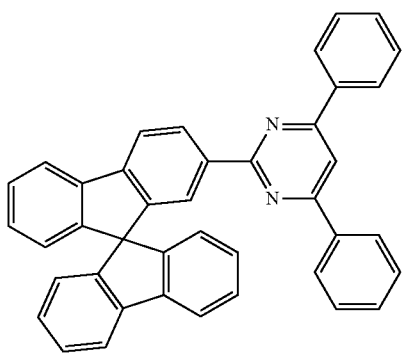

127

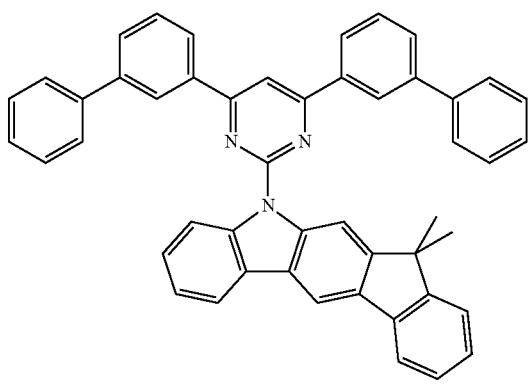

128

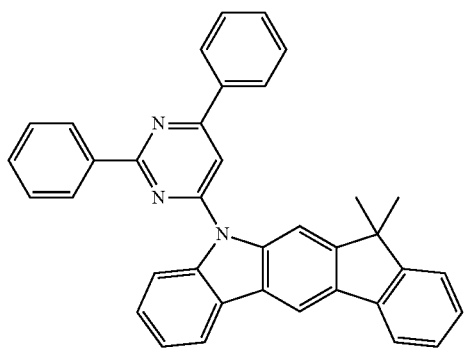

129

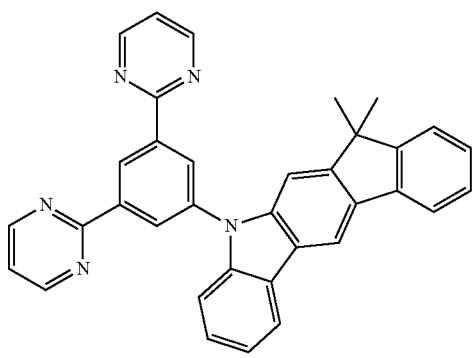

130

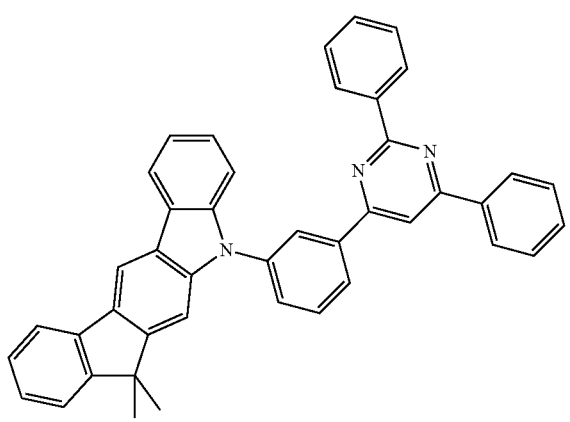

In a further preferred embodiment of the invention, the electron-conducting matrix material is an aromatic ketone or an aromatic phosphine oxide.

An aromatic ketone in the sense of this application is taken to mean a carbonyl group to which two aryl or heteroaryl groups or aromatic or heteroaromatic ring systems are bonded directly. An aromatic phosphine oxide in the sense of this application is taken to mean a P=O group to which three aryl or heteroaryl groups or aromatic or heteroaromatic ring systems are bonded directly.

In a preferred embodiment of the invention, the aromatic ketone is a compound of the following formula (23) and the aromatic phosphine oxide is a compound of the following formula (24),

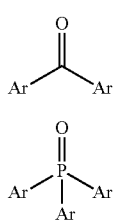

formula (23)

formula (24)

where Ar has the meaning given above.

Suitable compounds of the formula (23) are, in particular, the ketones disclosed in WO 2004/093207 and WO 2010/006680. Suitable phosphine oxides of the formula (24) are, in particular, the phosphine oxides disclosed in WO 2005/003253.

It is evident from the definition of the compound of the formula (23) that this need not contain only one carbonyl group, but instead may also contain a plurality of carbonyl groups. The compound of the formula (24) may likewise also contain a plurality of phosphine oxide groups.

The group Ar in compounds of the formula (23) and formula (24) is preferably an aromatic ring system having 6 to 40 aromatic ring atoms, i.e. it contains no heteroaryl groups. As defined above, the aromatic ring system need not necessarily contain only aromatic groups, but instead two aryl groups may also be interrupted by a non-aromatic group, for example by a further carbonyl group or phosphine oxide group.

In a further preferred embodiment of the invention, the group Ar contains not more than two condensed rings. It is thus preferably built up only from phenyl and/or naphthyl groups, particularly preferably only from phenyl groups, but contains no larger condensed aromatic ring systems, such as, for example, anthracene.

Preferred groups Ar which are bonded to the carbonyl group are phenyl, 2-, 3- or 4-tolyl, 3- or 4-o-xylyl, 2- or 4-m-xylyl, 2-p-xylyl, o-, m- or p-tert-butylphenyl, o-, m- or p-fluorophenyl, benzophenone, 1-, 2- or 3-phenylmethanone, 2-, 3- or 4-biphenyl, 2-, 3- or 4-o-terphenyl, 2-, 3- or 4-m-terphenyl, 2-, 3- or 4-p-terphenyl, 2'-p-terphenyl, 2'-, 4'- or 5'-m-terphenyl, 3'- or 4'-o-terphenyl, p-, m,p-, o,p-, m,m-, o,m- or o,o-quaterphenyl, quinquephenyl, sexiphenyl, 1-, 2-, 3- or 4-fluorenyl, 2-, 3- or 4-spiro-9,9'-bifluorenyl, 1-, 2-, 3- or 4-(9,10-dihydro)phenanthrenyl, 1- or 2-naphthyl, 2-, 3-, 4-, 5-, 6-, 7- or 8-quinolinyl, 1-, 3-, 4-, 5-, 6-, 7- or 8-isoquinolinyl, 1- or 2-(4-methylnaphthyl), 1- or 2-(4-phenylnaphthyl), 1- or 2-(4-naphthyl-naphthyl), 1-, 2- or 3-(4-naphthylphenyl), 2-, 3- or 4-pyridyl, 2-, 4- or 5-pyrimidinyl, 2- or 3-pyrazinyl, 3- or 4-pyridanzinyl, 2-(1,3,5-triazin)yl-, 2-, 3- or 4-(phenylpyridyl), 3-, 4-, 5- or 6-(2,2'-bipyridyl), 2-, 4-, 5- or 6-(3,3'-bipyridyl), 2- or 3-(4,4'-bipyridyl) and combinations of one or more of these radicals.

The groups Ar may, as defined above, be substituted by one or more radicals $R^1$. These radicals $R^1$ are preferably selected, identically or differently on each occurrence, from the group consisting of H, D, F, C(=O)$Ar^2$, P(=O)($Ar^2$)$_2$, S(=O)$Ar^2$, S(=O)$_2Ar^2$, a straight-chain alkyl group having 1 to 4 C atoms or a branched or cyclic alkyl group having 3 to 5 C atoms, each of which may be substituted by one or more radicals $R^2$, where one or more H atoms may be replaced by D or F, or an aromatic ring system having 6 to 24 aromatic ring atoms, which may be substituted by one or more radicals $R^2$, or a combination of these systems; two or more adjacent substituents $R^1$ here may also form a mono- or polycyclic, aliphatic or aromatic ring system with one another. If the organic electroluminescent device is applied from solution, straight-chain, branched or cyclic alkyl groups having up to 10 C atoms are also preferred as substituents $R^1$. The radicals $R^1$ are particularly preferably selected, identically or differently on each occurrence, from the group consisting of H, C(=O)$Ar^2$ or an aromatic ring system having 6 to 24 aromatic ring atoms, which may be substituted by one or more radicals $R^2$, but is preferably unsubstituted.

In a further preferred embodiment of the invention, the group $Ar^2$ is, identically or differently on each occurrence, an aromatic ring system having 6 to 24 aromatic ring atoms, which may be substituted by one or more radicals $R^2$. $Ar^2$ is particularly preferably, identically or differently on each occurrence, an aromatic ring system having 6 to 12 aromatic ring atoms.

Particular preference is given to benzophenone derivatives which are substituted at each of the 3,5,3',5'-positions by an aromatic or heteroaromatic ring system having 5 to 30 aromatic ring atoms, which may in turn be substituted by one or more radicals $R^1$ in accordance with the above definition. Preference is furthermore given to ketones which are substituted by at least one spirobifluorene group.

Preferred aromatic ketones and phosphine oxides are therefore furthermore the compounds of the following formula (25) to (35),

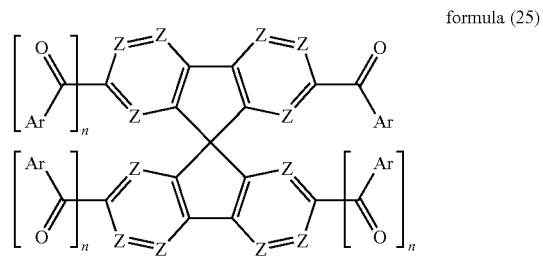

formula (25)

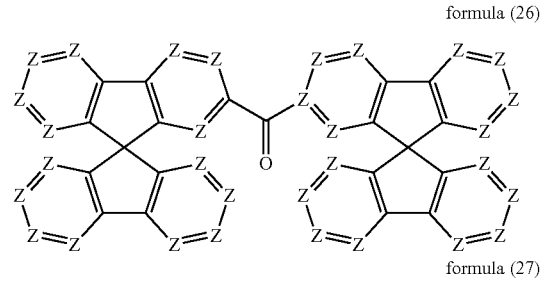

formula (26)

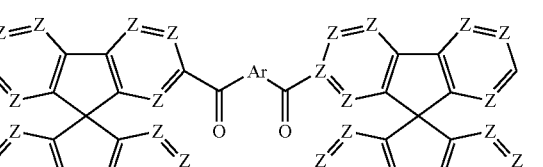

formula (27)

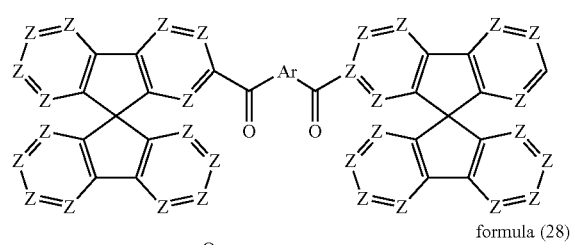

formula (28)

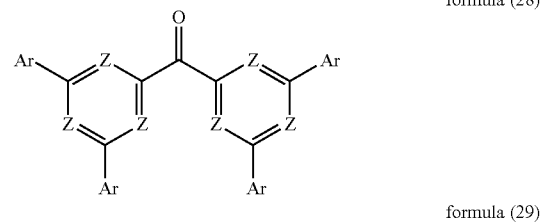

formula (29)

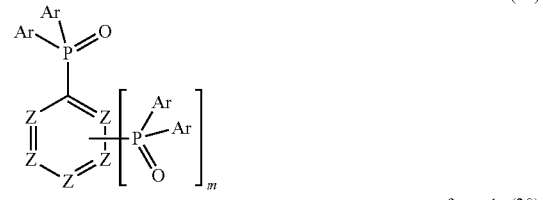

formula (30)

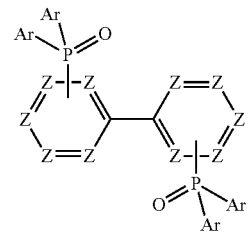

-continued formula (31)
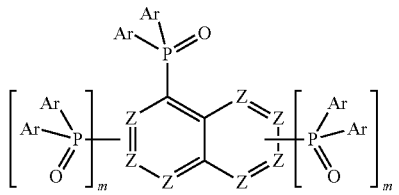

formula (32)
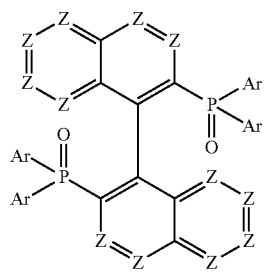

formula (33)
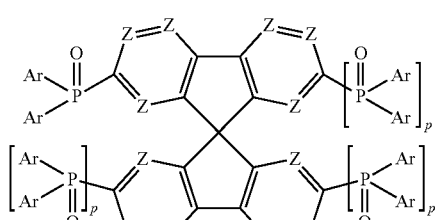

formula (34)
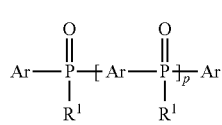

formula (35)
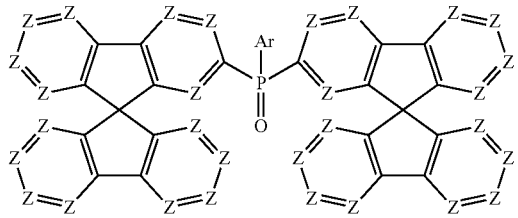

where Ar has the same meaning as described above and furthermore:

Z is, identically or differently on each occurrence, $CR^1$ or N, where a maximum of 3 symbols Z per ring stand for N; Z is preferably equal to $CR^1$;

n is, identically or differently on each occurrence, 0 or 1.

m is, identically or differently on each occurrence, 0, 1, 2 or 3;

p is, identically or differently on each occurrence, 0 or 1.

Ar in the above-mentioned formulae preferably stands for an aromatic or heteroaromatic ring system having 5 to 30 aromatic ring atoms which contains no condensed aryl groups having more than 10 aromatic ring atoms, preferably absolutely no condensed aryl groups, and which may be substituted by one or more radicals $R^1$. Particular preference is given to the groups Ar which are mentioned as preferred above. Particular preference is likewise given to the groups $R^1$ which are mentioned as preferred above.

Examples of suitable compounds of the formula (23) to (35) are compounds (1) to (72) depicted below.

(1)
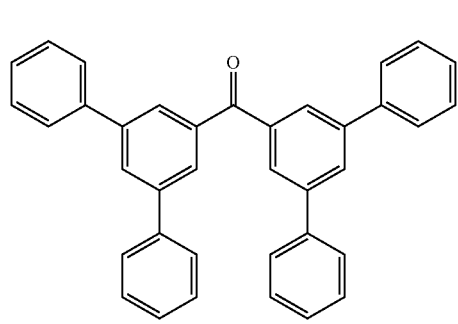

(2)
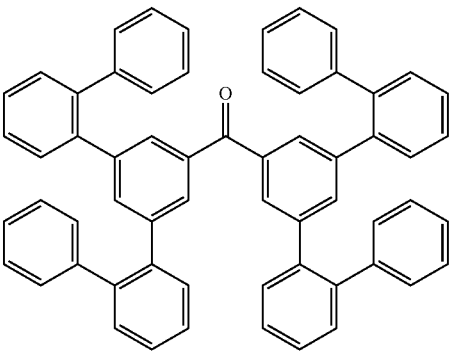

(3)
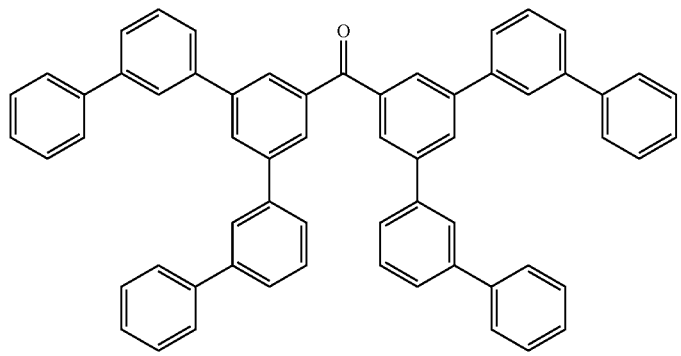

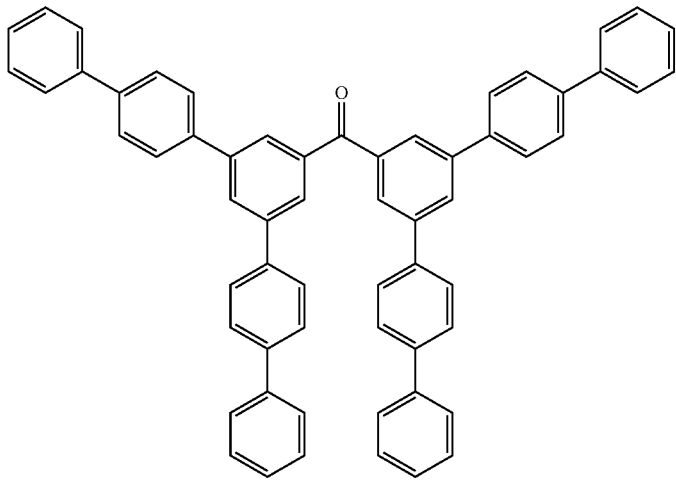
(4)
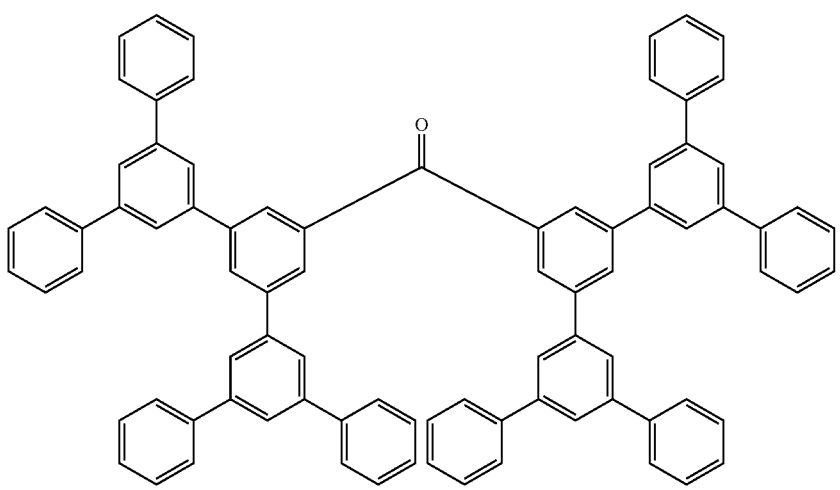
(5)
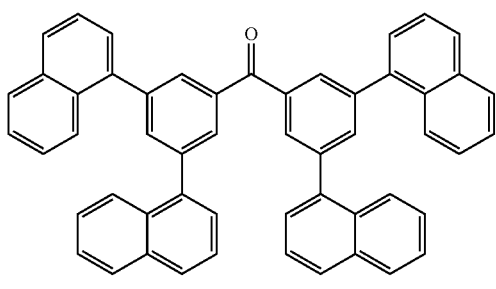
(6)
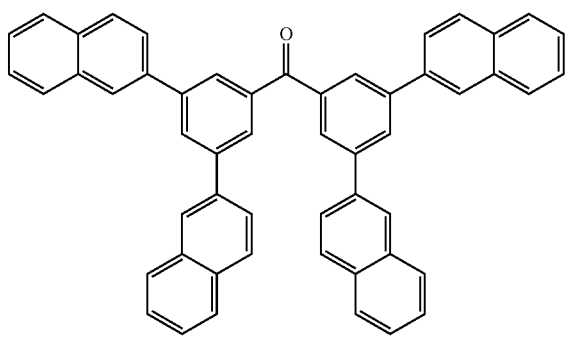
(7)

-continued
(8)
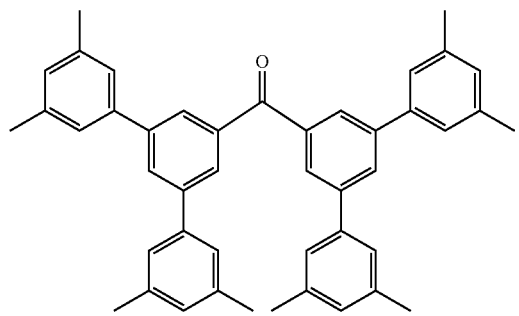
(9)
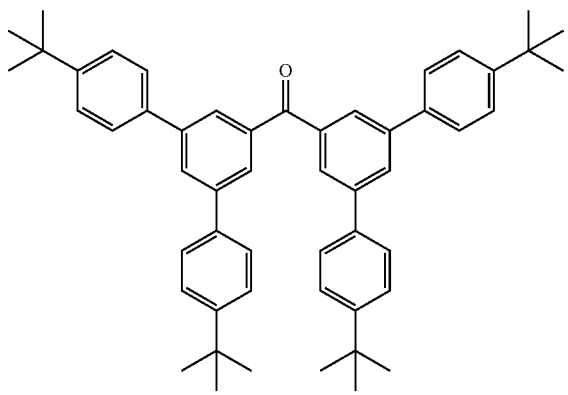
(10)
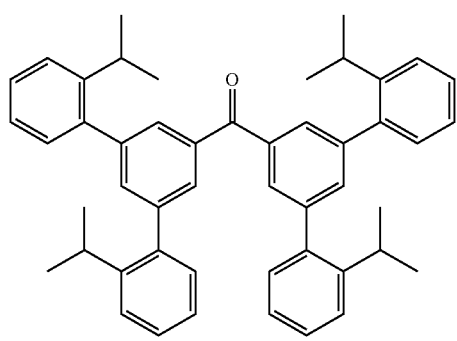
(11)
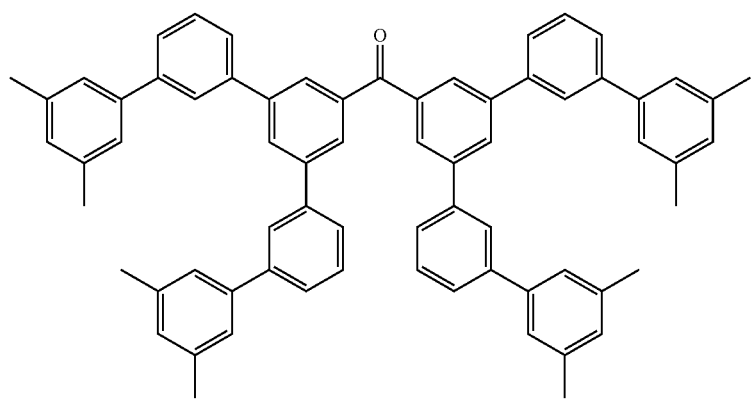
(12)
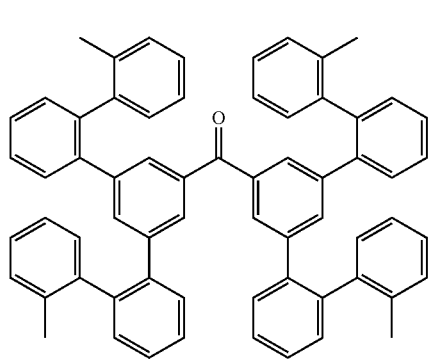
(13)
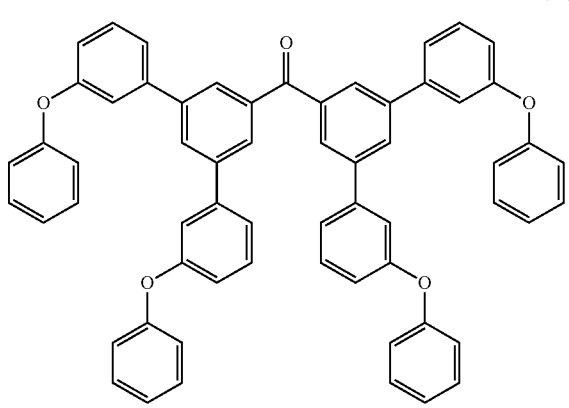

-continued
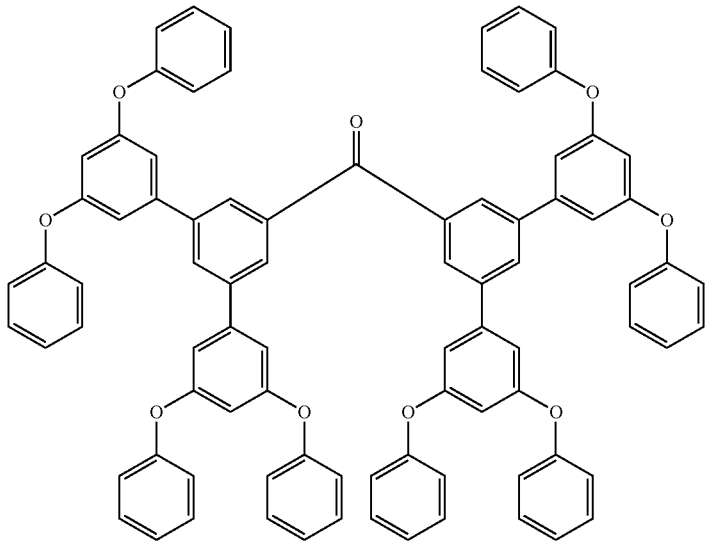
(14)
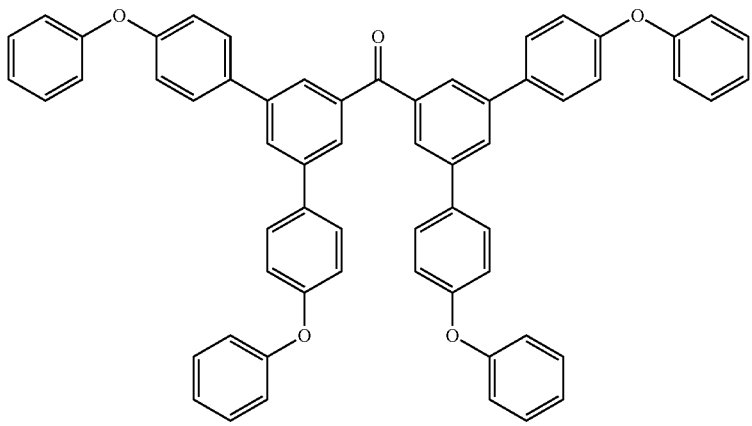
(15)
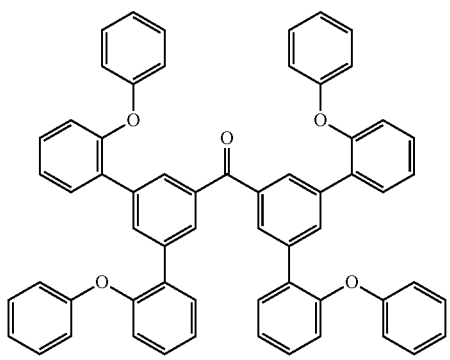
(16)
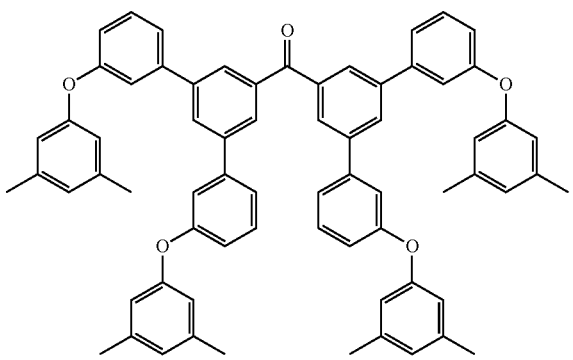
(17)
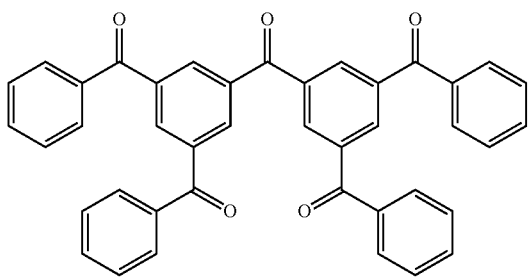
(18)

-continued
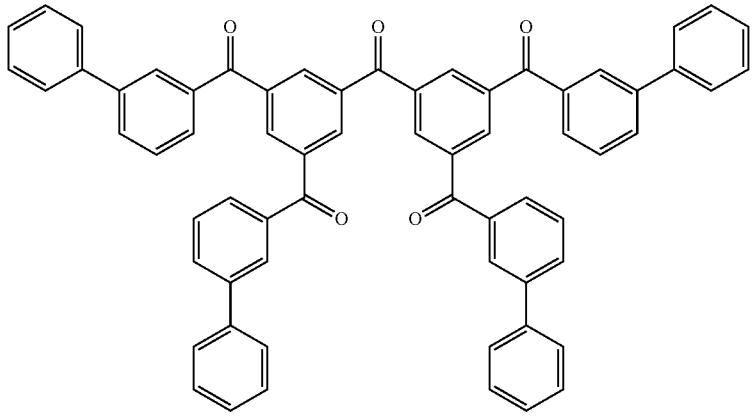
(19)
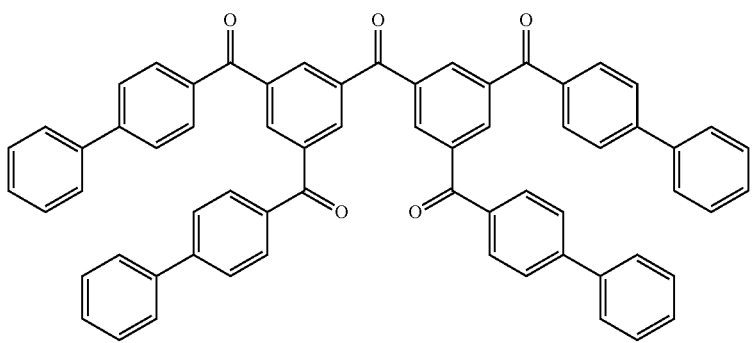
(20)
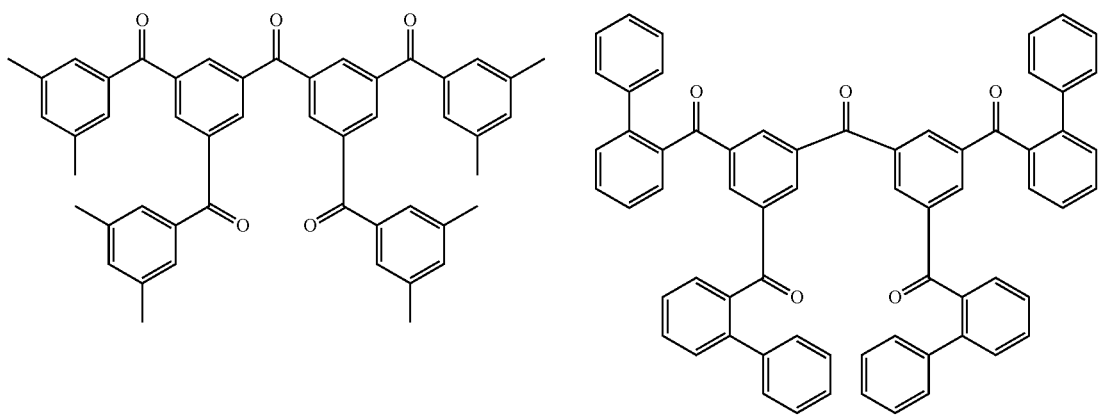
(21)
(22)
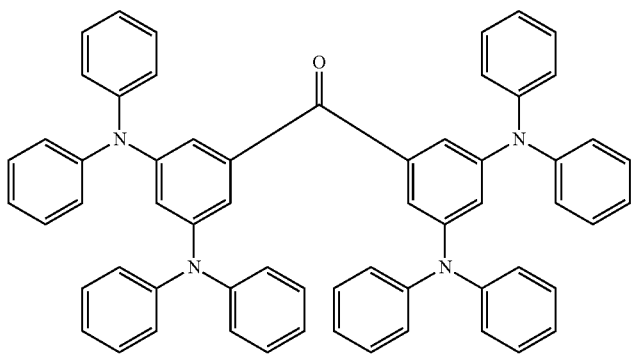
(23)

-continued
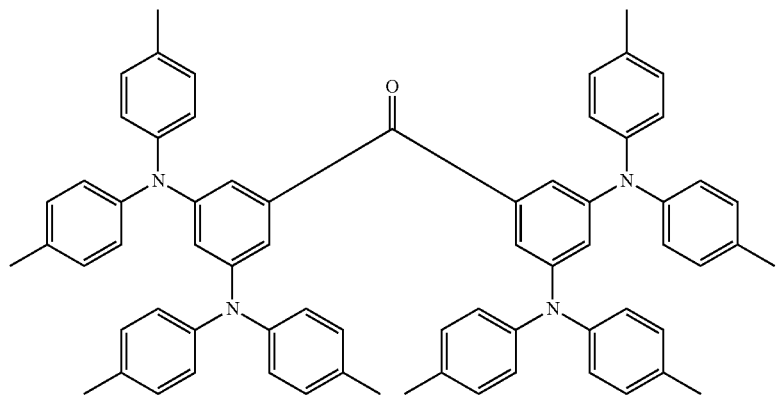
(24)
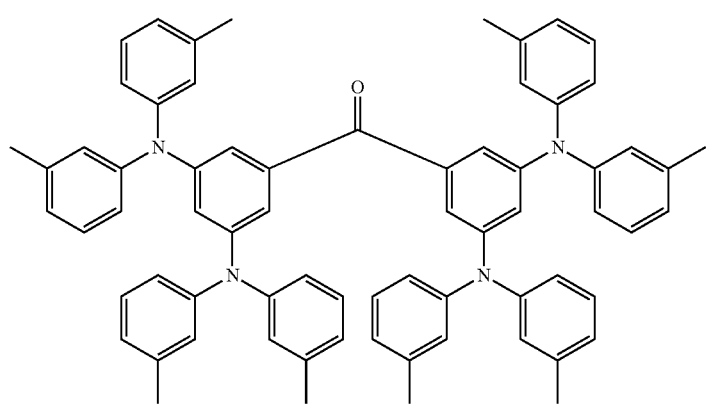
(25)
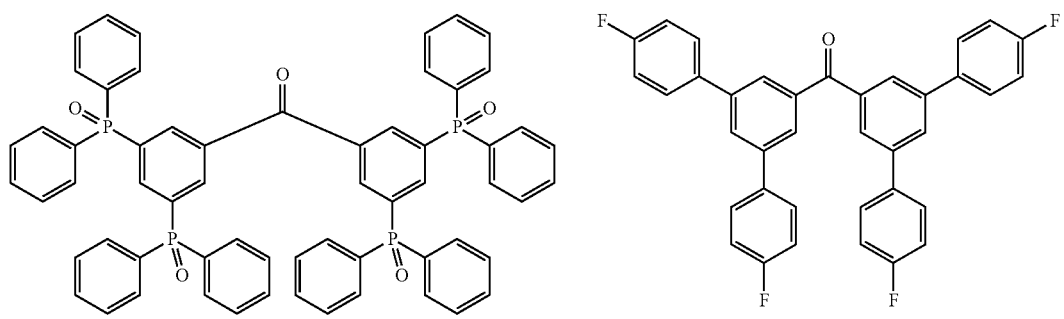
(26) (27)
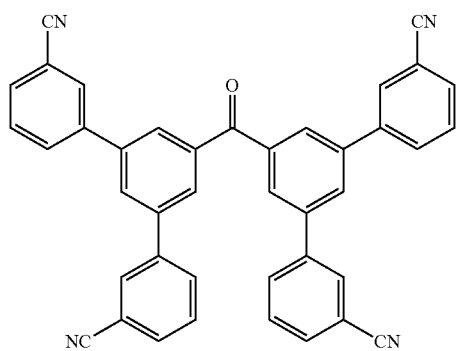
(28)
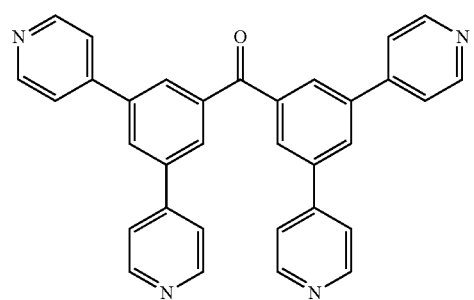
(29)

-continued
(30)
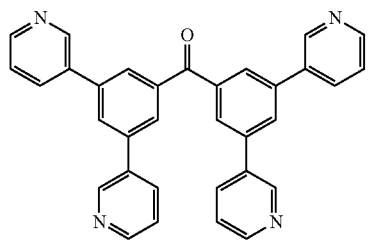
(31)
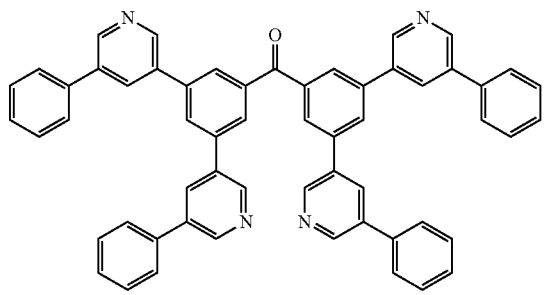
(32)
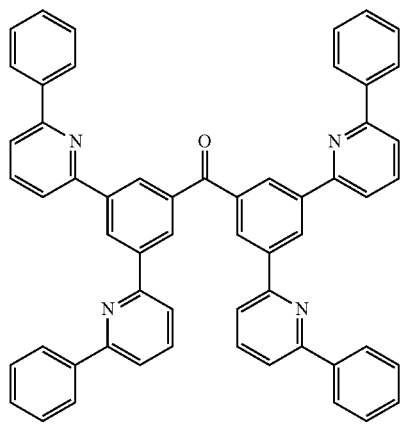
(33)
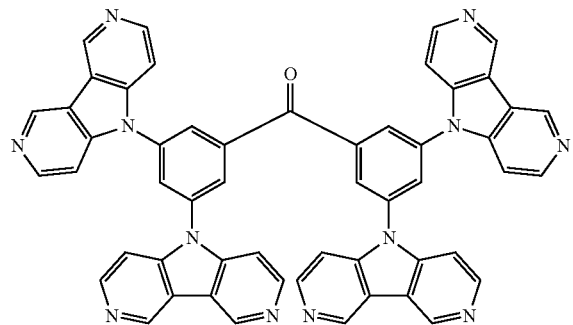
(34)
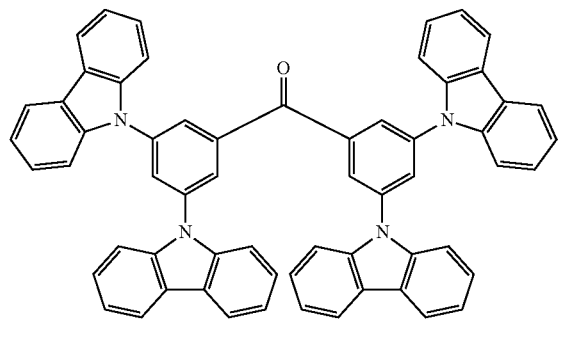
(35)
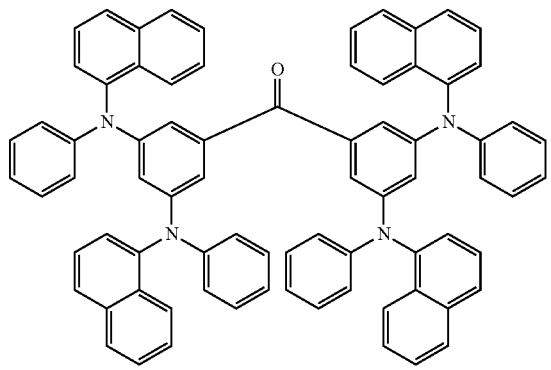
(36)
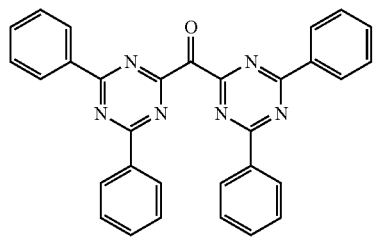
(37)
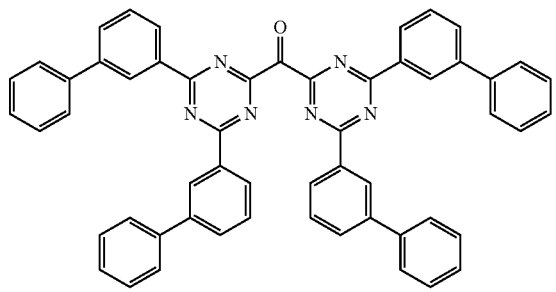

-continued
(38)
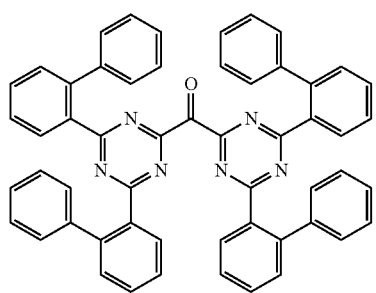
(39)
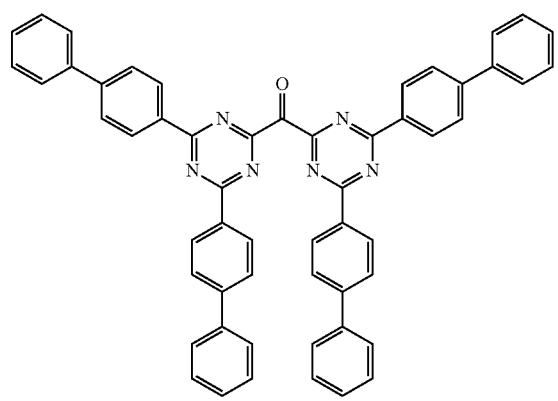
(40)
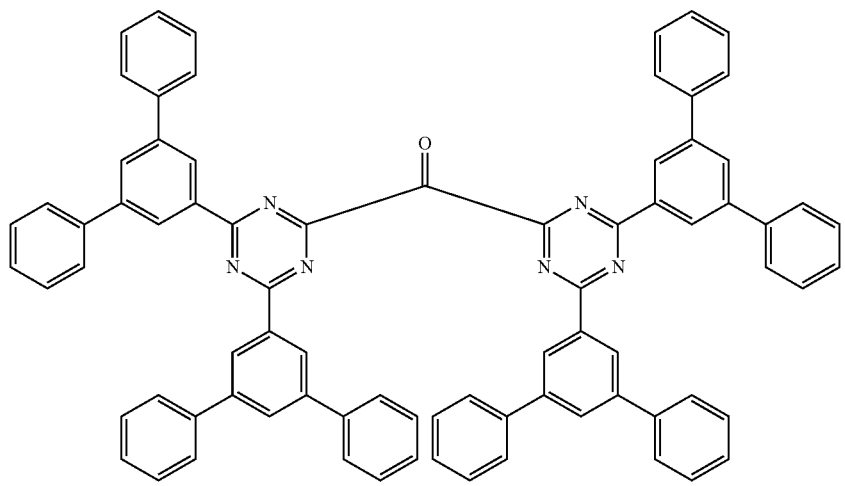
(41)
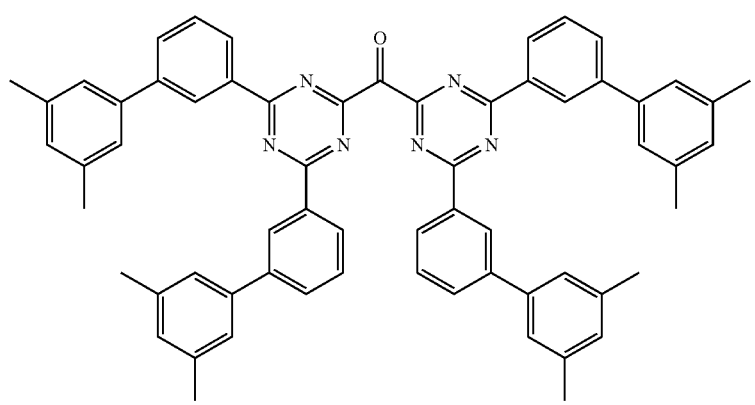
(42)
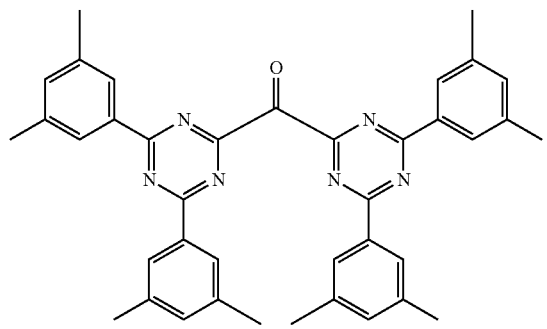
(43)
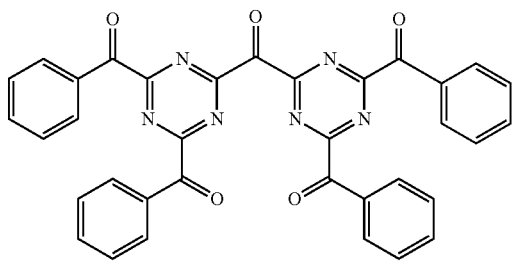

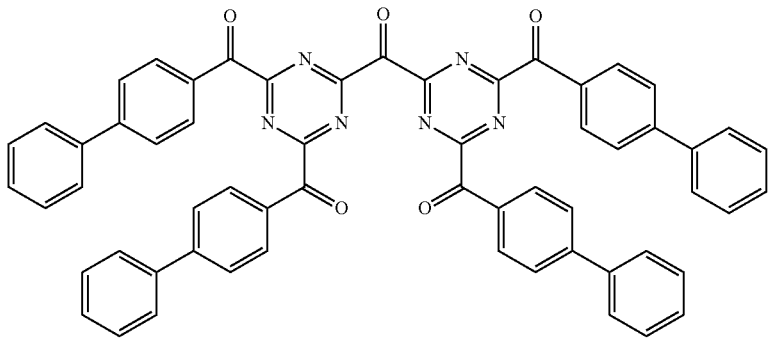
(44)
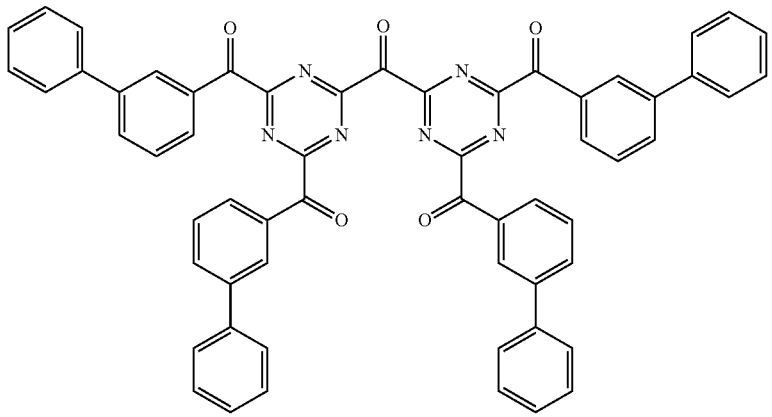
(45)
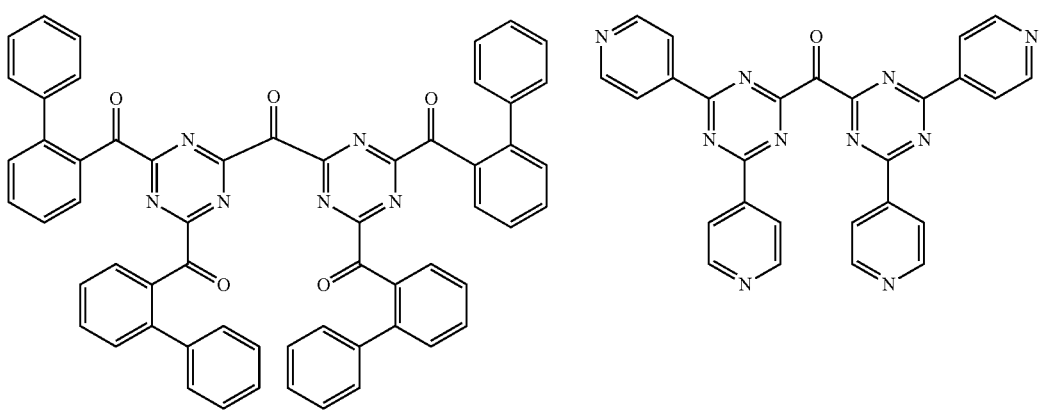
(46)
(47)
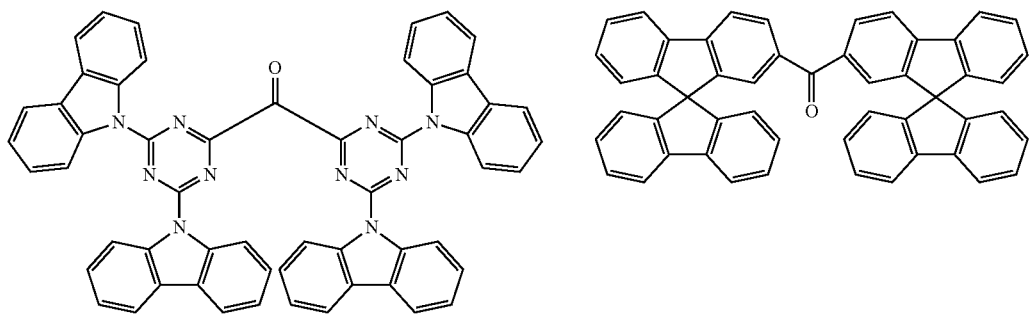
(48)
(49)

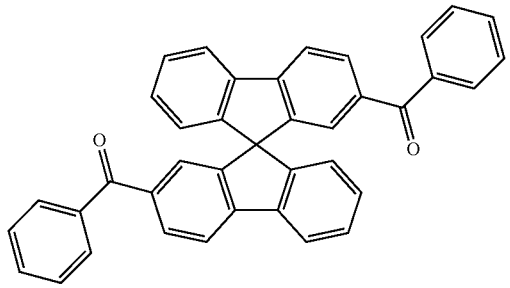
(50)
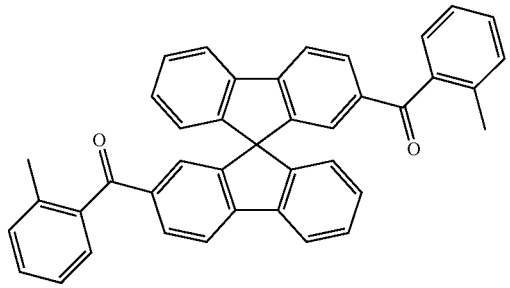
(51)
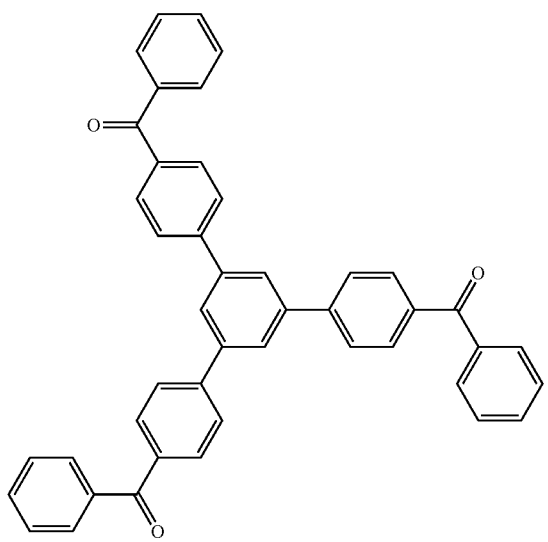
(52)
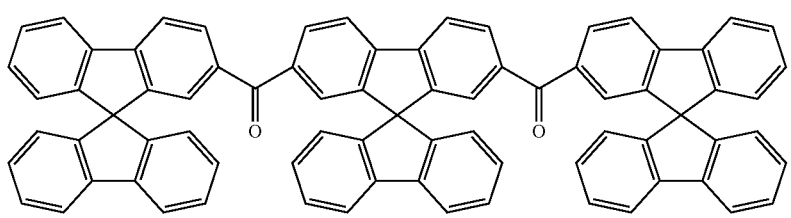
(53)
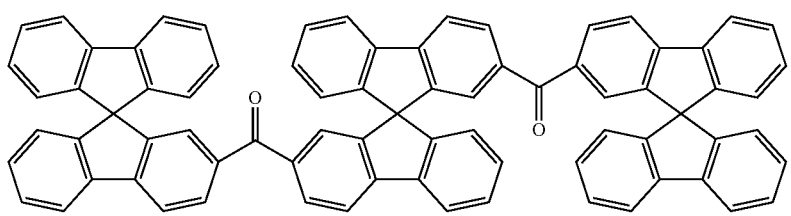
(54)

(55)
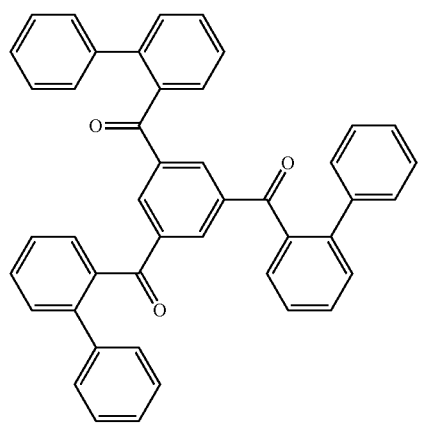
(56)
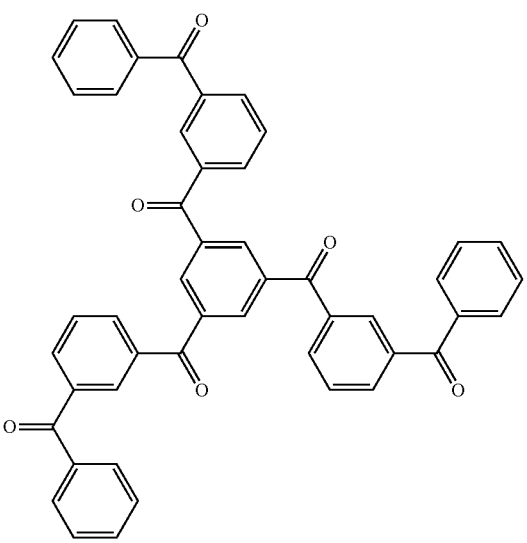
(57)
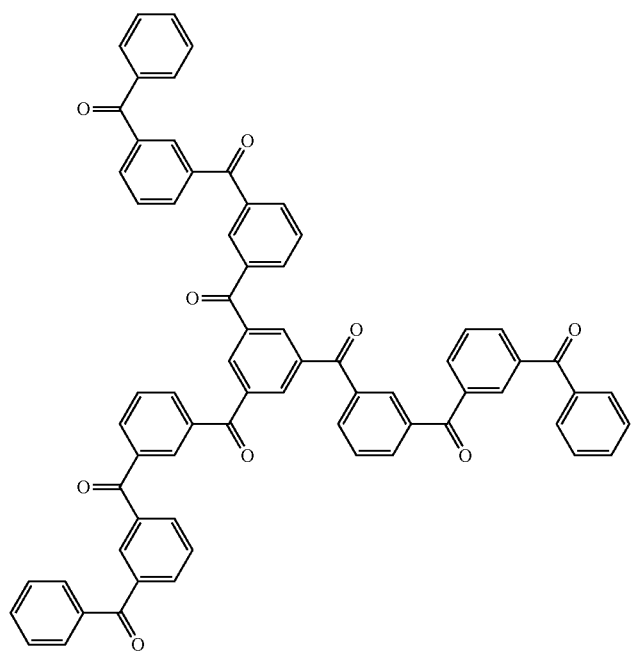
(58)
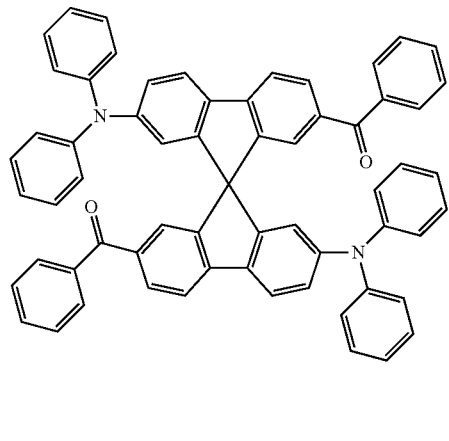
(59)
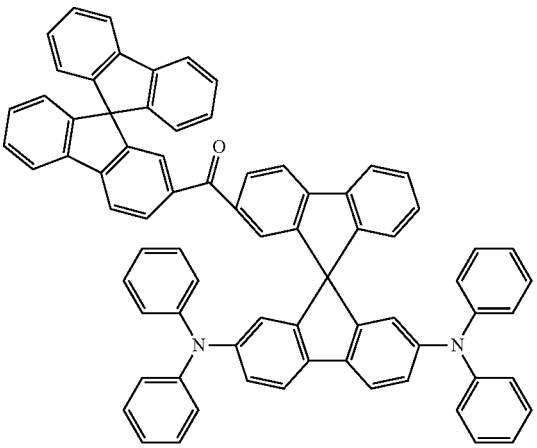

(60)
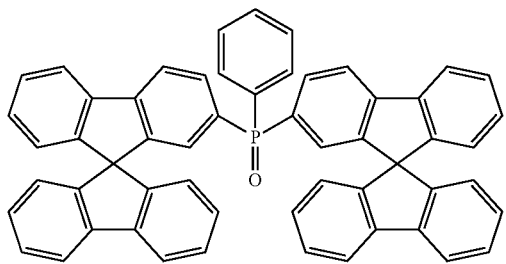
(61)
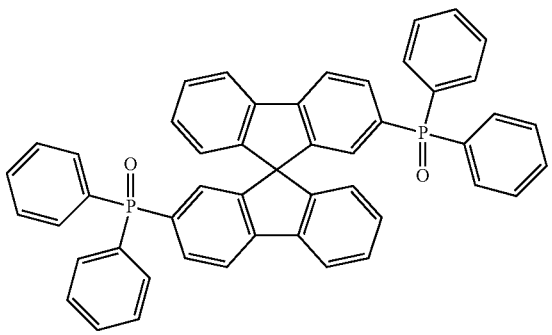
(62)
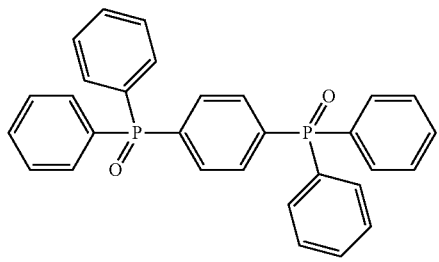
(63)
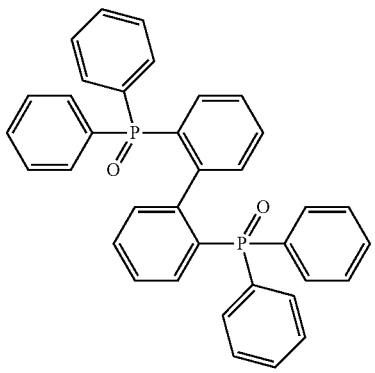
(64)
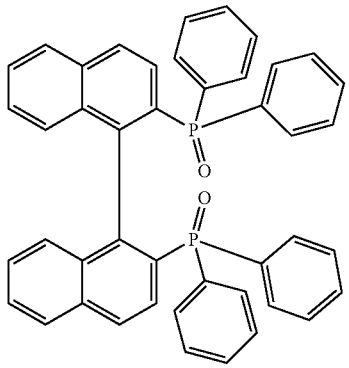
(65)
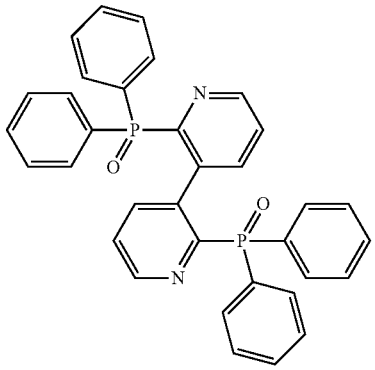
(66)
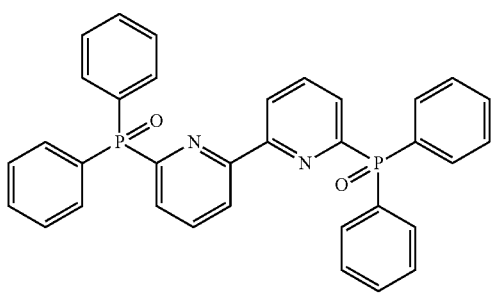
(67)
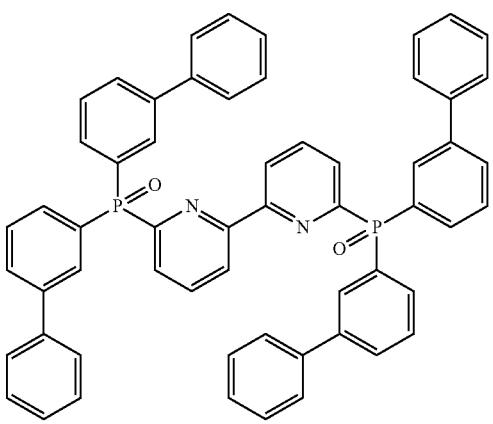

-continued

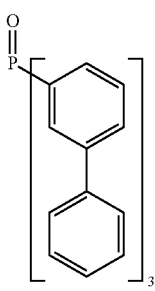 (68)

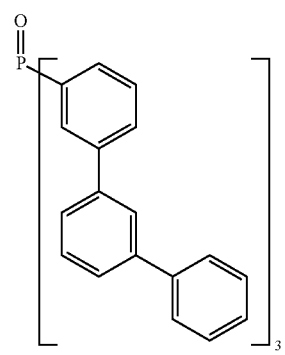 (69)

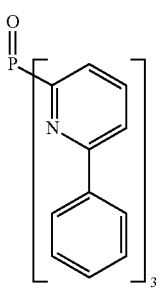 (70)

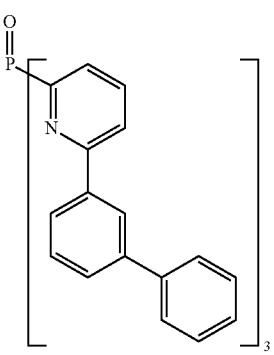 (71)

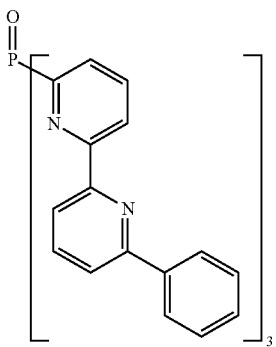 (72)

As described above, ETM2 is a material which does not or does not significantly participate in charge transport in the electron-transport layer.

In a preferred embodiment of the invention, ETM2 is a pure hydrocarbon, i.e. a material which is built up only from the atoms carbon and hydrogen and which contains no atoms other than carbon or hydrogen. In a particularly preferred embodiment of the invention, ETM2 is an aromatic hydrocarbon. This is characterised in that it contains aromatic groups. However, it may additionally also contain non-aromatic carbon atoms, for example alkyl groups.

In a particularly preferred embodiment of the invention, ETM2 is selected from the group consisting of diarylmethane derivatives, fluorene derivatives or spirobifluorene derivatives. Particularly suitable materials which can be used as ETM2 are thus compounds of the following formulae (36), (37) and (38),

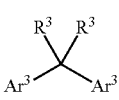 formula (36)

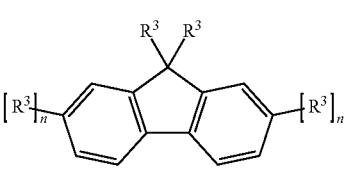 formula (37)

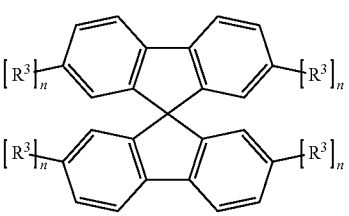 formula (38)

where $R^1$ and n have the meaning given above and the other symbols used have the following meanings:

$Ar^3$ is on each occurrence, identically or differently, an aromatic ring system having 6 to 60 aromatic C atoms which contains no non-aromatic groups other than carbon or hydrogen; $Ar^3$ here may be substituted by one or more radicals $R^4$;

$R^3$ is on each occurrence, identically or differently, a straight-chain alkyl group having 1 to 20 C atoms or a branched or cyclic alkyl group having 3 to 20 C atoms, or an aromatic ring system having 6 to 60 aromatic C atoms which contains no non-aromatic groups other than carbon or hydrogen and which may be substituted by one or more radicals $R^4$; two or more radicals $R^3$ here may also form a ring system with one another;

$R^4$ is on each occurrence, identically or differently, a straight-chain alkyl group having 1 to 20 C atoms or a branched or cyclic alkyl group having 3 to 20 C atoms; two or more radicals $R^4$ here may also form a ring system with one another.

Examples of preferred ETM2 in accordance with the above-mentioned formulae (36) to (38) are compounds (1) to (17) depicted below.

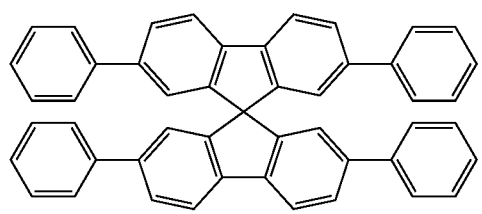
(1)

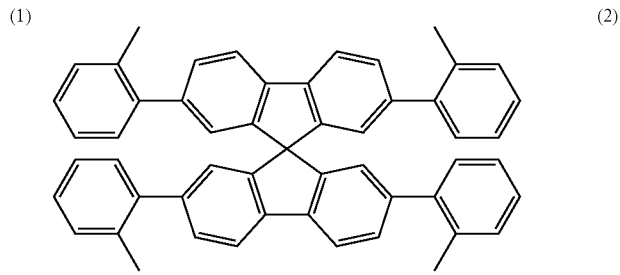
(2)

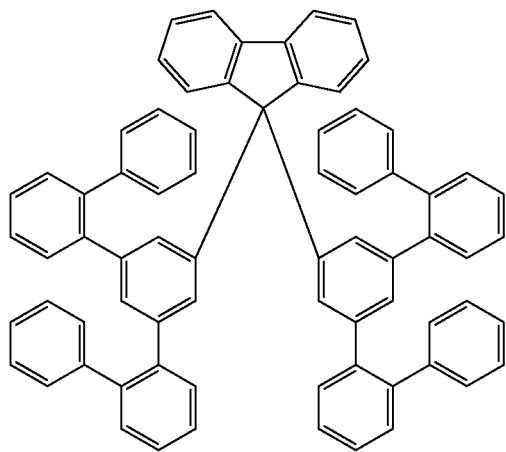
(3)

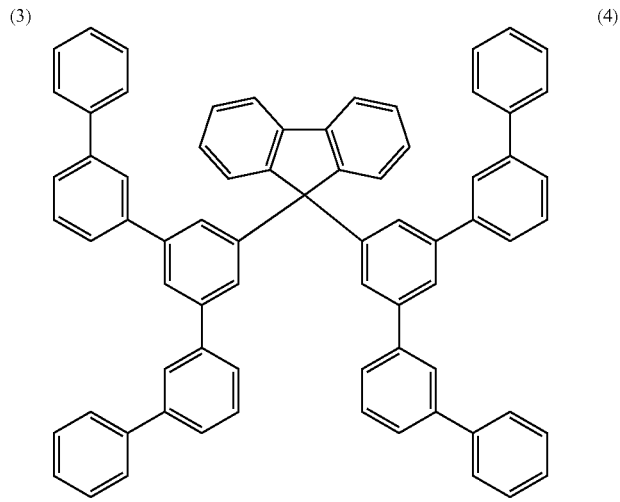
(4)

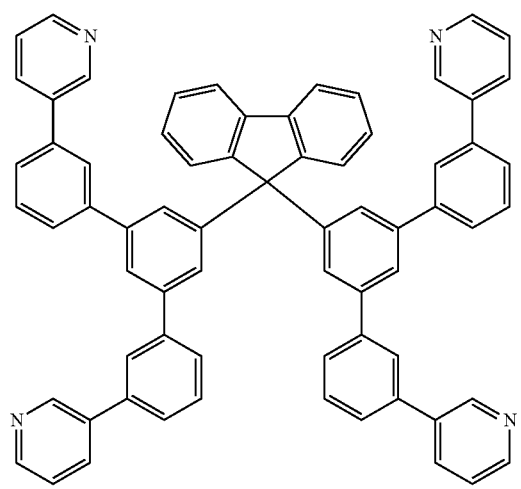
(5)

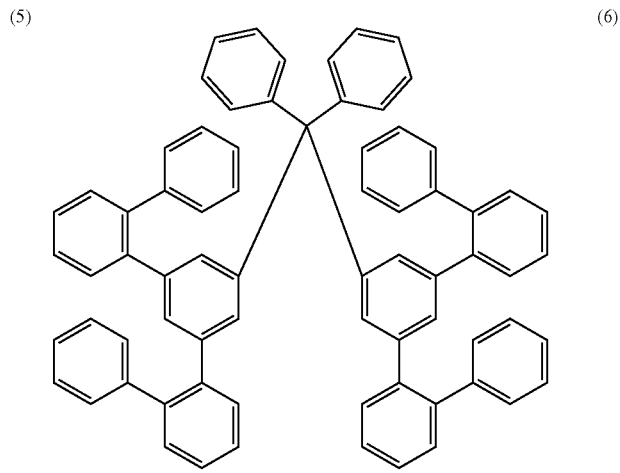
(6)

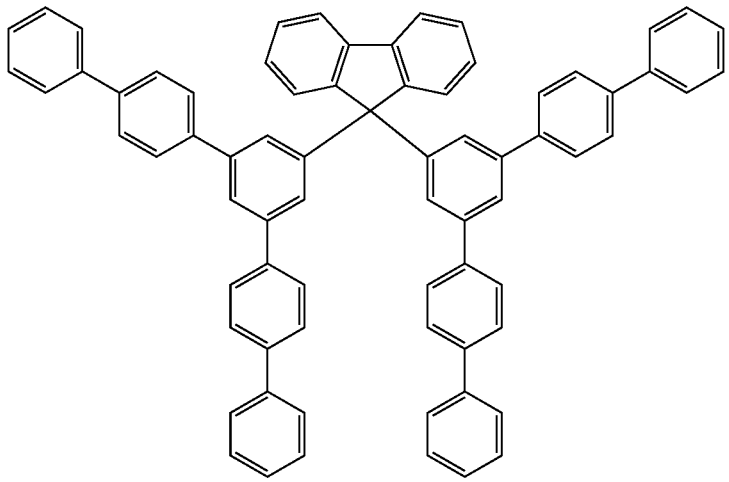
(7)
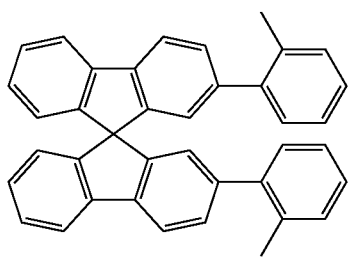
(8)
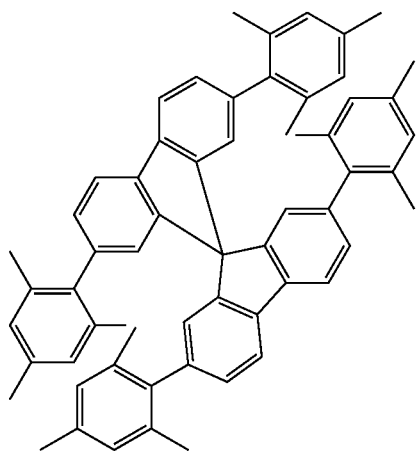
(9)
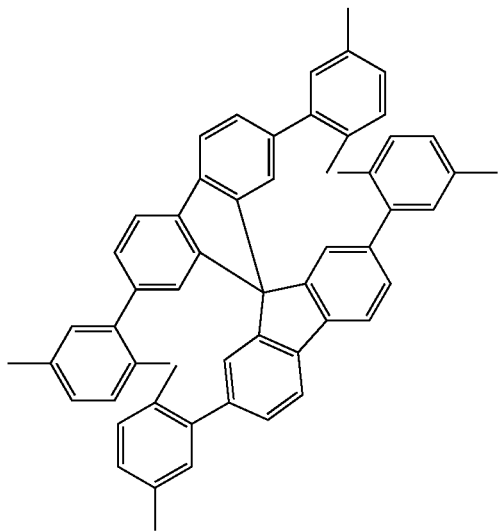
(10)

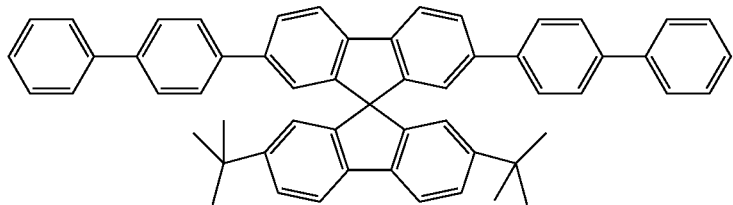
(11)
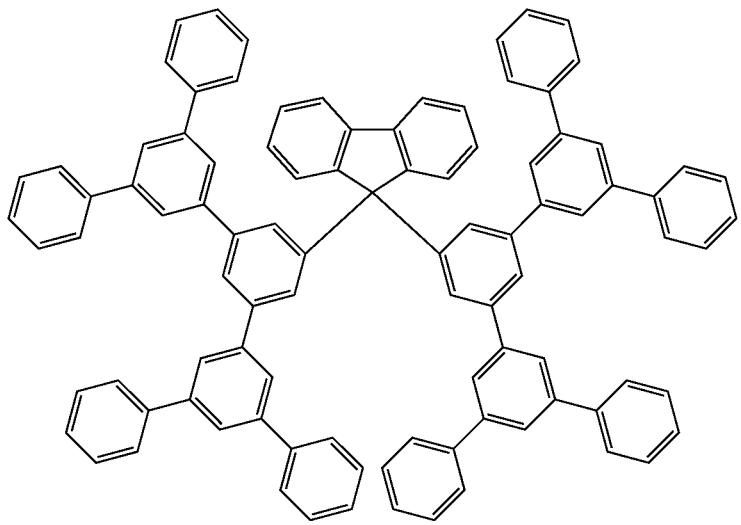
(12)
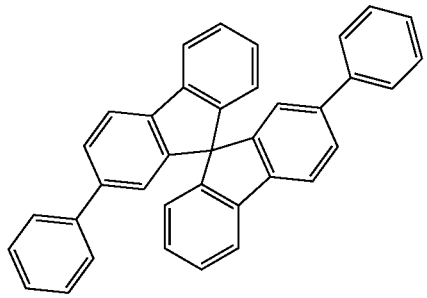
(13)
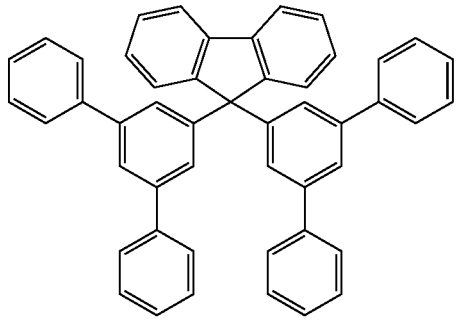
(14)
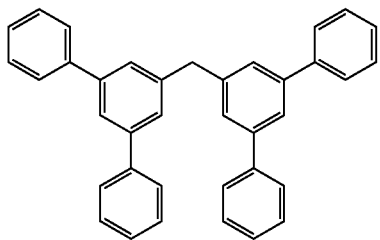
(15)
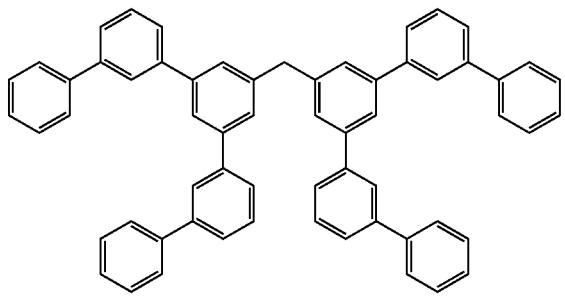
(16)

-continued
(17)
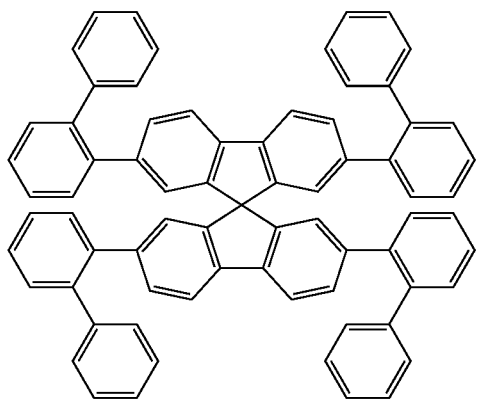
Further preferred materials which can be used as ETM2 are carbazole derivatives. Particularly suitable here are the compounds of the following formula (39) or (40),
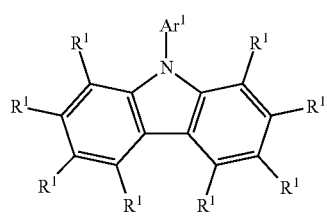
formula (39)
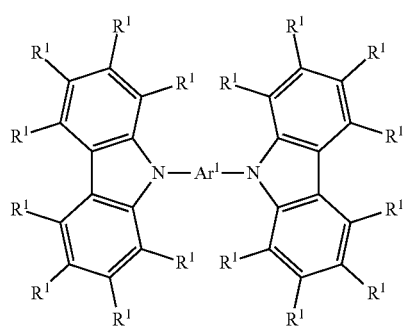
formula (40)
where the symbols used have the meanings given above.
Examples of suitable carbazole derivatives are compounds (1) to (11) depicted in the following table.
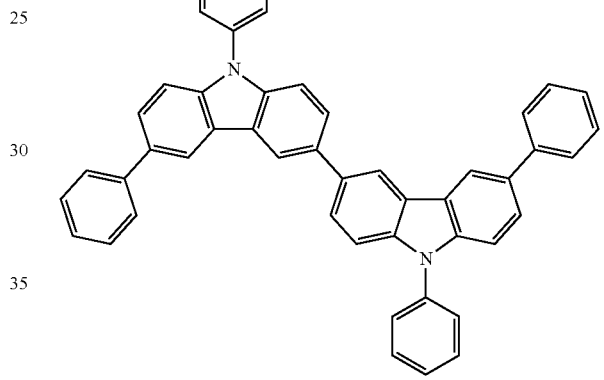
(1)
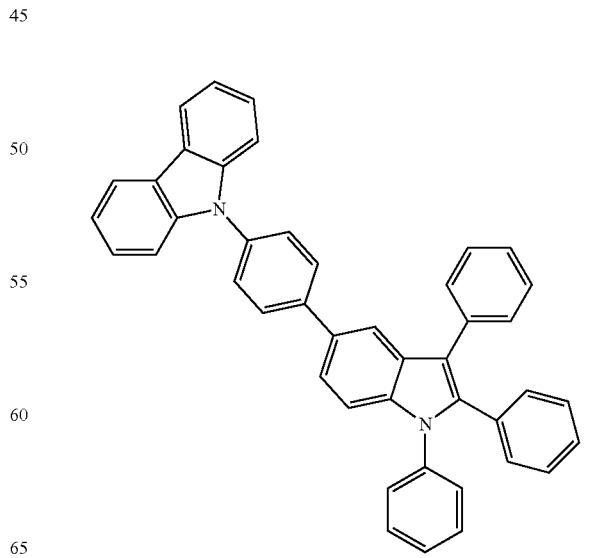
(2)

(3)
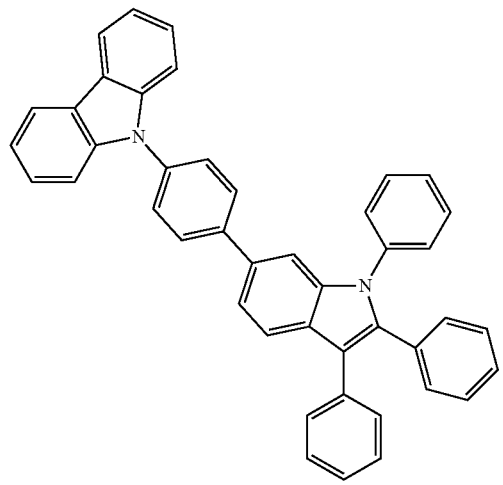
(4)
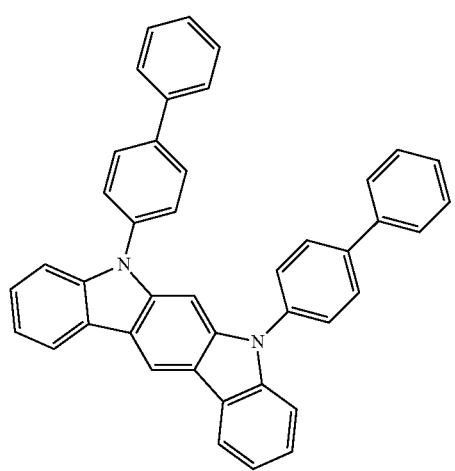
(5)
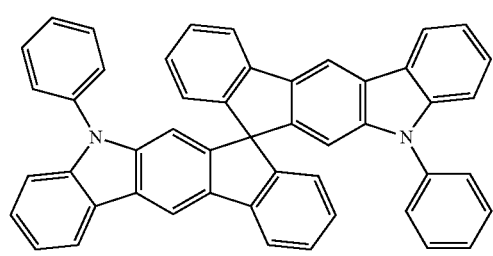
(6)
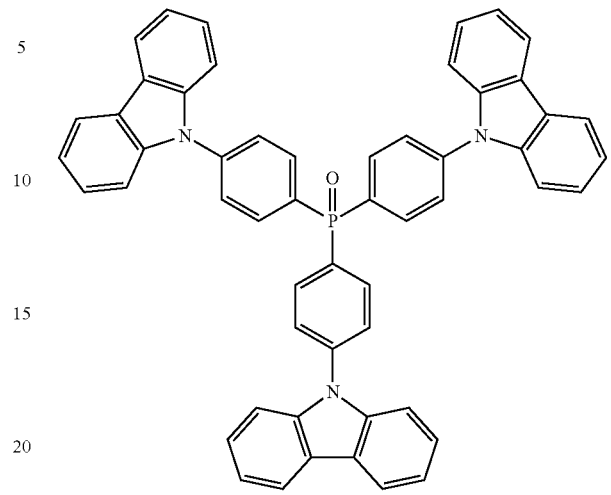
(7)
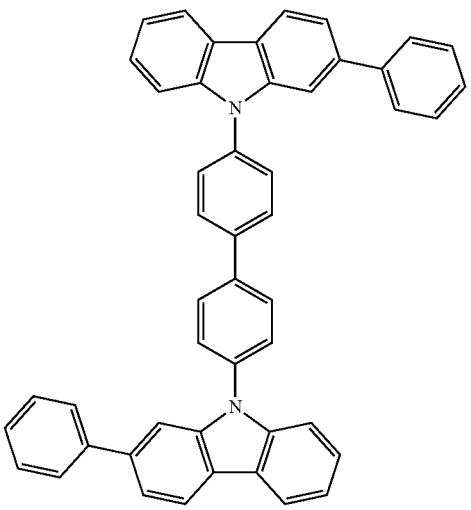
(8)
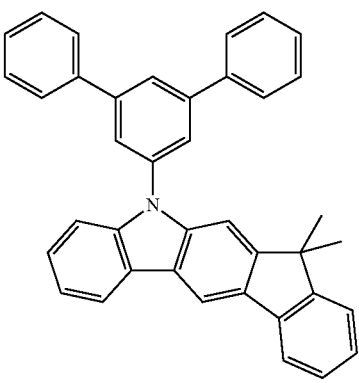

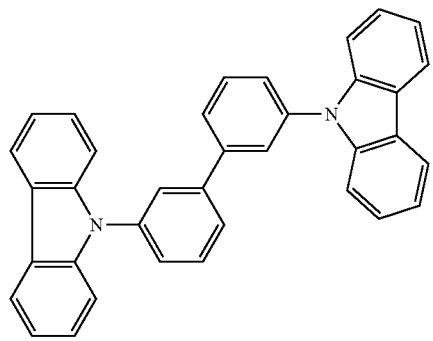

(9)

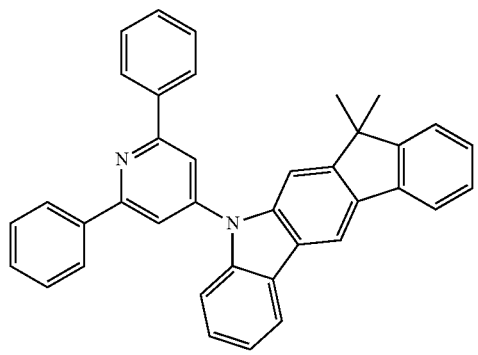

(10)

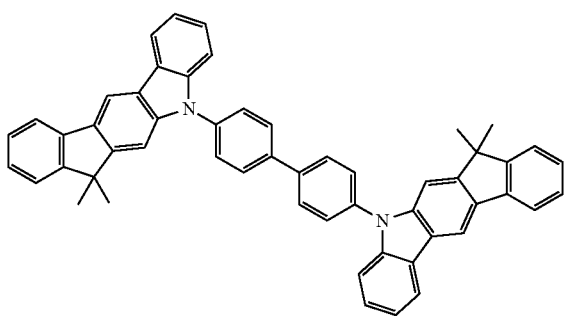

(11)

In a further preferred embodiment of the invention, material ETM2 is a diazasilole derivative or a tetraazasilole derivative, for example in accordance with WO 2010/054729.

Apart from cathode, anode, the emitting layer and the electron-transport layer described above which is directly adjacent to the emitting layer, the organic electroluminescent device may also comprise further layers. These are selected, for example, from in each case one or more hole-injection layers, hole-transport layers, further electron-transport layers, electron-injection layers, electron-blocking layers, exciton-blocking layers, charge-generation layers and/or organic or inorganic p/n junctions. In addition, interlayers may be present, in particular as interlayer between a fluorescent layer and a phosphorescent layer. Furthermore, the layers, in particular the charge-transport layers, may also be doped. Doping of the layers may be advantageous for improved charge transport. However, it should be pointed out that each of the layers mentioned above does not necessarily have to be present, and the choice of layers is always dependent on the compounds used. The use of layers of this type is known to the person skilled in the art, and he will be able to use all materials in accordance with the prior art that are known for such layers for this purpose without inventive step.

It is furthermore possible to use more than one emitting layer, for example two or three emitting layers, which preferably have different emission colours. An embodiment of the invention relates to a white-emitting organic electroluminescent device. This is characterised in that it emits light having CIE colour coordinates in the range from 0.28/0.29 to 0.45/0.41. The general structure of a white-emitting electroluminescent device of this type is disclosed, for example, in WO 2005/011013.

The cathode of the electroluminescent device according to the invention preferably comprises metals having a low work function, metal alloys or multilayered structures comprising different metals, such as, for example, alkaline-earth metals, alkali metals, main-group metals or lanthanoids (for example Ca, Ba, Mg, Al, In, Mg, Yb, Sm, etc.). In the case of multilayered structures, further metals which have a relatively high work function, such as, for example, Ag, may also be used in addition to the said metals, in which case combinations of the metals, such as, for example, Mg/Ag, Ca/Ag or Ba/Ag, are generally used. Preference is likewise given to metal alloys, in particular alloys comprising an alkali metal or alkaline-earth metal and silver, particularly preferably an alloy of Mg and Ag. It may also be preferred to introduce a thin interlayer of a material having a high dielectric constant between a metallic cathode and the organic semiconductor. Suitable for this purpose are, for example, alkali metal or alkaline-earth metal fluorides, but also the corresponding oxides or carbonates (for example LiF, $Li_2O$, $Li_3N$, CsF, RbF, $Cs_2CO_3$, $BaF_2$, MgO, NaF, etc.) or metal complexes (for example lithium hydroxyquinolinate). The layer thickness of this layer is preferably between 0.5 and 5 nm.

In a preferred embodiment of the invention, an electron-injection layer is used between the metallic cathode and the electron-transport layer according to the invention, where the electron-transport layer preferably comprises one of the above-mentioned materials.

The anode of the electroluminescent device according to the invention preferably comprises materials having a high work function. The anode preferably has a work function of greater than 4.5 eV vs. vacuum. Suitable for this purpose are on the one hand metals having a high redox potential, such as, for example, Ag, Pt or Au. On the other hand, metal/metal oxide electrodes (for example $Al/Ni/NiO_x$, $Al/PtO_x$) may also be preferred. At least one of the electrodes here must be transparent or partially transparent in order to facilitate the coupling-out of light. Preferred anode materials for transparent or partially transparent anodes are conductive mixed metal oxides. Particular preference is given to indium tin oxide (ITO) or indium zinc oxide (IZO). Preference is furthermore given to conductive, doped organic materials, in particular conductive doped polymers.

The device is correspondingly (depending on the application) structured, provided with contacts and finally hermetically sealed, since the lifetime of devices of this type is drastically shortened in the presence of water and/or air.

In general, all further materials as are employed in accordance with the prior art in organic electroluminescent devices can be employed in combination with the electron-transport layer according to the invention.

The emitting layer here may be phosphorescent or fluorescent. It is also possible for both a fluorescent emitter layer and also a phosphorescent emitter layer to be present.

In a preferred embodiment of the invention, the emitting layer is a fluorescent layer, in particular a blue- or green-fluorescent layer.

Preferred dopants which can be employed in the fluorescent emitter layer are selected from the class of the monostyrylamines, the distyrylamines, the tristyrylamines, the tetrastyrylamines and the arylamines. A monostyrylamine is taken to mean a compound which contains one substituted or unsubstituted styryl group and at least one, preferably aromatic, amine. A distyrylamine is taken to mean a compound which contains two substituted or unsubstituted styryl groups and at least one, preferably aromatic, amine. A tristyrylamine is taken to mean a compound which contains three substituted or unsubstituted styryl groups and at least one, preferably aromatic, amine. A tetrastyrylamine is taken to mean a compound which contains four substituted or unsubstituted styryl groups and at least one, preferably aromatic, amine. The styryl groups are particularly preferably stilbenes, which may also be further substituted. An arylamine or aromatic amine in the sense of this invention is taken to mean a compound which contains three substituted or unsubstituted aromatic or heteroaromatic ring systems bonded directly to the nitrogen. At least one of these aromatic or heteroaromatic ring systems is preferably a condensed ring system, particularly preferably having at least 14 aromatic ring atoms. Preferred examples thereof are aromatic anthracenamines, aromatic anthracenediamines, aromatic pyrenamines, aromatic pyrenediamines, aromatic chrysenamines or aromatic chrysenediamines. An aromatic anthracenamine is taken to mean a compound in which a diarylamino group is bonded directly to an anthracene group, preferably in the 2- or 9-position. An aromatic anthracenediamine is taken to mean a compound in which two diarylamino groups are bonded directly to an anthracene group, preferably in the 2,6- or 9,10-position. Aromatic pyrenamines, pyrenediamines, chrysenamines and chrysenediamines are defined analogously thereto, where the diarylamino groups on the pyrene are preferably bonded in the 1-position or in the 1,6-position. Further preferred fluorescent dopants are selected from indenofluorenamines or indenofluorenediamines, for example in accordance with WO 2006/122630, benzoindenofluorenamines or benzoindenofluorenediamines, for example in accordance with WO 2008/006449, and dibenzoindenofluorenamines or dibenzoindenofluorenediamines, for example in accordance with WO 2007/140847. Examples of dopants from the class of the styrylamines are substituted or unsubstituted tristilbenamines or the dopants described in WO 2006/000388, WO 2006/058737, WO 2006/000389, WO 2007/065549 and WO 2007/115610. Fluorescent dopants which are furthermore preferred are condensed aromatic hydrocarbons, such as, for example, the compounds disclosed in WO 2010/012328. These preferably contain no arylamino groups. Particularly preferred fluorescent dopants are the above-mentioned aromatic hydrocarbons in accordance with WO 2010/012328 which contain no arylamino groups, and aromatic amines which contain at least one condensed aromatic group having at least 14 aromatic ring atoms, and condensed aromatic hydrocarbons.

Suitable host materials (matrix materials) for the fluorescent dopants, in particular for the above-mentioned dopants, are selected, for example, from the classes of the oligoarylenes (for example 2,2',7,7-tetraphenylspirobifluorene in accordance with EP 676461 or dinaphthylanthracene), in particular the oligoarylenes containing condensed aromatic groups, the polypodal metal complexes (for example in accordance with WO 2004/081017), the electron-conducting compounds, in particular ketones, phosphine oxides, sulfoxides, etc. (for example in accordance with WO 2005/084081 and WO 2005/084082), the atropisomers (for example in accordance with WO 2006/048268), the boronic acid derivatives (for example in accordance with WO 2006/117052), the benzanthracene derivatives (for example benz[a]anthracene derivatives in accordance with WO 2008/145239 or in accordance with the unpublished application DE 102009034625.2) and the benzophenanthrene derivatives (for example benzo[c]phenanthrene derivatives in accordance with WO 2010/083869). Particularly preferred host materials are selected from the classes of the oligoarylenes, containing naphthalene, anthracene, benzanthracene, in particular benz[a]anthracene, benzophenanthrene, in particular benzo[c]-phenanthrene, and/or pyrene. An oligoarylene in the sense of this invention is intended to be taken to mean a compound in which at least three aryl or arylene groups are bonded to one another.

Particularly preferred host materials for fluorescent emitters are compounds of the following formula (41), $$\text{Ar}^4\text{-Ant-Ar}^4 \quad \text{formula (41)}$$

where $R^1$ has the meaning given above and the following applies to the other symbols used:

Ant stands for an anthracene group which is substituted by the groups $Ar^4$ in the 9- and 10-position and which may furthermore be substituted by one or more substituents $R^1$;

$Ar^4$ is, identically or differently on each occurrence, an aromatic or heteroaromatic ring system having 5 to 60 aromatic ring atoms, which may be substituted by one or more radicals $R^1$.

In a preferred embodiment of the invention, at least one of the groups $Ar^4$ contains a condensed aryl group having 10 or more aromatic ring atoms, where $Ar^4$ may be substituted by one or more radicals $R^1$. Preferred groups $Ar^4$ are selected, identically or differently on each occurrence, from the group consisting of phenyl, 1-naphthyl, 2-naphthyl, anthracenyl, ortho-, meta- or para-biphenyl, phenylene-1-naphthyl, phenylene-2-naphthyl, phenanthrenyl, benz[a]anthracenyl, benz[c]phenanthrenyl or combinations of two or three of these groups, each of which may be substituted by one or more radicals $R^1$.

In a further preferred embodiment of the invention, the emitting layer comprises a phosphorescent emitter.

Phosphorescence in the sense of this invention is taken to mean the luminescence from an excited state having spin multiplicity >1, in particular from an excited triplet state. For the purposes of this invention, all luminescent transition-metal complexes containing transition metals from the second and third transition-metal series, in particular all luminescent iridium, platinum and copper compounds, are regarded as phosphorescent compounds.

In a preferred embodiment of the invention, the phosphorescent compound is a red-phosphorescent compound or a green-phosphorescent compound.

Suitable as phosphorescent compound are, in particular, compounds which emit light, preferably in the visible region, on suitable excitation and in addition contain at least one atom having an atomic number greater than 20, preferably greater than 38 and less than 84, particularly preferably greater than 56 and less than 80. The phosphorescence emitters used are preferably compounds which contain copper, molybdenum, tungsten, rhenium, ruthenium, osmium, rhodium, iridium, palladium, platinum, silver, gold or europium, in particular compounds which contain iridium, platinum or copper. In general, all phosphorescent complexes as are used in accordance with the prior art for phosphorescent OLEDs and as are known to the person skilled in the art in the area of organic electroluminescence are suitable, and the person skilled in the art will be able to use further phosphorescent compounds without inventive step. In particular, the person skilled in the art knows what phosphorescent complexes emit with what emission colour.

Suitable matrix materials for the compounds according to the invention are ketones, phosphine oxides, sulfoxides and sulfones, for example in accordance with WO 2004/013080, WO 2004/093207, WO 2006/005627 or WO 2010/006680, triarylamines, carbazole derivatives, for example CBP (N,N-biscarbazolylbiphenyl), m-CBP or the carbazole derivatives disclosed in WO 2005/039246, US 2005/0069729, JP 2004/288381, EP 1205527, WO 2008/086851 or US 2009/0134784, indolocarbazole derivatives, for example in accordance with WO 2007/063754 or WO 2008/056746, indenocarbazole derivatives, for example in accordance with WO 2010/136109 or WO 2011/000455, azacarbazoles, for example in accordance with EP 1617710, EP 1617711, EP 1731584, JP 2005/347160, bipolar matrix materials, for example in accordance with WO 2007/137725, silanes, for example in accordance with WO 2005/111172, azaboroles or boronic esters, for example in accordance with WO 2006/117052, diazasilole derivatives, for example in accordance with WO 2010/054729, diazaphosphole derivatives, for example in accordance with WO 2010/054730, triazine derivatives, for example in accordance with WO 2010/015306, WO 2007/063754 or WO 2008/056746, zinc complexes, for example in accordance with EP 652273 or WO 2009/062578, dibenzofuran derivatives, for example in accordance with WO 2009/148015, or bridged carbazole derivatives, for example in accordance with US 2009/0136779, WO 2010/050778, WO 2011/042107, WO 2011/060867 or DE 102010005697.9.

It may also be preferred to employ a plurality of different matrix materials as a mixture, in particular at least one electron-conducting matrix material and at least one hole-conducting matrix material. A preferred combination is, for example, the use of an aromatic ketone or a triazine derivative with a triarylamine derivative or a carbazole derivative as mixed matrix. Preference is likewise given to the use of a mixture of a charge-transporting matrix material and an electrically inert matrix material which is not involved or not significantly involved in charge transport, as described, for example, in WO 2010/108579.

Especially on use of a mixture of two or more matrix materials, in particular a mixture of a rather hole-conducting matrix material and a rather electron-conducting matrix material, the use of the electron-transport layer according to the invention enables particularly clear improvements to be achieved in the properties of the OLED. The use of a mixture of two or more matrix materials, in particular a hole-conducting matrix material and an electron-conducting matrix material, in combination with the electron-transport layer according to the invention is therefore a preferred embodiment of the invention.

Suitable charge-transport materials, as can be used in the hole-injection or hole-transport layer or in the electron-transport layer of the organic electroluminescent device according to the invention, are, for example, the compounds disclosed in Y. Shirota et al., Chem. Rev. 2007, 107(4), 953-1010, or other materials as employed in accordance with the prior art in these layers.

Examples of preferred hole-transport materials which can be used in a hole-transport or hole-injection layer in the electroluminescent device according to the invention are indenofluorenamines and derivatives (for example in accordance with WO 2006/122630 or WO 2006/100896), the amine derivatives disclosed in EP 1661888, hexaazatriphenylene derivatives (for example in accordance with WO 2001/049806), amine derivatives containing condensed aromatic ring systems (for example in accordance with U.S. Pat. No. 5,061,569), the amine derivatives disclosed in WO 95/09147, monobenzoindenofluorenamines (for example in accordance with WO 2008/006449), dibenzoindenofluorenamines (for example in accordance with WO 2007/140847). Hole-transport and hole-injection materials which are furthermore suitable are derivatives of the compounds depicted above, as disclosed in JP 2001/226331, EP 676461, EP 650955, WO 2001/049806, U.S. Pat. No. 4,780,536, WO 98/30071, EP 891121, EP 1661888, JP 2006/253445, EP 650955, WO 2006/073054 and U.S. Pat. No. 5,061,569.

The organic electroluminescent device according to the invention can be produced by various processes. The present invention therefore furthermore relates to a process for the production of an organic electroluminescent device, as explained below.

Preference is furthermore given to an organic electroluminescent device, characterised in that one or more layers are coated by means of a sublimation process, in which the materials are vapour-deposited in vacuum sublimation units at an initial pressure of less than $10^{-5}$ mbar, preferably less than $10^{-6}$ mbar. However, it should be noted that the initial pressure may also be even lower, for example less than $10^{-7}$ mbar.

Preference is likewise given to an organic electroluminescent device, characterised in that one or more layers are coated by means of the OVPD (organic vapour phase deposition) process or with the aid of carrier-gas sublimation, in which the materials are applied at a pressure between $10^{-5}$ mbar and 1 bar. A special case of this process is the OVJP (organic vapour jet printing) process, in which the materials are applied directly through a nozzle and thus structured (for example M. S. Arnold et al., Appl. Phys. Lett. 2008, 92, 053301).

Preference is furthermore given to an organic electroluminescent device, characterised in that one or more layers are produced from solution, such as, for example, by spin coating, or by means of any desired printing process, such as, for example, screen printing, flexographic printing, offset printing, LITI (light induced thermal imaging, thermal transfer printing), inkjet printing or nozzle printing. Soluble compounds are necessary for this purpose. High solubility can be achieved through suitable substitution of the compounds. It is possible here not only for solutions of individual materials to be applied, but also solutions which comprise a plurality of compounds, for example matrix materials and dopants.

The organic electroluminescent device can also be produced as a hybrid system by applying one or more layers from solution and applying one or more further layers by vapour deposition. Thus, for example, it is possible to apply the emitting layer from solution and to apply the electron-transport layer according to the invention thereto by vacuum vapour deposition.

These processes are generally known to the person skilled in the art and can be applied by him without inventive step to the organic electroluminescent devices according to the invention.

The organic electroluminescent device can be used for various applications, in particular for display applications or as light source, for example for lighting applications or for medical applications.

The organic electroluminescent devices according to the invention have the following surprising advantages over the prior art:

1. The organic electroluminescent device according to the invention has high efficiency. The efficiency here is better than on use of an electron-transport layer which comprises only one of materials ETM1 or ETM2.
2. The organic electroluminescent device according to the invention simultaneously has an improved lifetime. The lifetime here is longer than on use of an electron-transport layer which comprises only one of materials ETM1 or ETM2.
3. It is not necessary to use a hole-blocking layer as is otherwise usually used in combination with phosphorescent emitter layers. The electroluminescent device according to the invention thus has a simpler structure, which represents a clear advantage. This advantage is evident, in particular, on use of a mixed-host system in the emitting layer, as is frequently used in accordance with the prior art, particularly in the case of phosphorescent emission layers.
4. Appropriate mixing ratios of ETM1 and ETM2 enable electron injection and electron transport to be set in such a way that the component is optimised either with respect to the lifetime, the voltage or the efficiency, depending on the desired application.
5. Appropriate mixing ratios of ETM1 and ETM2 enable electron injection and electron transport to be set in such a way that, depending on the device architecture (for example top emission or bottom emission) and depending on the emission colour of the device, they may simultaneously also result in a charge balance which is optimum for the component on use of the requisite optical layer thickness of the electron-transport layer.
6. Substances which are harmful to health, in particular hydroxyquinoline-metal complexes, can be avoided.

The invention is described in greater detail by the following examples without wishing to restrict it thereby. The person skilled in the art will be able to produce further organic electroluminescent devices according to the invention without being inventive.

EXAMPLES

Determination of the HOMO/LUMO Positions and the Triplet Level of the Materials (General Method)

The HOMO and LUMO positions and the triplet level of the materials are determined via quantum-chemical calculations. To this end, the "Gaussian-03W" software package (Gaussian Inc.) is used. In order to calculate organic substances without metals (denoted by method "org." in Table 4), firstly a geometry optimisation is carried out using the "Ground State/Semiempirical/Default Spin/AM1/Charge 0/Spin Singlet" method. This is followed by an energy calculation on the basis of the optimised geometry. The "TD-SFC/DFT/Default Spin/B3PW91" method with the "6-31G(d)" base set is used here (Charge 0, Spin Singlet). For organometallic compounds (denoted by "organom." method in Table 4), the geometry is optimised via the "Ground State/Hartree-Fock/Default Spin/LanL2 MB/Charge 0/Spin Singlet" method. The energy calculation is carried out analogously to the organic substances as described above, with the difference that the "LanL2DZ" base set is used for the metal atom and the "6-31 G(d)" base set is used for the ligands. The energy calculation gives the HOMO HEh or LUMO LEh in hartree units. The HOMO and LUMO values calibrated with reference to cyclic voltammetry measurements are determined therefrom in electron volts as follows:

$$HOMO(eV) = ((HEh*27.212) - 0.9899)/1.1206$$

$$LUMO(eV) = ((LEh*27.212) - 2.0041)/1.385$$

For the purposes of this application, these values are to be regarded as HOMO and LUMO respectively of the materials. As an example, an HOMO of −0.19767 hartrees and an LUMO of −0.04783 hartrees are obtained from the calculation for substance ETM2-2, which corresponds to a calibrated HOMO of −5.68346 eV and a calibrated LUMO of −2.38675 eV.

The triplet level $T_1$ is defined as the energy of the triplet state having the lowest energy, which arises from the quantum-chemical calculation.

Table 6 shows the HOMO and LUMO values and the triplet levels $T_1$ of the various materials.

Production of OLEDs (General Method)

OLEDs according to the invention and OLEDs in accordance with the prior art are produced by a general process in accordance with WO 2004/058911, which is adapted to the circumstances described here (layer-thickness variation, materials).

The data for various OLEDs are shown in the following examples. Glass substrates coated with structured ITO (indium tin oxide) in a thickness of 50 nm are cleaned intensively with an alkaline detergent and subsequently rinsed 3× with deionised water. After these substrates have been dried and heated, they are pre-treated with an oxygen plasma for 5 minutes and then immediately coated with OLED materials in a vacuum chamber. The OLEDs have in principle the following layer structure: substrate/hole-injection layer (HIL)/hole-transport layers (HTL)/emission layer (EML)/electron-transport layers (ETL)/optional electron-injection layer (EIL) and finally a cathode. The cathode is formed by an aluminium layer with a thickness of 100 nm. The precise structure of the OLEDs is shown in Table 1. The materials required for the production of the OLEDs are shown in Table 5.

All materials are applied by thermal vapour deposition in a vacuum chamber. The emission layer here always consists of at least one matrix material (host material) and an emitting dopant (emitter), which is admixed with the matrix material or matrix materials in a certain proportion by volume by coevaporation. An expression such as M1(95%):D1(5%) means that material M1 is present in the layer in a proportion by volume of 95% and D1 is present in the layer in a proportion of 5%. It is a subject-matter of the invention that correspondingly a mixture of a least two materials, such as, for example, ETM1-1(50%):ETM2-2 (50%), is also present in the electro-transport layer.

The OLEDs are characterised by standard methods. For this purpose, the electroluminescence spectra, the current efficiency (measured in cd/A) as a function of the luminous density, calculated from current/voltage/luminous density characteristic lines (IUL characteristic lines), and the lifetime are determined. The electroluminescence spectra are measured at a luminous density of 1000 cd/m², from which the CIE 1931 x and y colour coordinates arise. The expression U1000 in Table 2 denotes the voltage required for a luminous density of 1000 cd/m². CE1000 denotes the current efficiency achieved at 1000 cd/m². The lifetime LT defines the time after which the luminous density has dropped from the initial luminous density L0 to a certain proportion L1 on operation with constant current. A specification of L0=6000 cd/m² and L1=50% in Table 2 means that the lifetime indicated in column LT corresponds to the time after which the initial luminous density of the corresponding OLED has dropped from 6000 cd/m² to 3000 cd/m². The values for the lifetime can be converted into a figure for other initial luminous densities with the aid of conversion formulae known to the person skilled in the art.

The lifetime for an initial luminous density of 1000 cd/m² is a value usually quoted in this case.

The data for the various OLEDs are summarised in Tables 2 and 4. Examples A1-A15 and A16-A19 are comparative examples in accordance with the prior art, Examples B1-B9 and B10 to B20 show data of OLEDs comprising materials or material combinations according to the invention.

Some of the examples are explained in greater detail below in order to illustrate the advantages of the mixtures according to the invention. However, it should be pointed out that this only represents a selection of the data shown in Tables 2 and 4. As can be seen from the table, significant improvements compared with the prior art are also achieved on use of the electron-transport layers according to the invention that are not described in greater detail, in some cases in all parameters, in some cases only an improvement in efficiency or voltage or lifetime is observed. However, even the improvement of one of the said parameters represents a significant advance, since different applications require optimisation with respect to different parameters.

OLEDs Having Electron-Transport Layers According to the Invention Comprising ETM1 and ETM2

OLEDs A1-A4 are comparative examples which do not comprise any ETM2 materials, but instead only one ETM material (ETM1-1) in the electron-transport layer adjacent to the emitter layer. ETM2-1, which is often used as admixed material in accordance with the prior art, is employed here as EIL in a separate layer. It can be seen from Table 2 that, due to pure layer-thickness optimisation of ETM2-1, which is used as a single layer, no further optimisation of the component is possible. The voltages, efficiencies and lifetimes of the components are all very similar. However, the lifetime drops significantly from a layer thickness of 4 nm of ETM2-1.

OLEDs A5-A8 are comparative examples which comprises a mixture of ETM1 and ETM2 (ETM1-1 and ETM2-1), which do not correspond to the invention, in accordance with the prior art, in the electron-transport layer adjacent to the emitter layer. ETM2-1 is additionally employed in a separate electron-injection layer. It can be seen from Table 2 that a mixture of ETM1-1 and ETM2-1 already enables an optimisation of the component with respect to voltage (reductions of about −1V) and efficiency (increases of up to 60%) compared with Examples A1-A4.

OLEDs A9-A12 are comparative examples which comprises a mixture of ETM1, which corresponds to the present invention with respect to the triplet level, and ETM2, which does not correspond to the present invention with respect to the triplet level, (ETM1-2 and ETM2-1), in the electron-transport layer adjacent to the emitter layer. Although the said examples are blue devices (fluorescent emitters), these examples are also relevant with respect to the triplet level of the ETL, since the same ETL is employed in a display for fluorescent and phosphorescent pixels. ETM2-1 is additionally employed here in a separate EIL. It can be seen from Table 2 that a mixture of ETM1-2 and ETM2-1 enables a further optimisation of the component with respect to voltage (reductions of up to −2V), efficiency (increases of up to 100%) and lifetime (extension of up to 70%) compared with Examples A1-A4.

OLEDs B1-B4 are examples according to the invention which comprises a mixture of ETM1 and ETM2 according to the invention (ETM1-2 and ETM2-2), which correspond to the present invention, in the electron-transport layer adjacent to the emitter layer. ETM2-1 is employed here in a separate electron-injection layer. It can be seen from Table 2 that a corresponding mixture of ETM1-2 and ETM2-2 enables a further optimisation of the component with respect to efficiency (increases of about 5%) and lifetime (extensions of up to 45%) compared with Examples A9-A12. In addition, compatibility with phosphorescent layers is achieved here.

OLEDs A13-A15 are green comparative examples which comprise a mixture of two ETMs which are not according to the invention or of one ETM according to the invention and one ETM which is not according to the invention (ETM1-1:ETM2-1, ETM1-1:ETM2-3 or ETM1-3:ETM2-1) in the electron-transport layer adjacent to the emitter layer. In each case one of the components does not meet the requirements of the triplet level in this case. Whereas, for example, the combination ETM1-1:ETM2-1 from Comparative Examples A5 to A8 has still functioned relatively well in singlet blue, the efficiency in triplet green (A13) is low. By contrast, Examples B5-B9 according to the invention comprise only electron-transport materials in the ETM layer (ETM1-3:ETM2-3) which satisfy all conditions according to the invention. In B5, ETM2-1, which is suspected of being mutagenic, is employed in a separate electron-injection layer. Other electron-injection materials which are less harmful to health, such as caesium fluoride, lithium nitride, rubidium fluoride or lithium fluoride, and which, apart from in the case of lithium fluoride, do not result in a significant change in the device performance compared with B5, are therefore employed in Examples B6-B9. It can be seen from Table 2 that a mixture of ETM1-3 and ETM2-3 enables a further optimisation of the component with respect to voltage (reductions of up to −0.2 V), efficiency (increases of up to 20%) and lifetime (extensions of greater than 10%) compared with Examples A13-A15.

OLEDs A16-A19 in Table 3 are comparative examples which comprise a mixture which does not satisfy the conditions according to the invention in the electron-transport layer adjacent to the emitter layer. By contrast, B10 to B20 are examples according to the invention. The evaluation data are summarised in Table 4. In B11, ETM2-1, which is suspected of being mutagenic, has been replaced by the electron-injection material caesium fluoride, which is less harmful to health, which does not result in a significant change in the device performance compared with B10. Replacement of ETM2-1 is thus possible without a loss of performance, which is a major advantage in the end product (recycling, environmental and health assessment), but also in relation to production safety. Examples B10 to B20 according to the invention from Table 4 show that a mixture according to the invention of electron-transport materials enables an optimisation of the component with respect to voltage (reductions of up to −0.2 V), efficiency (increases of greater than 30%) and lifetime (extensions of greater than 18%) compared with the components which comprise no electron-transport materials or not only electron-transport materials according to the invention. The improvement is particularly pronounced with these phosphorescent components which have a mixed matrix of two matrix materials in the emitting layer, since the emission zone here is shifted to the ETL side to a particularly great extent and the effects of a small T1 level in the ETL thus have a particularly great effect. Table 5 shows all chemical structures used in the examples.

Table 1 shows the structure of OLEDs A1 to A15 and B1 to B9. 50 nm of ITO are always located before the 1st layer, and 100 nm of aluminium are always applied by vapour deposition to the final ETM layer; the individual layers are separated from one another in the table by "/", the layer thicknesses in brackets are quoted in the unit nm For Examples A1 to A12 and B1 to B4, the following layer structure is used: HIM1(5)/HIM2(140)/HTM1(20)/M1 (95%):D1(5%)(30)/ETMX/ETMY For Examples A13 to A15 and B5 to B9, the following layer structure is used: HIM4(80)/HIM1(5)/HIM4(125)/HTM2(20)/M2(85%):D3(15%)(30)/ETMX/ETMY)

TABLE 1

| Ex. No. | ETMX | ETMY |
|---|---|---|
| A1 | ETM1-1(20) | ETM2-1(1) |
| A2 | ETM1-1(20) | ETM2-1(2) |
| A3 | ETM1-1(20) | ETM2-1(3) |
| A4 | ETM1-1(20) | ETM2-1(4) |
| A5 | ETM1-1(65%):ETM2-1(35%)(20) | ETM2-1(1.5) |
| A6 | ETM1-1(50%):ETM2-1(50%)(20) | ETM2-1(1.5) |
| A7 | ETM1-1(35%):ETM2-1(65%)(20) | ETM2-1(1.5) |
| A8 | ETM1-1(20%):ETM2-1(80%)(20) | ETM2-1(1.5) |
| A9 | ETM1-2(65%):ETM2-1(35%)(20) | ETM2-1(1.5) |
| A10 | ETM1-2(50%):ETM2-1(50%)(20) | ETM2-1(1.5) |
| A11 | ETM1-2(35%):ETM2-1(65%)(20) | ETM2-1(1.5) |
| A12 | ETM1-2(20%):ETM2-1(80%)(20) | ETM2-1(1.5) |
| B1 | ETM1-2(65%):ETM2-2(35%)(20) | ETM2-1(1.5) |
| B2 | ETM1-2(50%):ETM2-2(50%)(20) | ETM2-1(1.5) |
| B3 | ETM1-2(35%):ETM2-2(65%)(20) | ETM2-1(1.5) |
| B4 | ETM1-2(20%):ETM2-2(80%)(20) | ETM2-1(1.5) |
| A13 | ETM1-1(50%):ETM2-1(50%)(35) | ETM2-1(2) |
| A14 | ETM1-1(50%):ETM2-3(50%)(35) | ETM2-1(2) |
| A15 | ETM1-3(50%):ETM2-1(50%)(35) | ETM2-1(2) |
| B5 | ETM1-3(50%):ETM2-3(50%)(35) | ETM2-1(2) |
| B6 | ETM1-3(50%):ETM2-3(50%)(35) | CsF(2) |
| B7 | ETM1-3(50%):ETM2-3(50%)(35) | Li$_3$N(0.5) |
| B8 | ETM1-3(50%):ETM2-3(50%)(35) | RbF(2) |
| B9 | ETM1-3(50%):ETM2-3(50%)(35) | LiF(1.5) |

TABLE 2

Data for the OLEDs

| Ex. No.: | CE1000 (cd/A) | U1000 (V) | CIE x at 1000 cd/m2 | CIE y at 1000 cd/m2 | LT (h) | L0 (cd/m²) |
|---|---|---|---|---|---|---|
| A1 | 4.05 | 6.10 | 0.140 | 0.154 | 272 | 6000 |
| A2 | 4.31 | 5.86 | 0.140 | 0.156 | 238 | 6000 |
| A3 | 4.33 | 5.82 | 0.140 | 0.156 | 258 | 6000 |
| A4 | 4.39 | 6.20 | 0.141 | 0.152 | 110 | 6000 |
| A5 | 5.04 | 5.47 | 0.142 | 0.162 | 270 | 6000 |
| A6 | 6.13 | 4.99 | 0.142 | 0.159 | 212 | 6000 |
| A7 | 7.04 | 4.76 | 0.142 | 0.158 | 214 | 6000 |
| A8 | 6.49 | 5.25 | 0.142 | 0.159 | 274 | 6000 |
| A9 | 6.68 | 4.05 | 0.142 | 0.159 | 320 | 6000 |
| A10 | 8.12 | 4.13 | 0.141 | 0.159 | 332 | 6000 |
| A11 | 8.24 | 4.02 | 0.142 | 0.161 | 362 | 6000 |
| A12 | 7.36 | 4.68 | 0.142 | 0.159 | 445 | 6000 |
| B1 | 6.97 | 4.15 | 0.142 | 0.155 | 380 | 6000 |
| B2 | 8.50 | 4.06 | 0.142 | 0.154 | 385 | 6000 |
| B3 | 8.64 | 4.11 | 0.142 | 0.156 | 465 | 6000 |
| B4 | 7.45 | 4.27 | 0.142 | 0.156 | 645 | 6000 |
| A13 | 48.01 | 4.00 | 0.356 | 0.605 | 932 | 8000 |
| A14 | 55.82 | 4.19 | 0.349 | 0.608 | 1012 | 8000 |
| A15 | 57.19 | 4.02 | 0.351 | 0.609 | 1053 | 8000 |
| B5 | 68.18 | 3.83 | 0.355 | 0.606 | 1185 | 8000 |
| B6 | 68.30 | 3.81 | 0.354 | 0.607 | 1180 | 8000 |
| B7 | 67.95 | 3.88 | 0.353 | 0.608 | 1175 | 8000 |
| B8 | 67.92 | 3.85 | 0.354 | 0.606 | 1163 | 8000 |
| B9 | 67.86 | 4.57 | 0.356 | 0.605 | 1110 | 8000 |

Table 3 shows the structure of OLEDs A16 to A19 and B10 to B20. 50 nm of ITO are always located before the 1st layer, and 100 nm of aluminium are always applied by vapour deposition to the final ETM layer; the individual layers are separated from one another in the table by "/", the layer thicknesses in brackets are quoted in the unit nm. The OLEDs shown herein have the following layer structure:

HIM2(40)/HIM1(10)/HIM2(170)/HIM1(10)/HTM3(20)/M3(32%):M4(63%)D3(5%)(40)/ETMX/ETMY

TABLE 3

| Ex. No. | ETMX | ETMY |
|---|---|---|
| A16 | ETM1-1(50%):ETM2-1(50%)(30) | ETM2-1(1) |
| A17 | ETM1-3(50%):ETM2-1(50%)(30) | ETM2-1(1) |
| B10 | ETM1-3(50%):ETM2-3(50%)(30) | ETM2-1(1) |
| B11 | ETM1-3(50%):ETM2-3(50%)(30) | CsF(1) |
| A18 | ETM1-2(50%):ETM2-1(50%)(30) | ETM2-1(1) |
| B12 | ETM1-2(50%):ETM2-3(50%)(30) | ETM2-1(1) |
| A19 | ETM1-1(50%):ETM2-3(50%)(30) | ETM2-1(1) |
| B13 | ETM1-4(50%):ETM2-3(50%)(30) | ETM2-1(1) |
| B14 | ETM1-5(50%):ETM2-3(50%)(30) | ETM2-1(1) |
| B15 | ETM1-6(50%):ETM2-3(50%)(30) | ETM2-1(1) |
| B16 | ETM1-7(50%):ETM2-3(50%)(30) | ETM2-1(1) |
| B17 | ETM1-8(50%):ETM2-3(50%)(30) | ETM2-1(1) |
| B18 | ETM1-3(50%):ETM2-4(50%)(30) | ETM2-1(1) |
| B19 | ETM1-3(50%):ETM2-5(50%)(30) | ETM2-1(1) |
| B20 | ETM1-3(50%):ETM2-6(50%)(30) | ETM2-1(1) |

TABLE 4

Data for the OLEDs

| Ex. No.: | CE1000 (cd/A) | U1000 (V) | CIE x at 1000 cd/m2 | CIE y at 1000 cd/m2 | LT (h) | L0 (cd/m²) |
|---|---|---|---|---|---|---|
| A16 | 49.05 | 3.61 | 0.341 | 0.626 | 1622 | 8000 |
| A17 | 54.00 | 3.49 | 0.342 | 0.624 | 1713 | 8000 |
| B10 | 63.95 | 3.44 | 0.340 | 0.625 | 1928 | 8000 |
| B11 | 63.68 | 3.48 | 0.343 | 0.623 | 1918 | 8000 |
| A18 | 55.50 | 3.42 | 0.341 | 0.625 | 1688 | 8000 |
| B12 | 64.75 | 3.39 | 0.343 | 0.623 | 1907 | 8000 |
| A19 | 51.05 | 3.58 | 0.343 | 0.624 | 1603 | 8000 |
| B13 | 64.24 | 3.49 | 0.342 | 0.622 | 1833 | 8000 |
| B14 | 62.35 | 3.42 | 0.342 | 0.623 | 1783 | 8000 |
| B15 | 64.53 | 3.40 | 0.340 | 0.626 | 1723 | 8000 |
| B16 | 62.86 | 3.51 | 0.344 | 0.621 | 1659 | 8000 |
| B17 | 59.79 | 3.61 | 0.342 | 0.624 | 1678 | 8000 |
| B18 | 61.89 | 3.54 | 0.345 | 0.623 | 1897 | 8000 |
| B19 | 64.91 | 3.41 | 0.342 | 0.626 | 1871 | 8000 |
| B20 | 62.65 | 3.46 | 0.341 | 0.624 | 1843 | 8000 |

TABLE 5
Structural formulae of the materials used and their function in the OLED
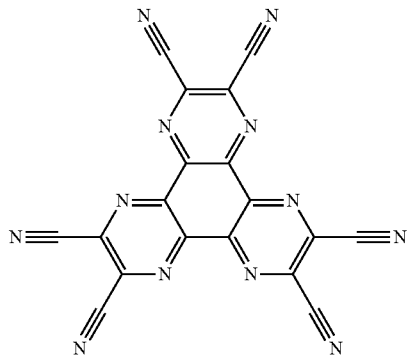
HIM1 (HIL)
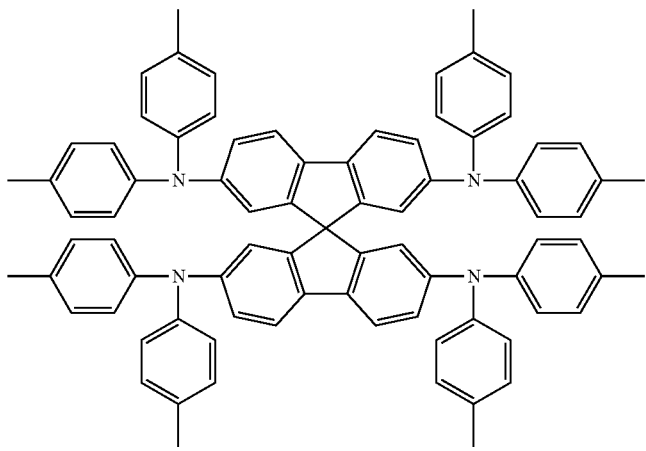
HIM2 (HIL) EP 0676461
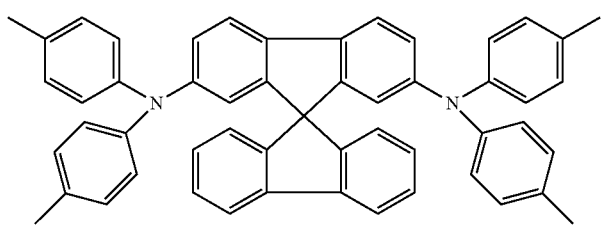
HIM3 (HIL) EP 0676461

TABLE 5-continued
Structural formulae of the materials used and their function in the OLED
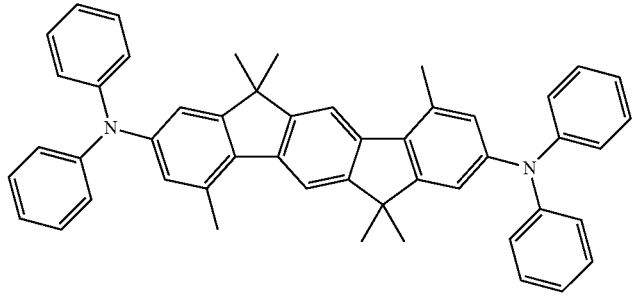
HIM4 (HIL) WO 2006/122630
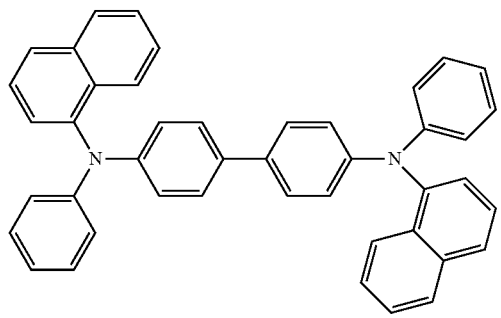
HTM1 (HTL), α-NPB
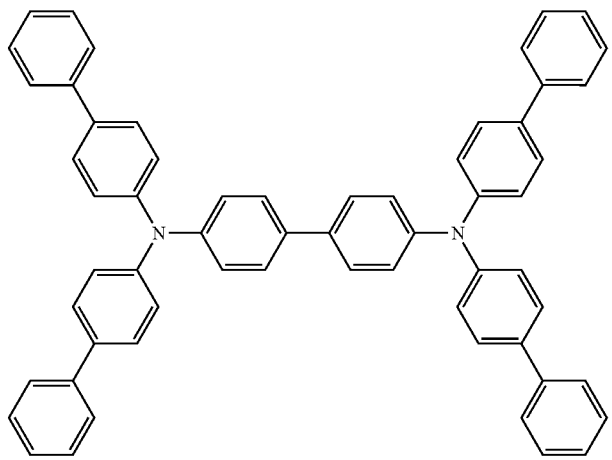
HTM2 (HTL)

TABLE 5-continued
Structural formulae of the materials used and their function in the OLED
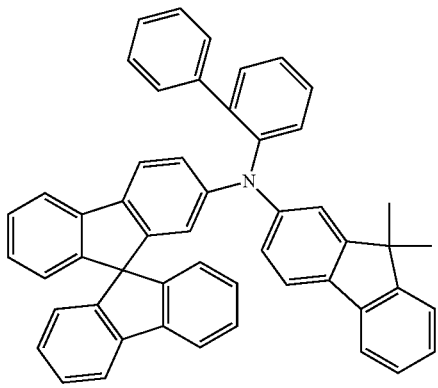
HTM3 (HTL), WO 2012/034627
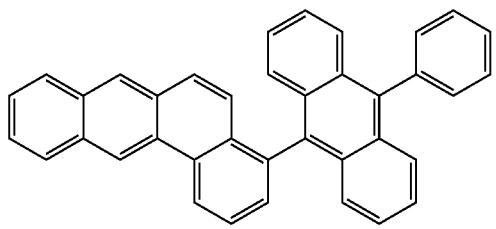
M1 (host EML), WO 2008/145239
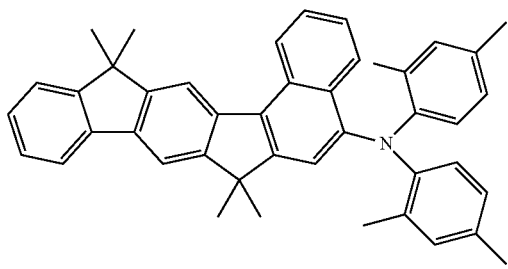
D1 (dopant EML), WO 2008/006449
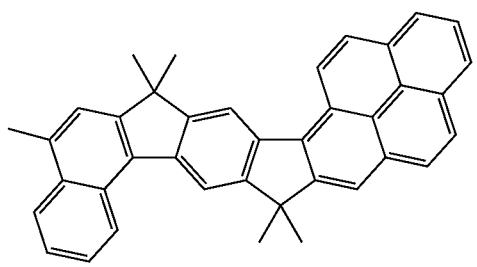
D2 (dopant EML), WO 2010/012328

TABLE 5-continued
Structural formulae of the materials used and their function in the OLED
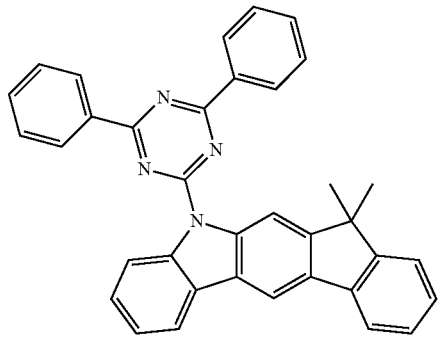
M2 (host EML), DE 102009023155
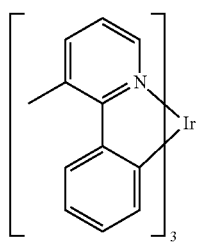
D3 (dopant EML)
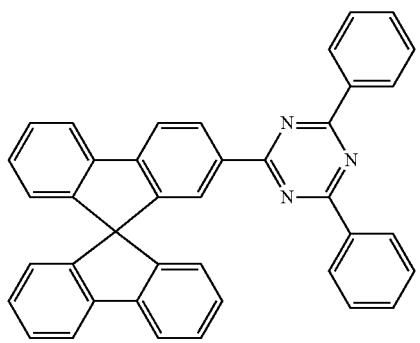
M3 (host EML), WO 2005/053055
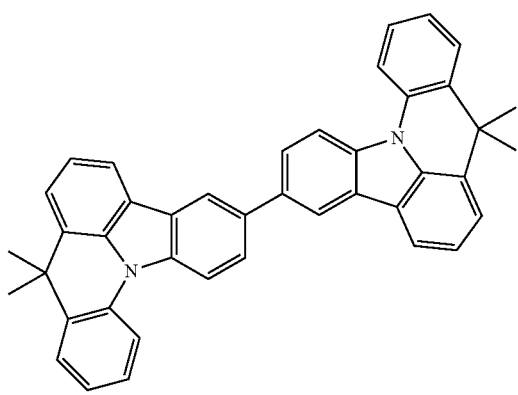
M4 (host EML), WO 2011/088877

TABLE 5-continued
Structural formulae of the materials used and their function in the OLED
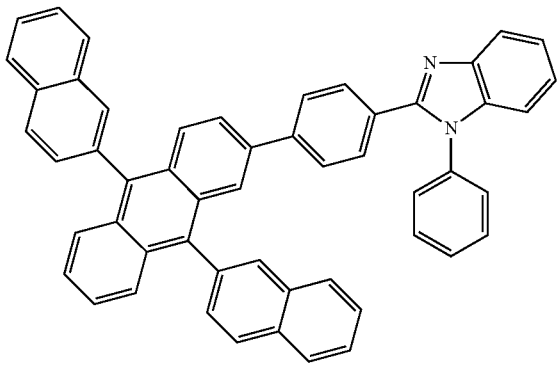
ETM1-1 (ETL)
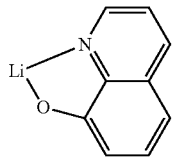
ETM2-1 (ETL; EIL), Liq
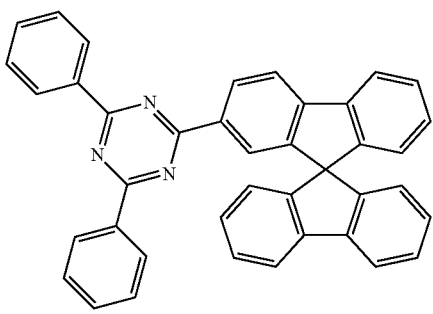
ETM1-2 (ETL), WO 2005/053055

TABLE 5-continued
Structural formulae of the materials used and their function in the OLED
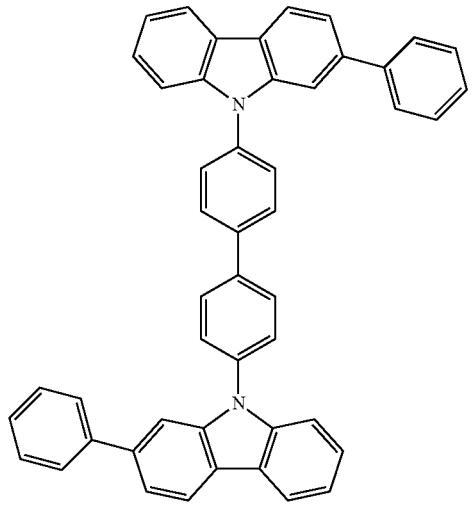
ETM2-2 (ETL), WO 2008/086851
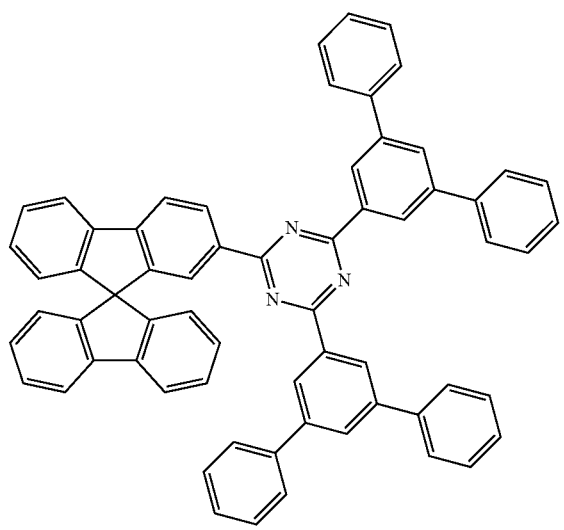
ETM1-3 (ETL), ), WO 2005/053055,
DE 10200836982

TABLE 5-continued
Structural formulae of the materials used and their function in the OLED
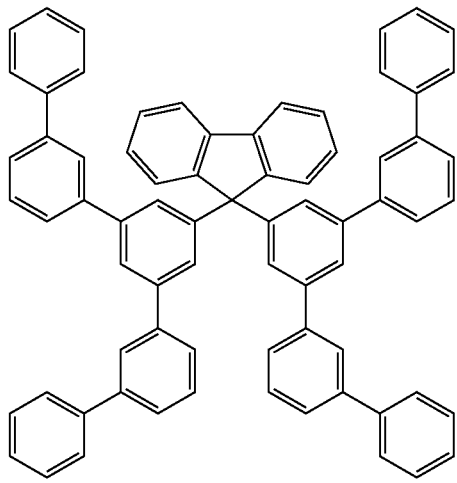
ETM2-3 (ETL), WO 2009/124627
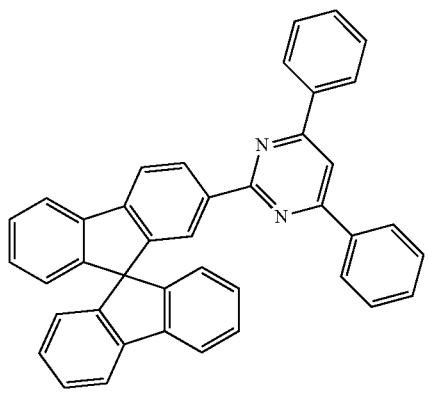
ETM1-4 (ETL)
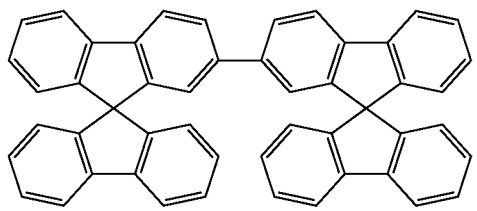
ETM2-4, E 0676461
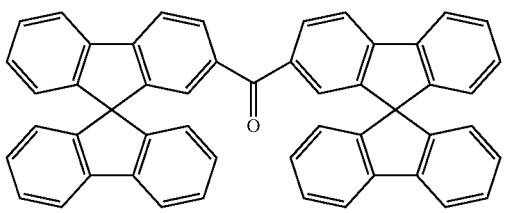
ETM1-5 (ETL), WO 2004/093207, WO 2005/054403

TABLE 5-continued
Structural formulae of the materials used and their function in the OLED
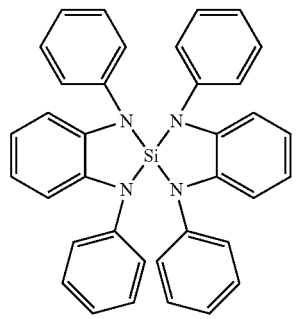
ETM2-5 (ETL), DE 102008056688
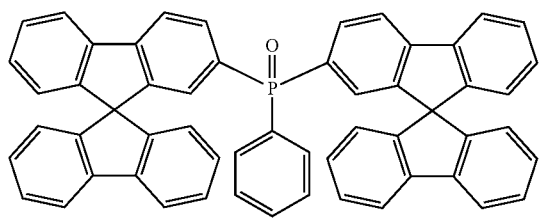
ETM1-6 (ETL), ), WO 2005/003253, WO 2005/054403
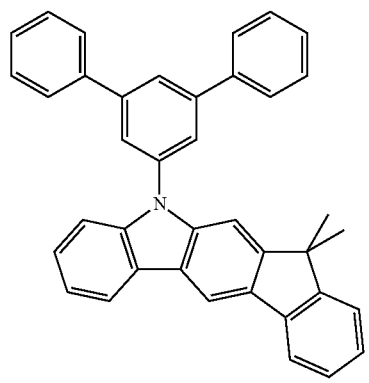
ETM2-6 (ETL), DE 102009023155

TABLE 5-continued

Structural formulae of the materials used and their function in the OLED

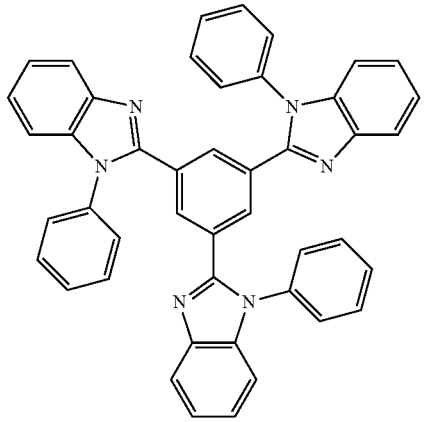

ETM1-7 (ETL), TPBI

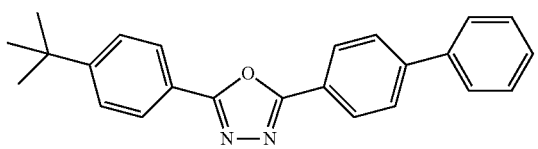

ETM1-8 (ETL)

TABLE 6

HOMO/LUMO values and triplet levels $T_1$ of the materials

| Material | HOMO (eV) | LUMO (eV) | $T_1$ (eV) | Method |
|---|---|---|---|---|
| ETM1-1 | −5.54 | −2.82 | 1.66 | org. |
| ETM2-1 | −4.79 | −2.30 | 1.81 | org. |
| ETM1-2 | −6.05 | −2.79 | 2.70 | org. |
| ETM2-2 | −5.68 | −2.39 | 2.84 | org. |
| ETM1-3 | −6.03 | −2.82 | 2.68 | org. |
| ETM2-3 | −6.16 | −2.24 | 2.95 | org. |
| ETM1-4 | −5.93 | −2.61 | 2.74 | org. |
| ETM2-4 | −5.73 | −2.42 | 2.61 | org. |
| ETM1-5 | −6.04 | −2.81 | 2.57 | org. |
| ETM2-5 | −5.43 | −1.81 | 3.25 | org. |
| ETM1-6 | −5.99 | −2.47 | 2.86 | org. |
| ETM2-6 | −5.54 | −2.27 | 2.82 | org. |
| ETM1-7 | −6.26 | −2.48 | 3.04 | org. |
| ETM1-8 | −6.05 | −2.87 | 2.24 | org. |

The invention claimed is:

1. An organic electroluminescent device comprising anode, cathode, at least one emitting layer and at least one electron-transport layer which is directly adjacent to the emitting layer on the cathode side, wherein the electron-transport layer comprises a mixture of at least two materials ETM1 and ETM2, where the following conditions apply to ETM1 and ETM2:
   a) $T_1(ETM1) > 2.2$ eV; and
   b) $T_1(ETM2) > 2.2$ eV; and
   c) $-3.2$ eV $<$ LUMO(ETM1) $< -2.0$ eV; and
   d) LUMO(ETM2) $>$ LUMO(ETM1);
where $T_1$ stands for the lowest triplet energy of the respective material and LUMO stands for the energy of the lowest unoccupied molecular orbital of the respective material, and wherein a compound of one of the formulae (1) to (8) is used as ETM1,

formula (1)

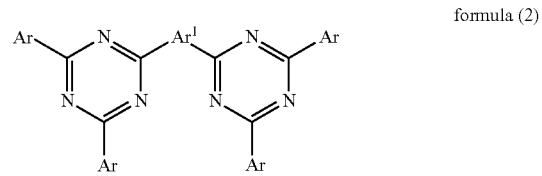

formula (2)

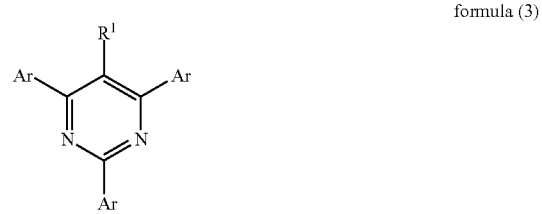

formula (3)

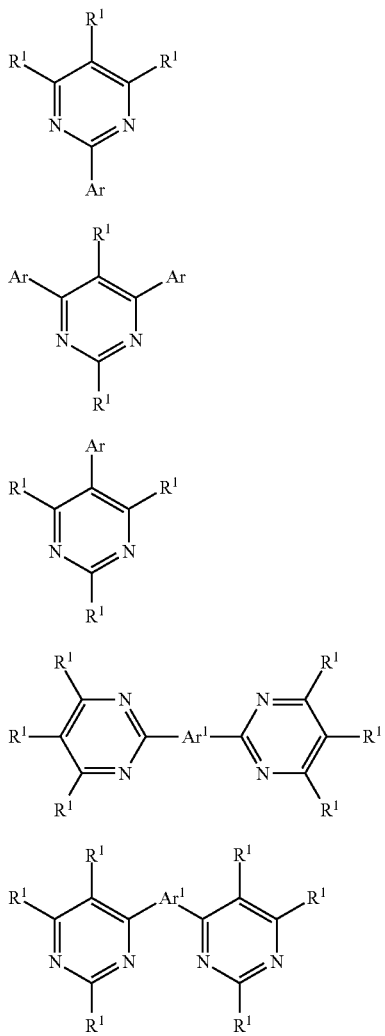

where the following applies to the symbols used:

Ar is, identically or differently on each occurrence, a monovalent aromatic or heteroaromatic ring system having 5 to 60 aromatic ring atoms, which may in each case be substituted by one or more radicals $R^1$;

$Ar^1$ is a divalent aromatic or heteroaromatic ring system having 5 to 60 aromatic ring atoms, which is optionally substituted by one or more radicals $R^1$;

$R^1$ is on each occurrence, identically or differently, H, D, F, Cl, Br, I, CHO, C(=O)$Ar^2$, P(=O)($Ar^2$)$_2$, S(=O)$Ar^2$, S(=O)$_2Ar^2$, $CR^2$=$CR^2Ar^2$, CN, $NO_2$, Si($R^2$)$_3$, B(O$R^2$)$_2$, B($R^2$)$_2$, B(N($R^2$)$_2$)$_2$, OSO$_2R^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which is optionally substituted by one or more radicals $R^2$, where one or more non-adjacent $CH_2$ groups is optionally replaced by $R^2C$=$CR^2$, C≡C, Si($R^2$)$_2$, Ge($R^2$)$_2$, Sn($R^2$)$_2$, C=O, C=S, C=Se, C=$NR^2$, P(=O)($R^2$), SO, $SO_2$, $NR^2$, O, S or CON$R^2$ and where one or more H atoms is optionally replaced by F, Cl, Br, I, CN or $NO_2$, or an aromatic or heteroaromatic ring system having 5 to 60 aromatic ring atoms, which may in each case be substituted by one or more radicals $R^2$, or an aryloxy or heteroaryloxy group having 5 to 60 aromatic ring atoms, which is optionally substituted b one or more radicals $R^2$ or a combination of these systems; two or more adjacent substituents $R^1$ here may also form a mono- or polycyclic, aliphatic or aromatic ring system with one another;

$Ar^2$ is on each occurrence, identically or differently, an aromatic or heteroaromatic ring system having 5 to 40 aromatic ring atoms, which is optionally substituted by one or more radicals $R^2$;

$R^2$ is on each occurrence, identically or differently, H, D, CN or an aliphatic, aromatic and/or heteroaromatic organic radical having 1 to 20 C atoms, in which, in addition, H atoms is optionally replaced by F; two or more adjacent substituents $R^2$ here may also form a mono- or polycyclic, aliphatic or aromatic ring system with one another;

or wherein a ketone of the formula (23) or a phosphine oxide of the formula (24) is used as ETM1,

where Ar has the meaning given above.

2. The organic electroluminescent device according to claim 1, wherein ETM1 and ETM2 are purely organic materials.

3. The organic electroluminescent device according to claim 1, wherein the triplet energy $T_1$ of ETM1 and ETM2 and of any further materials present in the electron-transport layer is >2.4 eV.

4. The organic electroluminescent device according to claim 1, wherein the LUMO of ETM1 is in the range from −3.1 eV to −2.2 eV.

5. The organic electroluminescent device according to claim 1, wherein the triplet energy $T_1$ of ETM1 and ETM2 and of any further materials present in the electron-transport layer is >2.6 eV and wherein the LUMO of ETM1 is in the range from −3.0 eV to −2.4 eV.

6. The organic electroluminescent device according to claim 1, wherein the LUMO of ETM2 is at least 0.1 eV greater than the LUMO of ETM1.

7. The organic electroluminescent device according to claim 1, wherein the HOMO of ETM1 is <−5.3 eV.

8. The organic electroluminescent device according to claim 1, wherein HOMO (ETM1)<HOMO (EML) and HOMO (ETM2)<HOMO (EML), where HOMO (EML) represents the HOMO of the emitting layer or of the material of the emitting layer which has the highest HOMO.

9. The organic electroluminescent device according to claim 1, wherein the proportion of ETM2 is ≥10% by vol. and furthermore the proportion of ETM2 is ≤90% by vol.

10. The organic electroluminescent device according to claim 1, wherein the proportion of ETM2 is ≥30% by vol. and furthermore the proportion of ETM2 is ≤80% by vol.

11. The organic electroluminescent device according to claim 1, wherein the electron-transport layer comprises no further materials apart from ETM1 and ETM2.

12. The organic electroluminescent device according to claim 1, wherein ETM2 is a pure hydrocarbon, or in that ETM2 is a carbazole derivative, a diazasilole derivative or a tetraazasilole derivative.

13. The organic electroluminescent device according to claim 1, wherein ETM2 is an aromatic hydrocarbon, or in that ETM2 is a carbazole derivative, a diazasilole derivative or a tetraazasilole derivative.

14. The organic electroluminescent device according to claim 1, wherein ETM2 is selected from compounds of the formulae (36), (37) and (38),

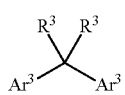

formula (36)

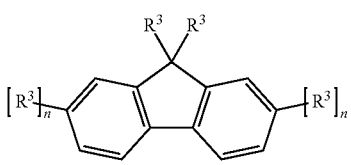

formula (37)

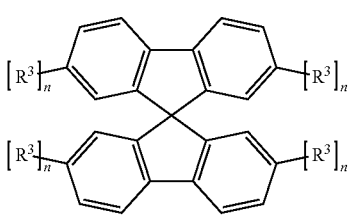

formula (38)

where

R$^1$ is on each occurrence, identically or differently, H, D, F, Cl, Br, I, CHO, C(=O)Ar$^2$, P(=O)(Ar$^2$)$_2$, S(=O)Ar$^2$, S(=O)$_2$Ar$^2$, CR$^2$=CR$^2$Ar$^2$, CN, NO$_2$, Si(R$^2$)$_3$, B(OR$^2$)$_2$, B(R$^2$)$_2$, B(N(R$^2$)$_2$)$_2$, OSO$_2$R$^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which is optionally substituted by one or more radicals R$^2$, where one or more non-adjacent CH$_2$ groups is optionally replaced by R$^2$C=CR$^2$, C≡C, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S or CONR$^2$ and where one or more H atoms is optionally replaced by F, Cl, Br, I, CN or NO$_2$, or an aromatic or heteroaromatic ring system having 5 to 60 aromatic ring atoms, which may in each case be substituted by one or more radicals R$^2$, or an aryloxy or heteroaryloxy group having 5 to 60 aromatic ring atoms, which is optionally substituted by one or more radicals R$^2$, or a combination of these systems; two or more adjacent substituents R$^1$ here may also form a mono- or polycyclic, aliphatic or aromatic ring system with one another;

Ar$^2$ is on each occurrence, identically or differently, an aromatic or heteroaromatic ring system having 5 to 40 aromatic ring atoms, which is optionally substituted by one or more radicals R$^2$;

R$^2$ is on each occurrence, identically or differently, H, D, CN or an aliphatic, aromatic and/or heteroaromatic organic radical having 1 to 20 C atoms, in which, in addition, H atoms is optionally replaced by F; two or more adjacent substituents R$^2$ here may also form a mono- or polycyclic, aliphatic or aromatic ring system with one another;

Ar$^3$ is on each occurrence, identically or differently, an aromatic ring system having 6 to 60 aromatic C atoms which contains no non-aromatic groups other than carbon or hydrogen; Ar$^3$ here is optionally substituted by one or more radicals R$^4$;

R$^3$ is on each occurrence, identically or differently, a straight-chain alkyl group having 1 to 20 C atoms or a branched or cyclic alkyl group having 3 to 20 C atoms, or an aromatic ring system having 6 to 60 aromatic C atoms which contains no non-aromatic groups other than carbon or hydrogen and which is optionally substituted by one or more radicals R$^4$; two or more radicals R$^3$ here may also form a ring system with one another;

R$^4$ is on each occurrence, identically or differently, a straight-chain alkyl group having 1 to 20 C atoms or a branched or cyclic alkyl group having 3 to 20 C atoms; two or more radicals R$^4$ here may also form a ring system with one another;

n is, identically or differently on each occurrence, 0 or 1;

or characterised in that a compound of the formula (39) or (40) is used as ETM2,

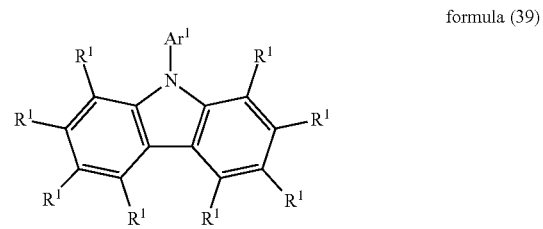

formula (39)

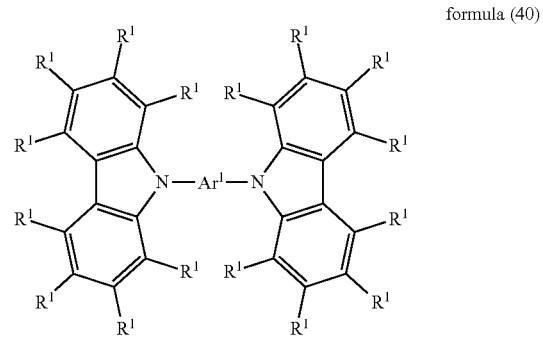

formula (40)

where the symbols used have the meanings given in claim 11.

15. The organic electroluminescent device according to claim 1, wherein an electron-injection layer which comprises an alkali-metal or alkaline-earth metal fluoride, an alkali-metal or alkaline-earth metal oxide, an alkali-metal or alkaline-earth metal carbonate or an alkali-metal or alkaline-earth metal complex is used between the electron-transport layer and the metallic cathode.

16. The organic electroluminescent device according to claim 1, wherein the emitting layer is phosphorescent and comprises a mixture of two or more matrix materials.

17. A process for the production of the organic electroluminescent device according to claim 1, which comprises coating one or more layers by means of a sublimation process and/or in that one or more layers are coated by means of the OVPD process or with the aid of carrier-gas sublimation and/or in that one or more layers are coated from solution.

\* \* \* \* \*